(12) United States Patent
Baek et al.

(10) Patent No.: US 9,479,742 B2
(45) Date of Patent: *Oct. 25, 2016

(54) APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

(71) Applicant: LG ELECTRONICS INC., Seoul (KR)

(72) Inventors: Jongseob Baek, Seoul (KR); Woosuk Ko, Seoul (KR); Sungryong Hong, Seoul (KR); Jaehyung Kim, Seoul (KR); Byeongkook Jeong, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/319,883

(22) Filed: Jun. 30, 2014

(65) Prior Publication Data

US 2015/0003538 A1    Jan. 1, 2015

Related U.S. Application Data

(60) Provisional application No. 61/841,405, filed on Jun. 30, 2013, provisional application No. 61/860,868, filed on Jul. 31, 2013.

(51) Int. Cl.
*H04L 27/28* (2006.01)
*H04N 19/00* (2014.01)
*H04L 1/00* (2006.01)
*H04L 5/00* (2006.01)
*H04L 1/06* (2006.01)

(52) U.S. Cl.
CPC ........ *H04N 7/26351* (2013.01); *H04L 1/0041* (2013.01); *H04L 1/0045* (2013.01); *H04L 1/0057* (2013.01); *H04L 5/0007* (2013.01); *H04L 1/0071* (2013.01); *H04L 1/06* (2013.01); *H04L 5/0023* (2013.01); *H04L 2001/0093* (2013.01)

(58) Field of Classification Search
CPC . H04L 1/0071; H04L 1/0057; H04L 1/0041; H04L 5/0007; H04L 1/0045; G06F 11/10; H03M 13/27
USPC .................. 375/267, 295, 262, 260
See application file for complete search history.

(56) References Cited

U.S. PATENT DOCUMENTS

| | | | |
|---|---|---|---|
| 6,289,486 | B1 | 9/2001 | Lee et al. |
| 7,212,515 | B2 | 5/2007 | Dharia et al. |
| 2004/0151109 | A1* | 8/2004 | Batra et al. .................. 370/208 |
| 2010/0002792 | A1 | 1/2010 | Seyedi-Esfahani |
| 2010/0115361 | A1* | 5/2010 | Peng et al. .................... 714/748 |
| 2011/0286535 | A1* | 11/2011 | Ko et al. ....................... 375/259 |
| 2011/0299628 | A1 | 12/2011 | Ko et al. |
| 2013/0064314 | A1 | 3/2013 | Ko et al. |

* cited by examiner

*Primary Examiner* — Leila Malek
(74) *Attorney, Agent, or Firm* — Dentons US LLP

(57) ABSTRACT

A method and an apparatus for transmitting broadcast signals thereof are disclosed. The apparatus for transmitting broadcast signals comprises an encoder for encoding DP (Data Pipe) data corresponding to each of a plurality of DPs, a mapper for mapping the encoded DP data onto constellations, a time interleaver for time interleaving the mapped DP data at DP level, a frame builder for building at least one signal frame including the time interleaved DP data, a modulator for modulating data in the built at least one signal frame by an OFDM (Orthogonal Frequency Division Multiplex) scheme and a transmitter for transmitting the broadcast signals having the modulated data.

16 Claims, 39 Drawing Sheets

FIG. 25
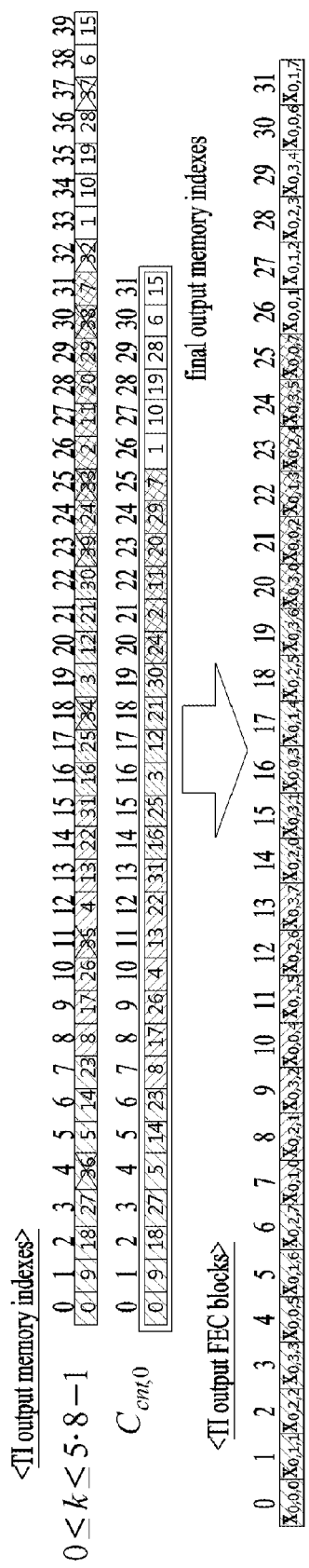
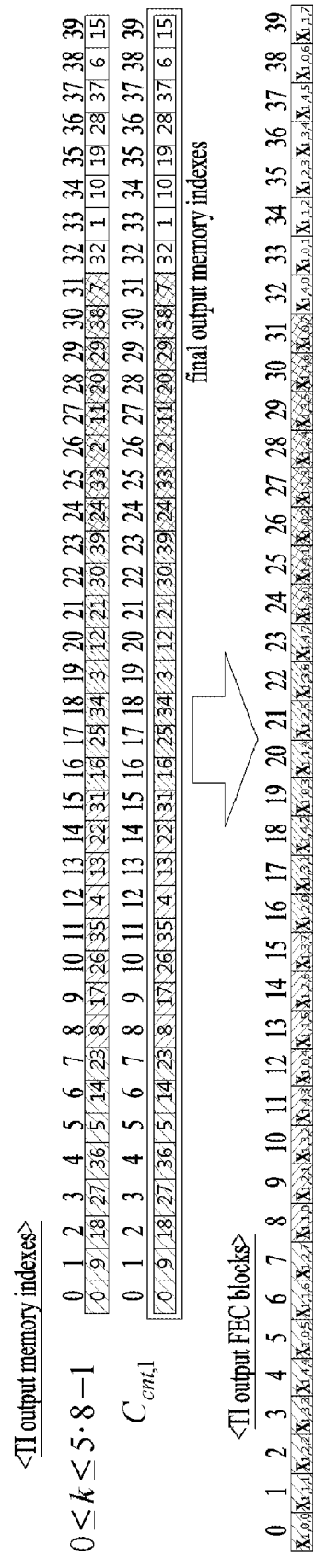

| Order (n) | LI-PPG |
|---|---|
| 9 | 1 2 3 4 5 6 7 8 9 |
| 10 | 1 2 3 4 5 6 7 8 9 10 11 12 |
| 11 | 1 2 3 4 5 6 7 8 9 10 11 12 |
| 12 | 1 2 3 4 5 6 7 8 9 10 11 12 |

APPARATUS FOR TRANSMITTING BROADCAST SIGNALS, APPARATUS FOR RECEIVING BROADCAST SIGNALS, METHOD FOR TRANSMITTING BROADCAST SIGNALS AND METHOD FOR RECEIVING BROADCAST SIGNALS

Pursuant to 35 U.S.C. §119(3), this application claims the benefit of U.S. Provisional Application Nos. 61/841,405, filed Jun. 30, 2013, and 61/860,868, filed on Jul. 31, 2013, which is hereby incorporated by reference as if fully set forth herein.

BACKGROUND OF THE INVENTION

1. Field of the Invention

The present invention relates to an apparatus for transmitting broadcast signals, an apparatus for receiving broadcast signals and methods for transmitting and receiving broadcast signals.

2. Discussion of the Related Art

As analog broadcast signal transmission comes to an end, various technologies for transmitting/receiving digital broadcast signals are being developed. A digital broadcast signal may include a larger amount of video/audio data than an analog broadcast signal and further include various types of additional data in addition to the video/audio data.

That is, a digital broadcast system can provide HD (high definition) images, multi-channel audio and various additional services. However, data transmission efficiency for transmission of large amounts of data, robustness of transmission/reception networks and network flexibility in consideration of mobile reception equipment need to be improved for digital broadcast.

SUMMARY OF THE INVENTION

Accordingly, the present invention is directed to an apparatus for transmitting broadcast signals and an apparatus for receiving broadcast signals for future broadcast services and methods for transmitting and receiving broadcast signals for future broadcast services.

An object of the present invention is to provide an apparatus and method for transmitting broadcast signals to multiplex data of a broadcast transmission/reception system providing two or more different broadcast services in a time domain and transmit the multiplexed data through the same RF signal bandwidth and an apparatus and method for receiving broadcast signals corresponding thereto.

Another object of the present invention is to provide an apparatus for transmitting broadcast signals, an apparatus for receiving broadcast signals and methods for transmitting and receiving broadcast signals to classify data corresponding to services by components, transmit data corresponding to each component as a data pipe, receive and process the data Still another object of the present invention is to provide an apparatus for transmitting broadcast signals, an apparatus for receiving broadcast signals and methods for transmitting and receiving broadcast signals to signal signaling information necessary to provide broadcast signals.

Technical Solution

To achieve the object and other advantages and in accordance with the purpose of the invention, as embodied and broadly described herein, a method for transmitting broadcast signals comprises encoding DP (Data Pipe) data corresponding to each of a plurality of DPs, wherein the each of a plurality of DPs carries at least one service component, mapping the encoded DP data onto constellations, time interleaving the mapped DP data at DP level by performing a column-wise writing operation by writing FEC blocks of the mapped DP data into a first column to a last column of a TI memory and performing a diagonal-wise reading operation by reading out cells of the written FEC blocks from the first row to the last row of the TI memory according to a diagonal-wise reading pattern, building at least one signal frame including the time interleaved DP data, modulating data in the built at least one signal frame by an OFDM (Orthogonal Frequency Division Multiplex) scheme and transmitting the broadcast signals having the modulated data.

Advantageous Effects

The present invention can process data according to service characteristics to control QoS for each service or service component, thereby providing various broadcast services.

The present invention can achieve transmission flexibility by transmitting various broadcast services through the same RF signal bandwidth.

The present invention can improve data transmission efficiency and increase robustness of transmission/reception of broadcast signals using a MIMO system.

According to the present invention, it is possible to provide broadcast signal transmission and reception methods and apparatus capable of receiving digital broadcast signals without error even with mobile reception equipment or in an indoor environment.

BRIEF DESCRIPTION OF THE DRAWINGS

FIG. 25 illustrates a process of generating TI output memory indexes according to another embodiment of the present invention.

DETAILED DESCRIPTION OF THE INVENTION

Reference will now be made in detail to the preferred embodiments of the present invention, examples of which are illustrated in the accompanying drawings. The detailed description, which will be given below with reference to the accompanying drawings, is intended to explain exemplary embodiments of the present invention, rather than to show the only embodiments that can be implemented according to the present invention. The following detailed description includes specific details in order to provide a thorough understanding of the present invention. However, it will be apparent to those skilled in the art that the present invention may be practiced without such specific details.

Although most terms used in the present invention have been selected from general ones widely used in the art, some terms have been arbitrarily selected by the applicant and their meanings are explained in detail in the following description as needed. Thus, the present invention should be understood based upon the intended meanings of the terms rather than their simple names or meanings.

The present invention provides apparatuses and methods for transmitting and receiving broadcast signals for future broadcast services. Future broadcast services according to an embodiment of the present invention include a terrestrial broadcast service, a mobile broadcast service, a UHDTV service, etc. The apparatuses and methods for transmitting according to an embodiment of the present invention may be categorized into a base profile for the terrestrial broadcast service, a handheld profile for the mobile broadcast service and an advanced profile for the UHDTV service. In this case, the base profile can be used as a profile for both the terrestrial broadcast service and the mobile broadcast service. That is, the base profile can be used to define a concept of a profile which includes the mobile profile. This can be changed according to intention of the designer.

The present invention may process broadcast signals for the future broadcast services through non-MIMO (Multiple Input Multiple Output) or MIMO according to one embodiment. A non-MIMO scheme according to an embodiment of the present invention may include a MISO (Multiple Input Single Output) scheme, a SISO (Single Input Single Output) scheme, etc.

While MISO or MIMO uses two antennas in the following for convenience of description, the present invention is applicable to systems using two or more antennas.

Figure 1:
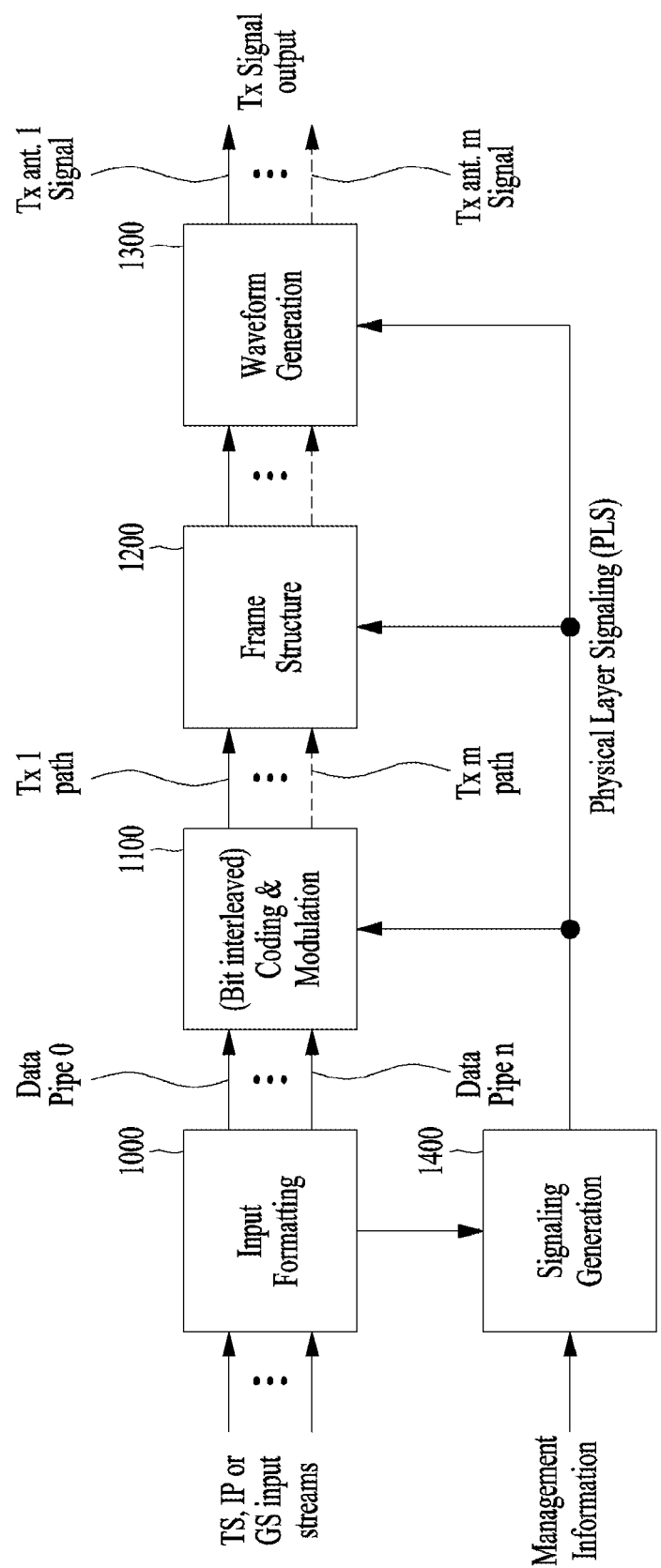
FIG. 1 illustrates a structure of an apparatus for transmitting broadcast signals for future broadcast services according to an embodiment of the present invention.

FIG. 1 illustrates a structure of an apparatus for transmitting broadcast signals for future broadcast services according to an embodiment of the present invention.

The apparatus for transmitting broadcast signals for future broadcast services according to an embodiment of the present invention can include an input formatting module 1000, a coding & modulation module 1100, a frame structure module 1200, a waveform generation module 1300 and a signaling generation module 1400. A description will be given of the operation of each module of the apparatus for transmitting broadcast signals.

Referring to FIG. 1, the apparatus for transmitting broadcast signals for future broadcast services according to an embodiment of the present invention can receive MPEG-TSs, IP streams (v4/v6) and generic streams (GSs) as an input signal. In addition, the apparatus for transmitting broadcast signals can receive management information about the configuration of each stream constituting the input signal and generate a final physical layer signal with reference to the received management information.

The input formatting module 1000 according to an embodiment of the present invention can classify the input streams on the basis of a standard for coding and modulation or services or service components and output the input streams as a plurality of logical data pipes (or data pipes or DP data). The data pipe is a logical channel in the physical layer that carries service data or related metadata, which may carry one or multiple service(s) or service component(s). In addition, data transmitted through each data pipe may be called DP data.

In addition, the input formatting module 1000 according to an embodiment of the present invention can divide each data pipe into blocks necessary to perform coding and modulation and carry out processes necessary to increase transmission efficiency or to perform scheduling. Details of operations of the input formatting module 1000 will be described later.

The coding & modulation module 1100 according to an embodiment of the present invention can perform forward error correction (FEC) encoding on each data pipe received from the input formatting module 1000 such that an apparatus for receiving broadcast signals can correct an error that may be generated on a transmission channel. In addition, the coding & modulation module 1100 according to an embodiment of the present invention can convert FEC output bit data to symbol data and interleave the symbol data to correct burst error caused by a channel. As shown in FIG. 1, the coding & modulation module 1100 according to an embodiment of the present invention can divide the processed data such that the divided data can be output through data paths for respective antenna outputs in order to transmit the data through two or more Tx antennas.

The frame structure module 1200 according to an embodiment of the present invention can map the data output from the coding & modulation module 1100 to signal frames. The frame structure module 1200 according to an embodiment of the present invention can perform mapping using scheduling information output from the input formatting module 1000 and interleave data in the signal frames in order to obtain additional diversity gain.

The waveform generation module 1300 according to an embodiment of the present invention can convert the signal frames output from the frame structure module 1200 into a signal for transmission. In this case, the waveform generation module 1300 according to an embodiment of the present invention can insert a preamble signal (or preamble) into the signal for detection of the transmission apparatus and insert a reference signal for estimating a transmission channel to compensate for distortion into the signal. In addition, the waveform generation module 1300 according to an embodiment of the present invention can provide a guard interval and insert a specific sequence into the same in order to offset the influence of channel delay spread due to multi-path reception. Additionally, the waveform generation module 1300 according to an embodiment of the present invention can perform a procedure necessary for efficient transmission in consideration of signal characteristics such as a peak-to-average power ratio of the output signal.

The signaling generation module 1400 according to an embodiment of the present invention generates final physical layer signaling information using the input management information and information generated by the input formatting module 1000, coding & modulation module 1100 and frame structure module 1200. Accordingly, a reception apparatus according to an embodiment of the present invention can decode a received signal by decoding the signaling information.

As described above, the apparatus for transmitting broadcast signals for future broadcast services according to one embodiment of the present invention can provide terrestrial broadcast service, mobile broadcast service, UHDTV service, etc. Accordingly, the apparatus for transmitting broadcast signals for future broadcast services according to one embodiment of the present invention can multiplex signals for different services in the time domain and transmit the same.

Figure 2:
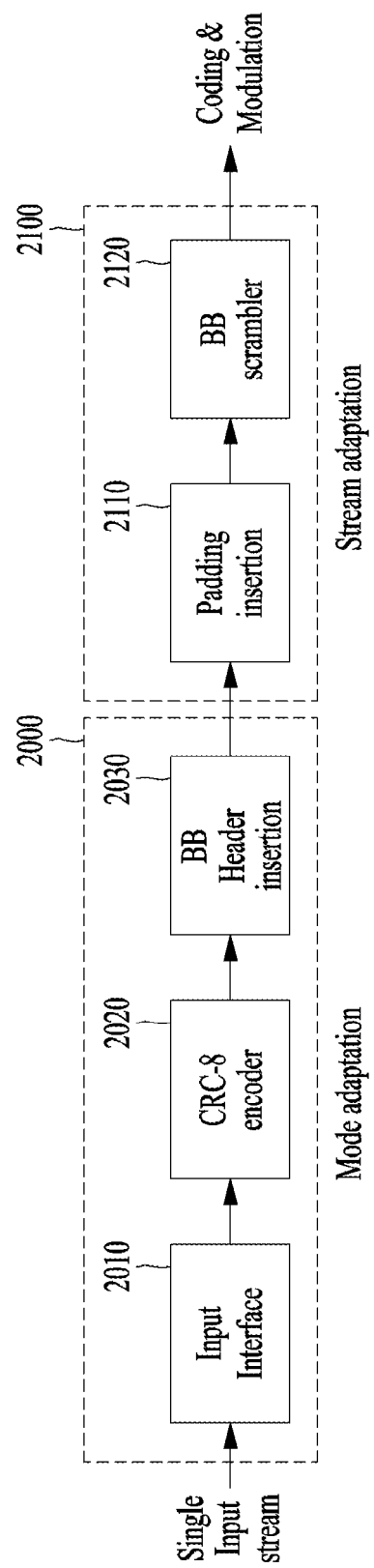
FIG. 2 illustrates an input formatting module according to an embodiment of the present invention.
Figure 3:
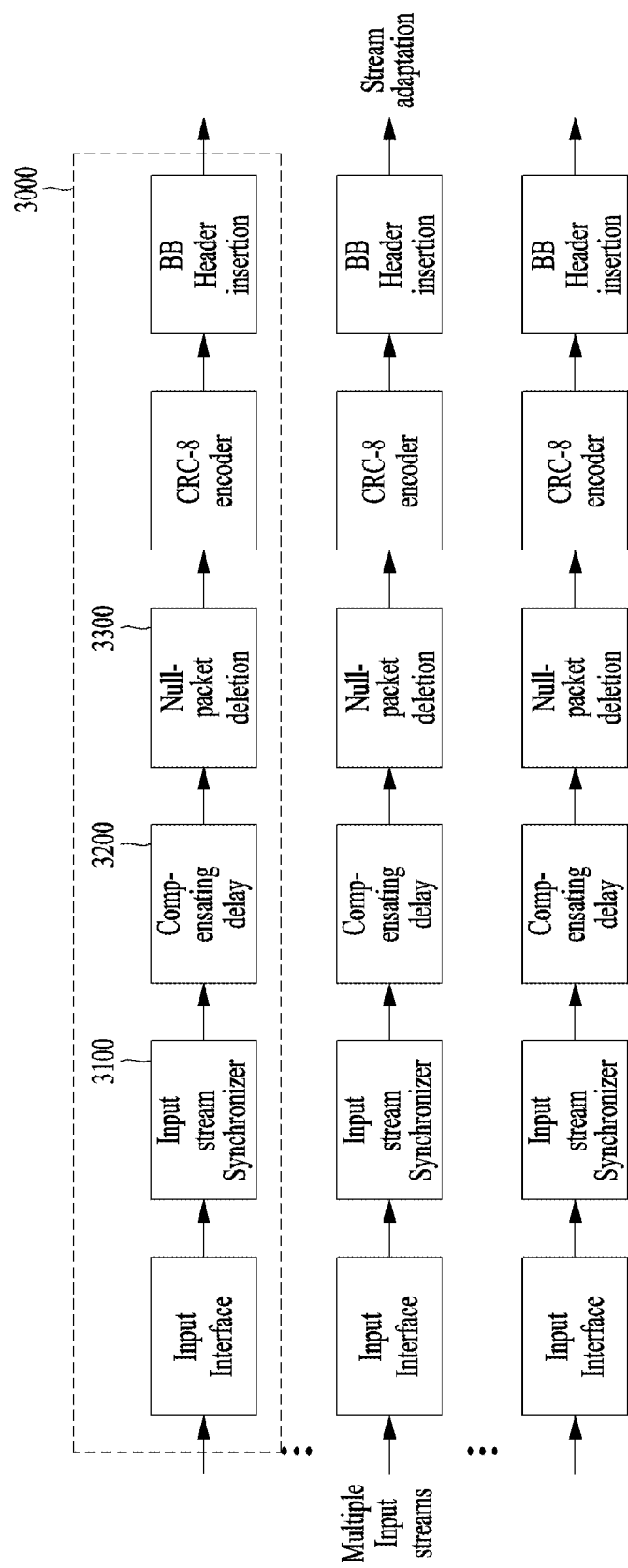
FIG. 3 illustrates an input formatting module according to another embodiment of the present invention.
Figure 4:
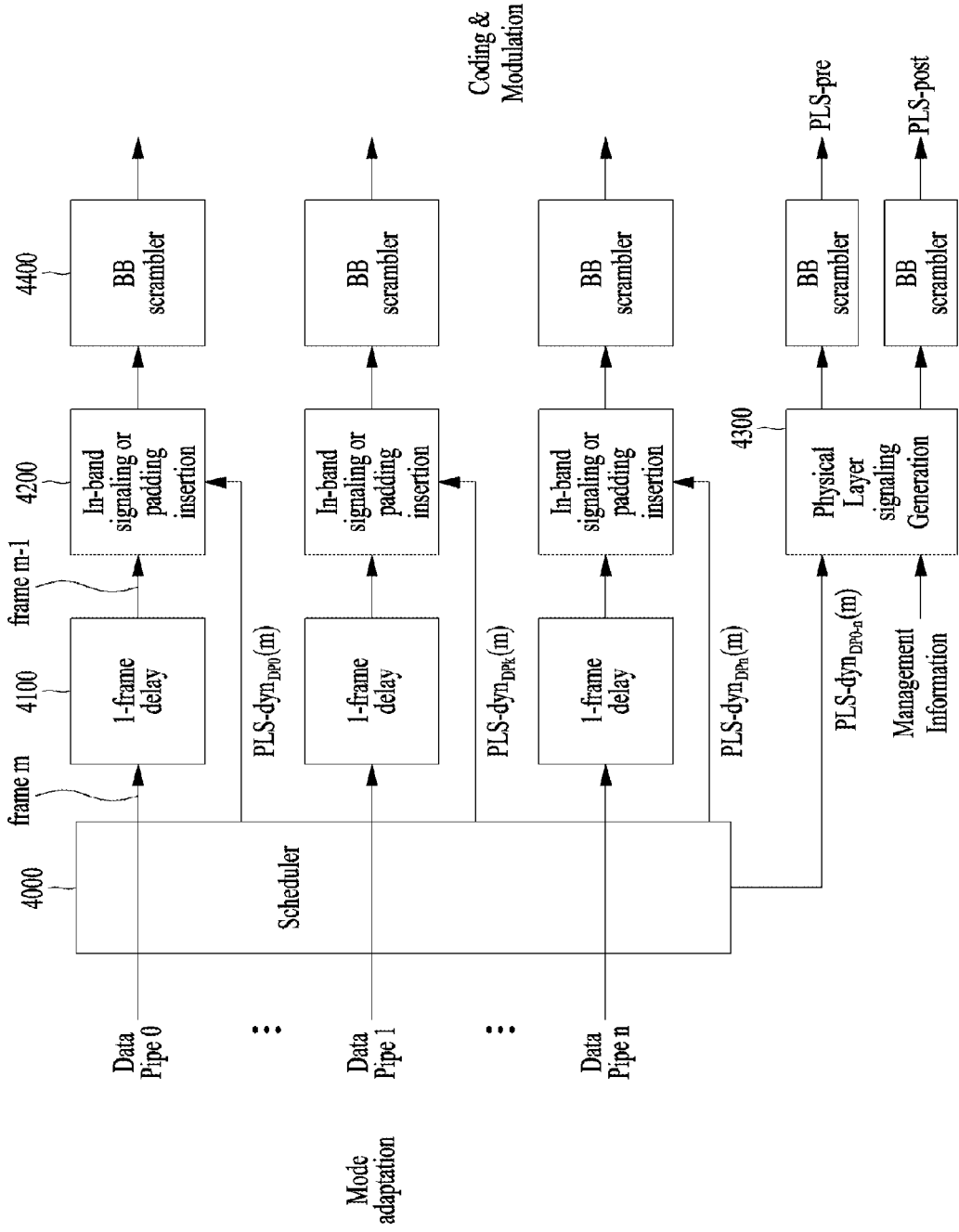
FIG. 4 illustrates an input formatting module according to another embodiment of the present invention.

FIGS. 2, 3 and 4 illustrate the input formatting module 1000 according to embodiments of the present invention. A description will be given of each figure.

FIG. 2 illustrates an input formatting module according to one embodiment of the present invention. FIG. 2 shows an input formatting module when the input signal is a single input stream.

Referring to FIG. 2, the input formatting module according to one embodiment of the present invention can include a mode adaptation module 2000 and a stream adaptation module 2100.

As shown in FIG. 2, the mode adaptation module 2000 can include an input interface block 2010, a CRC-8 encoder block 2020 and a BB header insertion block 2030. Description will be given of each block of the mode adaptation module 2000.

The input interface block 2010 can divide the single input stream input thereto into data pieces each having the length of a baseband (BB) frame used for FEC (BCH/LDPC) which will be performed later and output the data pieces.

The CRC-8 encoder block 2020 can perform CRC encoding on BB frame data to add redundancy data thereto.

The BB header insertion block 2030 can insert, into the BB frame data, a header including information such as mode adaptation type (TS/GS/IP), a user packet length, a data field length, user packet sync byte, start address of user packet sync byte in data field, a high efficiency mode indicator, an input stream synchronization field, etc.

As shown in FIG. 2, the stream adaptation module 2100 can include a padding insertion block 2110 and a BB scrambler block 2120. Description will be given of each block of the stream adaptation module 2100.

If data received from the mode adaptation module 2000 has a length shorter than an input data length necessary for FEC encoding, the padding insertion block 2110 can insert a padding bit into the data such that the data has the input data length and output the data including the padding bit.

The BB scrambler block 2120 can randomize the input bit stream by performing an XOR operation on the input bit stream and a pseudo random binary sequence (PRBS).

The above-described blocks may be omitted or replaced by blocks having similar or identical functions.

As shown in FIG. 2, the input formatting module can finally output data pipes to the coding & modulation module.

FIG. 3 illustrates an input formatting module according to another embodiment of the present invention. FIG. 3 shows a mode adaptation module 3000 of the input formatting module when the input signal corresponds to multiple input streams.

The mode adaptation module 3000 of the input formatting module for processing the multiple input streams can independently process the multiple input streams.

Referring to FIG. 3, the mode adaptation module 3000 for respectively processing the multiple input streams can include input interface blocks, input stream synchronizer blocks 3100, compensating delay blocks 3200, null packet deletion blocks 3300, CRC-8 encoder blocks and BB header insertion blocks. Description will be given of each block of the mode adaptation module 3000.

Operations of the input interface block, CRC-8 encoder block and BB header insertion block correspond to those of the input interface block, CRC-8 encoder block and BB header insertion block described with reference to FIG. 2 and thus description thereof is omitted.

The input stream synchronizer block 3100 can transmit input stream clock reference (ISCR) information to generate timing information necessary for the apparatus for receiving broadcast signals to restore the TSs or GSs.

The compensating delay block 3200 can delay input data and output the delayed input data such that the apparatus for receiving broadcast signals can synchronize the input data if a delay is generated between data pipes according to processing of data including the timing information by the transmission apparatus.

The null packet deletion block 3300 can delete unnecessarily transmitted input null packets from the input data, insert the number of deleted null packets into the input data based on positions in which the null packets are deleted and transmit the input data.

The above-described blocks may be omitted or replaced by blocks having similar or identical functions.

FIG. 4 illustrates an input formatting module according to another embodiment of the present invention.

Specifically, FIG. 4 illustrates a stream adaptation module of the input formatting module when the input signal corresponds to multiple input streams.

The stream adaptation module of the input formatting module when the input signal corresponds to multiple input streams can include a scheduler 4000, a 1-frame delay block 4100, an in-band signaling or padding insertion block 4200, a physical layer signaling generation block 4300 and a BB scrambler block 4400. Description will be given of each block of the stream adaptation module.

The scheduler 4000 can perform scheduling for a MIMO system using multiple antennas having dual polarity. In addition, the scheduler 4000 can generate parameters for use in signal processing blocks for antenna paths, such as a bit-to-cell demux block, a cell interleaver block, a time interleaver block, etc. included in the coding & modulation module illustrated in FIG. 1.

The 1-frame delay block 4100 can delay the input data by one transmission frame such that scheduling information about the next frame can be transmitted through the current frame for in-band signaling information to be inserted into the data pipes.

The in-band signaling or padding insertion block 4200 can insert undelayed physical layer signaling (PLS)-dynamic signaling information into the data delayed by one transmission frame. In this case, the in-band signaling or padding insertion block 4200 can insert a padding bit when a space for padding is present or insert in-band signaling information into the padding space. In addition, the scheduler 4000 can output physical layer signaling-dynamic signaling information about the current frame separately from in-band signaling information. Accordingly, a cell mapper, which will be described later, can map input cells according to scheduling information output from the scheduler 4000.

The physical layer signaling generation block 4300 can generate physical layer signaling data which will be transmitted through a preamble symbol of a transmission frame or spread and transmitted through a data symbol other than the in-band signaling information. In this case, the physical layer signaling data according to an embodiment of the present invention can be referred to as signaling information. Furthermore, the physical layer signaling data according to an embodiment of the present invention can be divided into PLS-pre information and PLS-post information. The PLS-pre information can include parameters necessary to encode the PLS-post information and static PLS signaling data and the PLS-post information can include parameters necessary to encode the data pipes. The parameters necessary to encode the data pipes can be classified into static PLS signaling data and dynamic PLS signaling data. The static PLS signaling data is a parameter commonly applicable to all frames included in a super-frame and can be changed on a super-frame basis. The dynamic PLS signaling data is a parameter differently applicable to respective frames included in a super-frame and can be changed on a frame-by-frame basis. Accordingly, the reception apparatus can acquire the PLS-post information by decoding the PLS-pre information and decode desired data pipes by decoding the PLS-post information.

The BB scrambler block 4400 can generate a pseudo-random binary sequence (PRBS) and perform an XOR operation on the PRBS and the input bit streams to decrease the peak-to-average power ratio (PAPR) of the output signal of the waveform generation block. As shown in FIG. 4, scrambling of the BB scrambler block 4400 is applicable to both data pipes and physical layer signaling information.

The above-described blocks may be omitted or replaced by blocks having similar or identical functions according to designer.

As shown in FIG. 4, the stream adaptation module can finally output the data pipes to the coding & modulation module.

Figure 5:
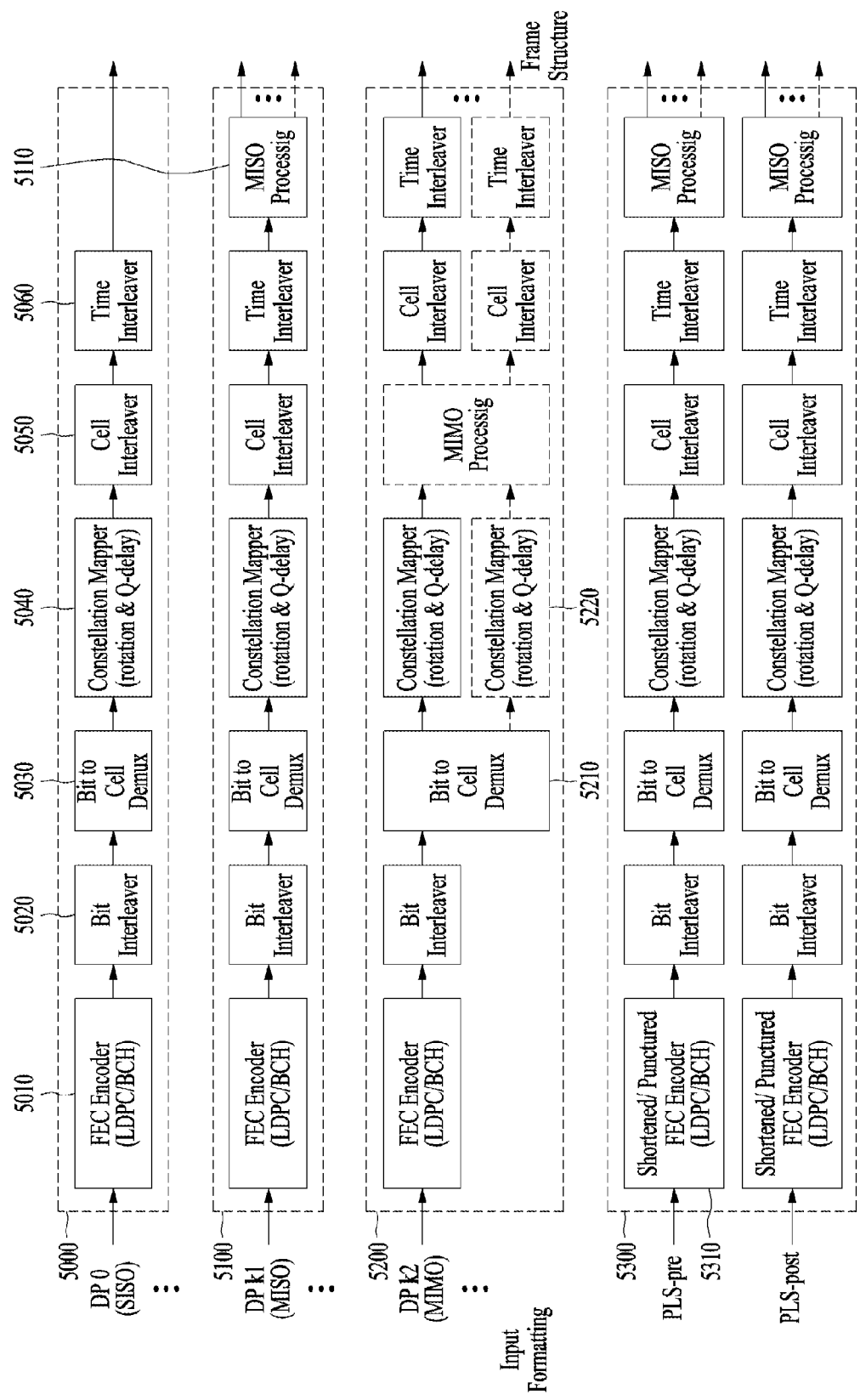
FIG. 5 illustrates a coding & modulation module according to an embodiment of the present invention.

FIG. 5 illustrates a coding & modulation module according to an embodiment of the present invention.

The coding & modulation module shown in FIG. 5 corresponds to an embodiment of the coding & modulation module illustrated in FIG. 1.

As described above, the apparatus for transmitting broadcast signals for future broadcast services according to an embodiment of the present invention can provide a terrestrial broadcast service, mobile broadcast service, UHDTV service, etc.

Since QoS (quality of service) depends on characteristics of a service provided by the apparatus for transmitting broadcast signals for future broadcast services according to an embodiment of the present invention, data corresponding to respective services needs to be processed through different schemes. Accordingly, the coding & modulation module according to an embodiment of the present invention can independently process data pipes input thereto by independently applying SISO, MISO and MIMO schemes to the data pipes respectively corresponding to data paths. Consequently, the apparatus for transmitting broadcast signals for future broadcast services according to an embodiment of the present invention can control QoS for each service or service component transmitted through each data pipe.

Accordingly, the coding & modulation module according to an embodiment of the present invention can include a first block 5000 for SISO, a second block 5100 for MISO, a third block 5200 for MIMO and a fourth block 5300 for processing the PLS-pre/PLS-post information. The coding & modulation module illustrated in FIG. 5 is an exemplary and may include only the first block 5000 and the fourth block 5300, the second block 5100 and the fourth block 5300 or the third block 5200 and the fourth block 5300 according to design. That is, the coding & modulation module can include blocks for processing data pipes equally or differently according to design.

A description will be given of each block of the coding & modulation module.

The first block 5000 processes an input data pipe according to SISO and can include an FEC encoder block 5010, a bit interleaver block 5020, a bit-to-cell demux block 5030, a constellation mapper block 5040, a cell interleaver block 5050 and a time interleaver block 5060.

The FEC encoder block 5010 can perform BCH encoding and LDPC encoding on the input data pipe to add redundancy thereto such that the reception apparatus can correct an error generated on a transmission channel.

The bit interleaver block 5020 can interleave bit streams of the FEC-encoded data pipe according to an interleaving rule such that the bit streams have robustness against burst error that may be generated on the transmission channel. Accordingly, when deep fading or erasure is applied to QAM symbols, errors can be prevented from being generated in consecutive bits from among all codeword bits since interleaved bits are mapped to the QAM symbols.

The bit-to-cell demux block 5030 can determine the order of input bit streams such that each bit in an FEC block can be transmitted with appropriate robustness in consideration of both the order of input bit streams and a constellation mapping rule.

In addition, the bit interleaver block 5020 is located between the FEC encoder block 5010 and the constellation mapper block 5040 and can connect output bits of LDPC encoding performed by the FEC encoder block 5010 to bit positions having different reliability values and optimal values of the constellation mapper in consideration of LDPC decoding of the apparatus for receiving broadcast signals. Accordingly, the bit-to-cell demux block 5030 can be replaced by a block having a similar or equal function.

The constellation mapper block 5040 can map a bit word input thereto to one constellation. In this case, the constellation mapper block 5040 can additionally perform rotation & Q-delay. That is, the constellation mapper block 5040 can rotate input constellations according to a rotation angle, divide the constellations into an in-phase component and a quadrature-phase component and delay only the quadrature-phase component by an arbitrary value. Then, the constellation mapper block 5040 can remap the constellations to new constellations using a paired in-phase component and quadrature-phase component.

In addition, the constellation mapper block 5040 can move constellation points on a two-dimensional plane in order to find optimal constellation points. Through this process, capacity of the coding & modulation module 1100 can be optimized. Furthermore, the constellation mapper block 5040 can perform the above-described operation using IQ-balanced constellation points and rotation. The constellation mapper block 5040 can be replaced by a block having a similar or equal function.

The cell interleaver block 5050 can randomly interleave cells corresponding to one FEC block and output the interleaved cells such that cells corresponding to respective FEC blocks can be output in different orders.

The time interleaver block 5060 can interleave cells belonging to a plurality of FEC blocks and output the interleaved cells. Accordingly, the cells corresponding to the FEC blocks are dispersed and transmitted in a period corresponding to a time interleaving depth and thus diversity gain can be obtained.

The second block 5100 processes an input data pipe according to MISO and can include the FEC encoder block, bit interleaver block, bit-to-cell demux block, constellation mapper block, cell interleaver block and time interleaver block in the same manner as the first block 5000. However, the second block 5100 is distinguished from the first block 5000 in that the second block 5100 further includes a MISO processing block 5110. The second block 5100 performs the same procedure including the input operation to the time interleaver operation as those of the first block 5000 and thus description of the corresponding blocks is omitted.

The MISO processing block 5110 can encode input cells according to a MISO encoding matrix providing transmit diversity and output MISO-processed data through two paths. MISO processing according to one embodiment of the present invention can include OSTBC (orthogonal space time block coding)/OSFBC (orthogonal space frequency block coding, Alamouti coding).

The third block 5200 processes an input data pipe according to MIMO and can include the FEC encoder block, bit interleaver block, bit-to-cell demux block, constellation mapper block, cell interleaver block and time interleaver block in the same manner as the second block 5100, as shown in FIG. 5. However, the data processing procedure of the third block 5200 is different from that of the second block 5100 since the third block 5200 includes a MIMO processing block 5220.

That is, in the third block 5200, basic roles of the FEC encoder block and the bit interleaver block are identical to those of the first and second blocks 5000 and 5100 although functions thereof may be different from those of the first and second blocks 5000 and 5100.

The bit-to-cell demux block 5210 can generate as many output bit streams as input bit streams of MIMO processing and output the output bit streams through MIMO paths for MIMO processing. In this case, the bit-to-cell demux block 5210 can be designed to optimize the decoding performance of the reception apparatus in consideration of characteristics of LDPC and MIMO processing.

Basic roles of the constellation mapper block, cell interleaver block and time interleaver block are identical to those of the first and second blocks 5000 and 5100 although functions thereof may be different from those of the first and second blocks 5000 and 5100. As shown in FIG. 5, as many constellation mapper blocks, cell interleaver blocks and time interleaver blocks as the number of MIMO paths for MIMO processing can be present. In this case, the constellation mapper blocks, cell interleaver blocks and time interleaver blocks can operate equally or independently for data input through the respective paths.

The MIMO processing block 5220 can perform MIMO processing on two input cells using a MIMO encoding matrix and output the MIMO-processed data through two paths. The MIMO encoding matrix according to an embodiment of the present invention can include spatial multiplexing, Golden code, full-rate full diversity code, linear dispersion code, etc.

The fourth block 5300 processes the PLS-pre/PLS-post information and can perform SISO or MISO processing.

The basic roles of the bit interleaver block, bit-to-cell demux block, constellation mapper block, cell interleaver block, time interleaver block and MISO processing block included in the fourth block 5300 correspond to those of the second block 5100 although functions thereof may be different from those of the second block 5100.

A shortened/punctured FEC encoder block 5310 included in the fourth block 5300 can process PLS data using an FEC encoding scheme for a PLS path provided for a case in which the length of input data is shorter than a length necessary to perform FEC encoding. Specifically, the shortened/punctured FEC encoder block 5310 can perform BCH encoding on input bit streams, pad 0s corresponding to a desired input bit stream length necessary for normal LDPC encoding, carry out LDPC encoding and then remove the padded 0s to puncture parity bits such that an effective code rate becomes equal to or lower than the data pipe rate.

The blocks included in the first block 5000 to fourth block 5300 may be omitted or replaced by blocks having similar or identical functions according to design.

As illustrated in FIG. 5, the coding & modulation module can output the data pipes (or DP data), PLS-pre information and PLS-post information processed for the respective paths to the frame structure module.

Figure 6:
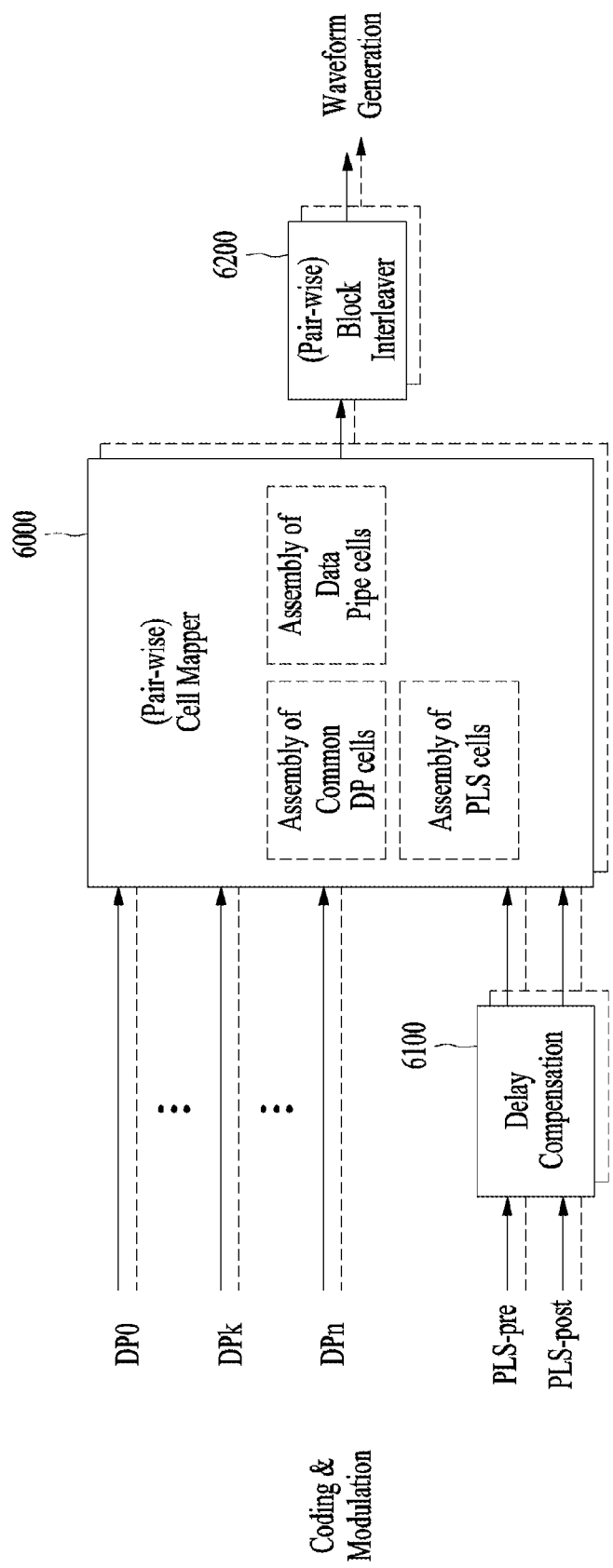
FIG. 6 illustrates a frame structure module according to an embodiment of the present invention.

FIG. 6 illustrates a frame structure module according to one embodiment of the present invention.

The frame structure module shown in FIG. 6 corresponds to an embodiment of the frame structure module 1200 illustrated in FIG. 1.

The frame structure module according to one embodiment of the present invention can include at least one cell-mapper 6000, at least one delay compensation module 6100 and at least one block interleaver 6200. The number of cell mappers 6000, delay compensation modules 6100 and block interleavers 6200 can be changed. A description will be given of each module of the frame structure block.

The cell-mapper 6000 can allocate cells corresponding to SISO-, MISO- or MIMO-processed data pipes output from the coding & modulation module, cells corresponding to common data commonly applicable to the data pipes and cells corresponding to the PLS-pre/PLS-post information to signal frames according to scheduling information. The common data refers to signaling information commonly applied to all or some data pipes and can be transmitted through a specific data pipe. The data pipe through which the common data is transmitted can be referred to as a common data pipe and can be changed according to design.

When the apparatus for transmitting broadcast signals according to an embodiment of the present invention uses two output antennas and Alamouti coding is used for MISO processing, the cell-mapper 6000 can perform pair-wise cell mapping in order to maintain orthogonality according to Alamouti encoding. That is, the cell-mapper 6000 can process two consecutive cells of the input cells as one unit and map the unit to a frame. Accordingly, paired cells in an input path corresponding to an output path of each antenna can be allocated to neighboring positions in a transmission frame.

The delay compensation block 6100 can obtain PLS data corresponding to the current transmission frame by delaying input PLS data cells for the next transmission frame by one frame. In this case, the PLS data corresponding to the current frame can be transmitted through a preamble part in the current signal frame and PLS data corresponding to the next signal frame can be transmitted through a preamble part in the current signal frame or in-band signaling in each data pipe of the current signal frame. This can be changed by the designer.

The block interleaver 6200 can obtain additional diversity gain by interleaving cells in a transport block corresponding to the unit of a signal frame. In addition, the block interleaver 6200 can perform interleaving by processing two consecutive cells of the input cells as one unit when the above-described pair-wise cell mapping is performed. Accordingly, cells output from the block interleaver 6200 can be two consecutive identical cells.

When pair-wise mapping and pair-wise interleaving are performed, at least one cell mapper and at least one block interleaver can operate equally or independently for data input through the paths.

The above-described blocks may be omitted or replaced by blocks having similar or identical functions according to design.

As illustrated in FIG. 6, the frame structure module can output at least one signal frame to the waveform generation module.

Figure 7:
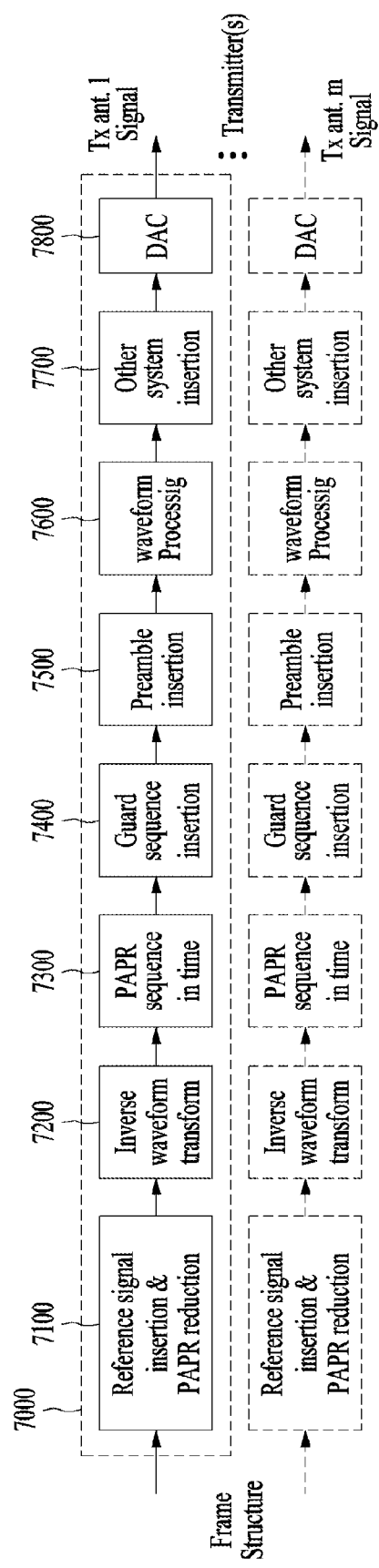
FIG. 7 illustrates a waveform generation module according to an embodiment of the present invention.

FIG. 7 illustrates a waveform generation module according to an embodiment of the present invention.

The waveform generation module illustrated in FIG. 7 corresponds to an embodiment of the waveform generation module 1300 described with reference to FIG. 1.

The waveform generation module according to an embodiment of the present invention can modulate and transmit as many signal frames as the number of antennas for receiving and outputting signal frames output from the frame structure module illustrated in FIG. 6.

Specifically, the waveform generation module illustrated in FIG. 7 is an embodiment of a waveform generation module of an apparatus for transmitting broadcast signals using m Tx antennas and can include m processing blocks for modulating and outputting frames corresponding to m paths. The m processing blocks can perform the same processing procedure. A description will be given of operation of the first processing block 7000 from among the m processing blocks.

The first processing block 7000 can include a reference signal & PAPR reduction block 7100, an inverse waveform transform block 7200, a PAPR reduction in time block 7300, a guard sequence insertion block 7400, a preamble insertion block 7500, a waveform processing block 7600, other system insertion block 7700 and a DAC (digital analog converter) block 7800.

The reference signal insertion & PAPR reduction block 7100 can insert a reference signal into a predetermined position of each signal block and apply a PAPR reduction scheme to reduce a PAPR in the time domain. If a broadcast transmission/reception system according to an embodiment of the present invention corresponds to an OFDM system, the reference signal insertion & PAPR reduction block 7100 can use a method of reserving some active subcarriers rather than using the same. In addition, the reference signal insertion & PAPR reduction block 7100 may not use the PAPR reduction scheme as an optional feature according to broadcast transmission/reception system.

The inverse waveform transform block 7200 can transform an input signal in a manner of improving transmission efficiency and flexibility in consideration of transmission channel characteristics and system architecture. If the broadcast transmission/reception system according to an embodiment of the present invention corresponds to an OFDM system, the inverse waveform transform block 7200 can employ a method of transforming a frequency domain signal into a time domain signal through inverse FFT operation. If the broadcast transmission/reception system according to an embodiment of the present invention corresponds to a single carrier system, the inverse waveform transform block 7200 may not be used in the waveform generation module.

The PAPR reduction in time block 7300 can use a method for reducing PAPR of an input signal in the time domain. If the broadcast transmission/reception system according to an embodiment of the present invention corresponds to an OFDM system, the PAPR reduction in time block 7300 may use a method of simply clipping peak amplitude. Furthermore, the PAPR reduction in time block 7300 may not be used in the broadcast transmission/reception system according to an embodiment of the present invention since it is an optional feature.

The guard sequence insertion block 7400 can provide a guard interval between neighboring signal blocks and insert a specific sequence into the guard interval as necessary in order to minimize the influence of delay spread of a transmission channel. Accordingly, the reception apparatus can easily perform synchronization or channel estimation. If the broadcast transmission/reception system according to an embodiment of the present invention corresponds to an OFDM system, the guard sequence insertion block 7400 may insert a cyclic prefix into a guard interval of an OFDM symbol.

The preamble insertion block 7500 can insert a signal of a known type (e.g. the preamble or preamble symbol) agreed upon between the transmission apparatus and the reception apparatus into a transmission signal such that the reception apparatus can rapidly and efficiently detect a target system signal. If the broadcast transmission/reception system according to an embodiment of the present invention corresponds to an OFDM system, the preamble insertion block 7500 can define a signal frame composed of a plurality of OFDM symbols and insert a preamble symbol into the beginning of each signal frame. That is, the preamble carries basic PLS data and is located in the beginning of a signal frame.

The waveform processing block 7600 can perform waveform processing on an input baseband signal such that the input baseband signal meets channel transmission characteristics. The waveform processing block 7600 may use a method of performing square-root-raised cosine (SRRC) filtering to obtain a standard for out-of-band emission of a transmission signal. If the broadcast transmission/reception system according to an embodiment of the present invention corresponds to a multi-carrier system, the waveform processing block 7600 may not be used.

The other system insertion block 7700 can multiplex signals of a plurality of broadcast transmission/reception systems in the time domain such that data of two or more different broadcast transmission/reception systems providing broadcast services can be simultaneously transmitted in the same RF signal bandwidth. In this case, the two or more different broadcast transmission/reception systems refer to systems providing different broadcast services. The different broadcast services may refer to a terrestrial broadcast service, mobile broadcast service, etc. Data related to respective broadcast services can be transmitted through different frames.

The DAC block 7800 can convert an input digital signal into an analog signal and output the analog signal. The signal output from the DAC block 7800 can be transmitted through m output antennas. A Tx antenna according to an embodiment of the present invention can have vertical or horizontal polarity.

The above-described blocks may be omitted or replaced by blocks having similar or identical functions according to design.

Figure 8:
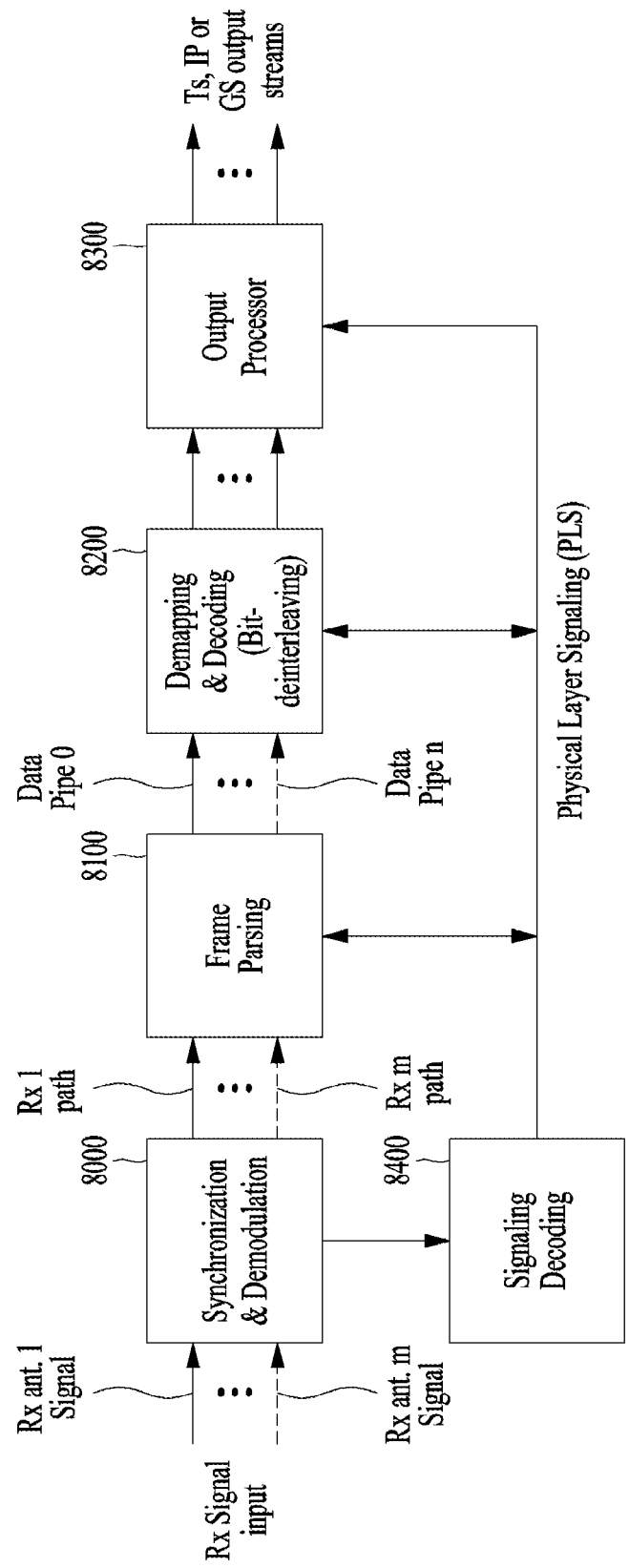
FIG. 8 illustrates a structure of an apparatus for receiving broadcast signals for future broadcast services according to an embodiment of the present invention.

FIG. 8 illustrates a structure of an apparatus for receiving broadcast signals for future broadcast services according to an embodiment of the present invention.

The apparatus for receiving broadcast signals for future broadcast services according to an embodiment of the present invention can correspond to the apparatus for transmitting broadcast signals for future broadcast services, described with reference to FIG. 1. The apparatus for receiving broadcast signals for future broadcast services according to an embodiment of the present invention can include a synchronization & demodulation module 8000, a frame parsing module 8100, a demapping & decoding module 8200, an output processor 8300 and a signaling decoding module 8400. A description will be given of operation of each module of the apparatus for receiving broadcast signals.

The synchronization & demodulation module 8000 can receive input signals through m Rx antennas, perform signal detection and synchronization with respect to a system corresponding to the apparatus for receiving broadcast signals and carry out demodulation corresponding to a reverse procedure of the procedure performed by the apparatus for transmitting broadcast signals.

The frame parsing module 8100 can parse input signal frames and extract data through which a service selected by a user is transmitted. If the apparatus for transmitting broadcast signals performs interleaving, the frame parsing module 8100 can carry out deinterleaving corresponding to a reverse procedure of interleaving. In this case, the positions of a signal and data that need to be extracted can be obtained by decoding data output from the signaling decoding module 8400 to restore scheduling information generated by the apparatus for transmitting broadcast signals.

The demapping & decoding module 8200 can convert the input signals into bit domain data and then deinterleave the same as necessary. The demapping & decoding module 8200 can perform demapping for mapping applied for transmission efficiency and correct an error generated on a transmission channel through decoding. In this case, the demapping & decoding module 8200 can obtain transmission parameters necessary for demapping and decoding by decoding the data output from the signaling decoding module 8400.

The output processor 8300 can perform reverse procedures of various compression/signal processing procedures which are applied by the apparatus for transmitting broadcast signals to improve transmission efficiency. In this case, the output processor 8300 can acquire necessary control information from data output from the signaling decoding module 8400. The output of the output processor 8300 corresponds to a signal input to the apparatus for transmitting broadcast signals and may be MPEG-TSs, IP streams (v4 or v6) and generic streams.

The signaling decoding module 8400 can obtain PLS information from the signal demodulated by the synchronization & demodulation module 8000. As described above, the frame parsing module 8100, demapping & decoding module 8200 and output processor 8300 can execute functions thereof using the data output from the signaling decoding module 8400.

Figure 9:
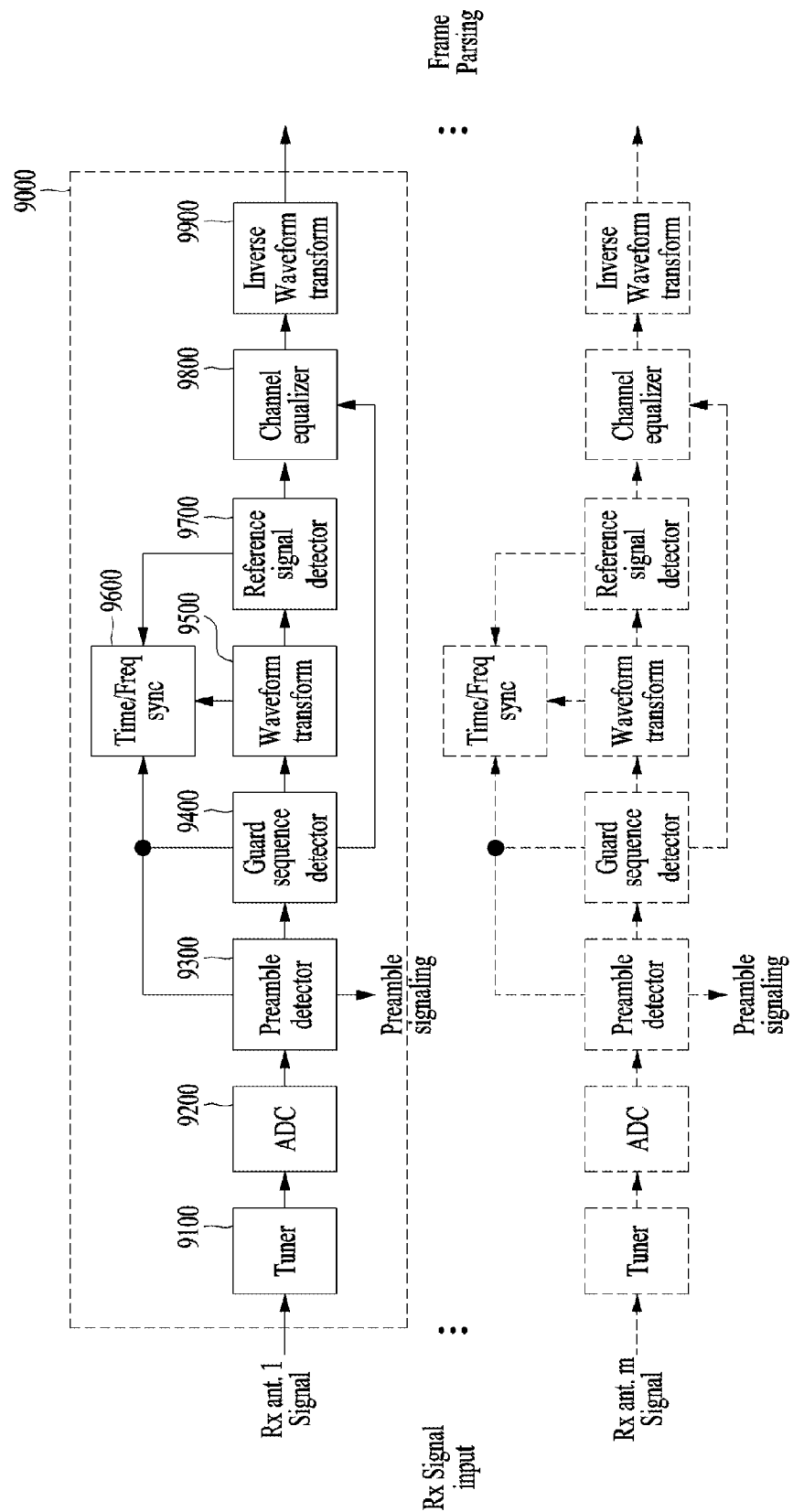
FIG. 9 illustrates a synchronization & demodulation module according to an embodiment of the present invention.

FIG. 9 illustrates a synchronization & demodulation module according to an embodiment of the present invention.

The synchronization & demodulation module shown in FIG. 9 corresponds to an embodiment of the synchronization & demodulation module described with reference to FIG. 8. The synchronization & demodulation module shown in FIG. 9 can perform a reverse operation of the operation of the waveform generation module illustrated in FIG. 7.

As shown in FIG. 9, the synchronization & demodulation module according to an embodiment of the present invention corresponds to a synchronization & demodulation module of an apparatus for receiving broadcast signals using m Rx antennas and can include m processing blocks for demodulating signals respectively input through m paths. The m processing blocks can perform the same processing procedure. A description will be given of operation of the first processing block 9000 from among the m processing blocks.

The first processing block 9000 can include a tuner 9100, an ADC block 9200, a preamble detector 9300, a guard sequence detector 9400, a waveform transform block 9500, a time/frequency synchronization block 9600, a reference signal detector 9700, a channel equalizer 9800 and an inverse waveform transform block 9900.

The tuner 9100 can select a desired frequency band, compensate for the magnitude of a received signal and output the compensated signal to the ADC block 9200.

The ADC block 9200 can convert the signal output from the tuner 9100 into a digital signal.

The preamble detector 9300 can detect a preamble (or preamble signal or preamble symbol) in order to check whether or not the digital signal is a signal of the system corresponding to the apparatus for receiving broadcast signals. In this case, the preamble detector 9300 can decode basic transmission parameters received through the preamble.

The guard sequence detector 9400 can detect a guard sequence in the digital signal. The time/frequency synchronization block 9600 can perform time/frequency synchronization using the detected guard sequence and the channel equalizer 9800 can estimate a channel through a received/restored sequence using the detected guard sequence.

The waveform transform block 9500 can perform a reverse operation of inverse waveform transform when the apparatus for transmitting broadcast signals has performed inverse waveform transform. When the broadcast transmission/reception system according to one embodiment of the present invention is a multi-carrier system, the waveform transform block 9500 can perform FFT. Furthermore, when the broadcast transmission/reception system according to an embodiment of the present invention is a single carrier system, the waveform transform block 9500 may not be used if a received time domain signal is processed in the frequency domain or processed in the time domain.

The time/frequency synchronization block 9600 can receive output data of the preamble detector 9300, guard sequence detector 9400 and reference signal detector 9700 and perform time synchronization and carrier frequency synchronization including guard sequence detection and block window positioning on a detected signal. Here, the time/frequency synchronization block 9600 can feed back the output signal of the waveform transform block 9500 for frequency synchronization.

The reference signal detector 9700 can detect a received reference signal. Accordingly, the apparatus for receiving broadcast signals according to an embodiment of the present invention can perform synchronization or channel estimation.

The channel equalizer 9800 can estimate a transmission channel from each Tx antenna to each Rx antenna from the guard sequence or reference signal and perform channel equalization for received data using the estimated channel.

The inverse waveform transform block 9900 may restore the original received data domain when the waveform transform block 9500 performs waveform transform for efficient synchronization and channel estimation/equalization. If the broadcast transmission/reception system according to an embodiment of the present invention is a single carrier system, the waveform transform block 9500 can perform FFT in order to carry out synchronization/channel estimation/equalization in the frequency domain and the inverse waveform transform block 9900 can perform IFFT on the channel-equalized signal to restore transmitted data symbols. If the broadcast transmission/reception system according to an embodiment of the present invention is a multi-carrier system, the inverse waveform transform block 9900 may not be used.

The above-described blocks may be omitted or replaced by blocks having similar or identical functions according to design.

Figure 10:
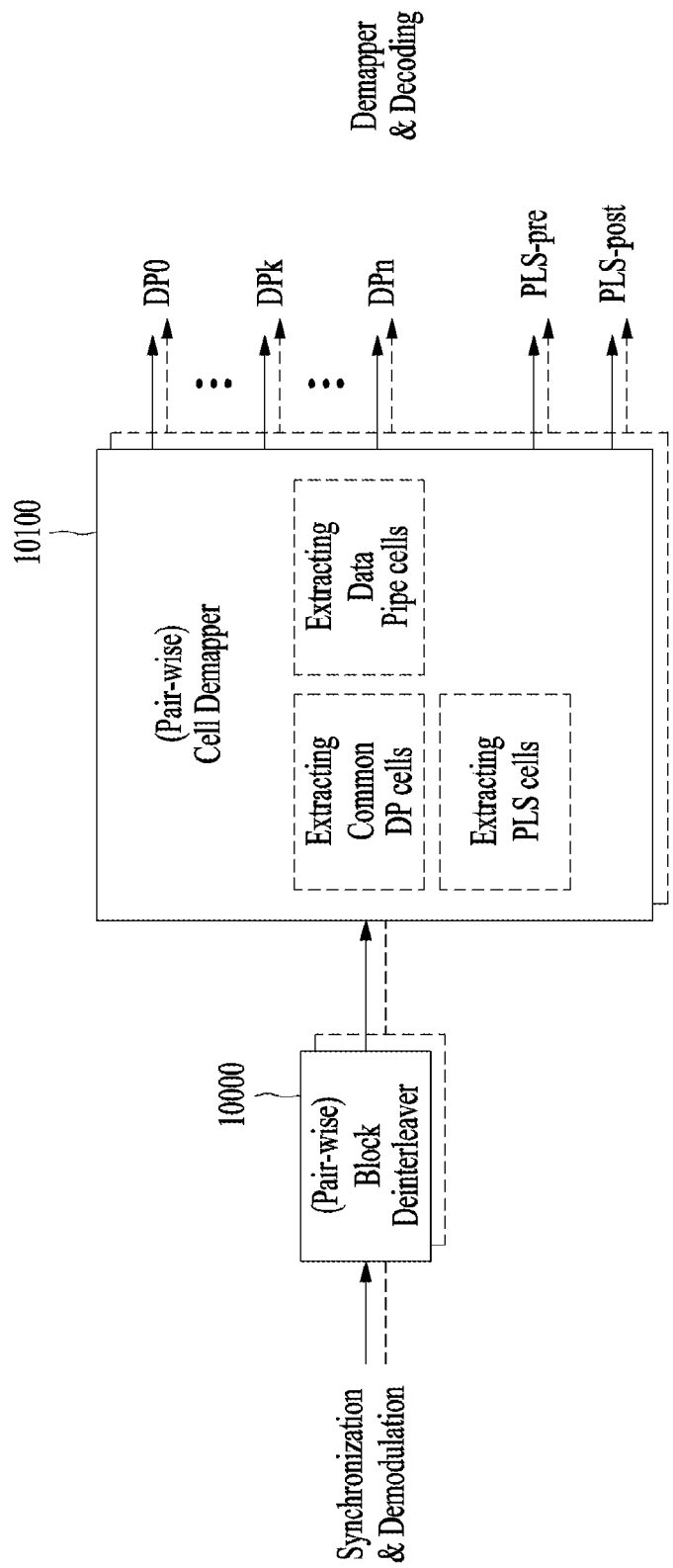
FIG. 10 illustrates a frame parsing module according to an embodiment of the present invention.

FIG. 10 illustrates a frame parsing module according to an embodiment of the present invention.

The frame parsing module illustrated in FIG. 10 corresponds to an embodiment of the frame parsing module described with reference to FIG. 8. The frame parsing module shown in FIG. 10 can perform a reverse operation of the operation of the frame structure module illustrated in FIG. 6.

As shown in FIG. 10, the frame parsing module according to an embodiment of the present invention can include at least one block deinterleaver 10000 and at least one cell demapper 10100.

The block deinterleaver 10000 can deinterleave data input through data paths of the m Rx antennas and processed by the synchronization & demodulation module on a signal block basis. In this case, if the apparatus for transmitting broadcast signals performs pair-wise interleaving as illustrated in FIG. 8, the block deinterleaver 10000 can process two consecutive pieces of data as a pair for each input path. Accordingly, the block interleaver 10000 can output two consecutive pieces of data even when deinterleaving has been performed. Furthermore, the block deinterleaver 10000 can perform a reverse operation of the interleaving operation performed by the apparatus for transmitting broadcast signals to output data in the original order.

The cell demapper 10100 can extract cells corresponding to common data, cells corresponding to data pipes and cells corresponding to PLS data from received signal frames. The cell demapper 10100 can merge data distributed and transmitted and output the same as a stream as necessary. When two consecutive pieces of cell input data are processed as a pair and mapped in the apparatus for transmitting broadcast signals, as shown in FIG. 6, the cell demapper 10100 can perform pair-wise cell demapping for processing two consecutive input cells as one unit as a reverse procedure of the mapping operation of the apparatus for transmitting broadcast signals.

In addition, the cell demapper 10100 can extract PLS signaling data received through the current frame as PLS-pre & PLS-post data and output the PLS-pre & PLS-post data.

The above-described blocks may be omitted or replaced by blocks having similar or identical functions according to design.

Figure 11:
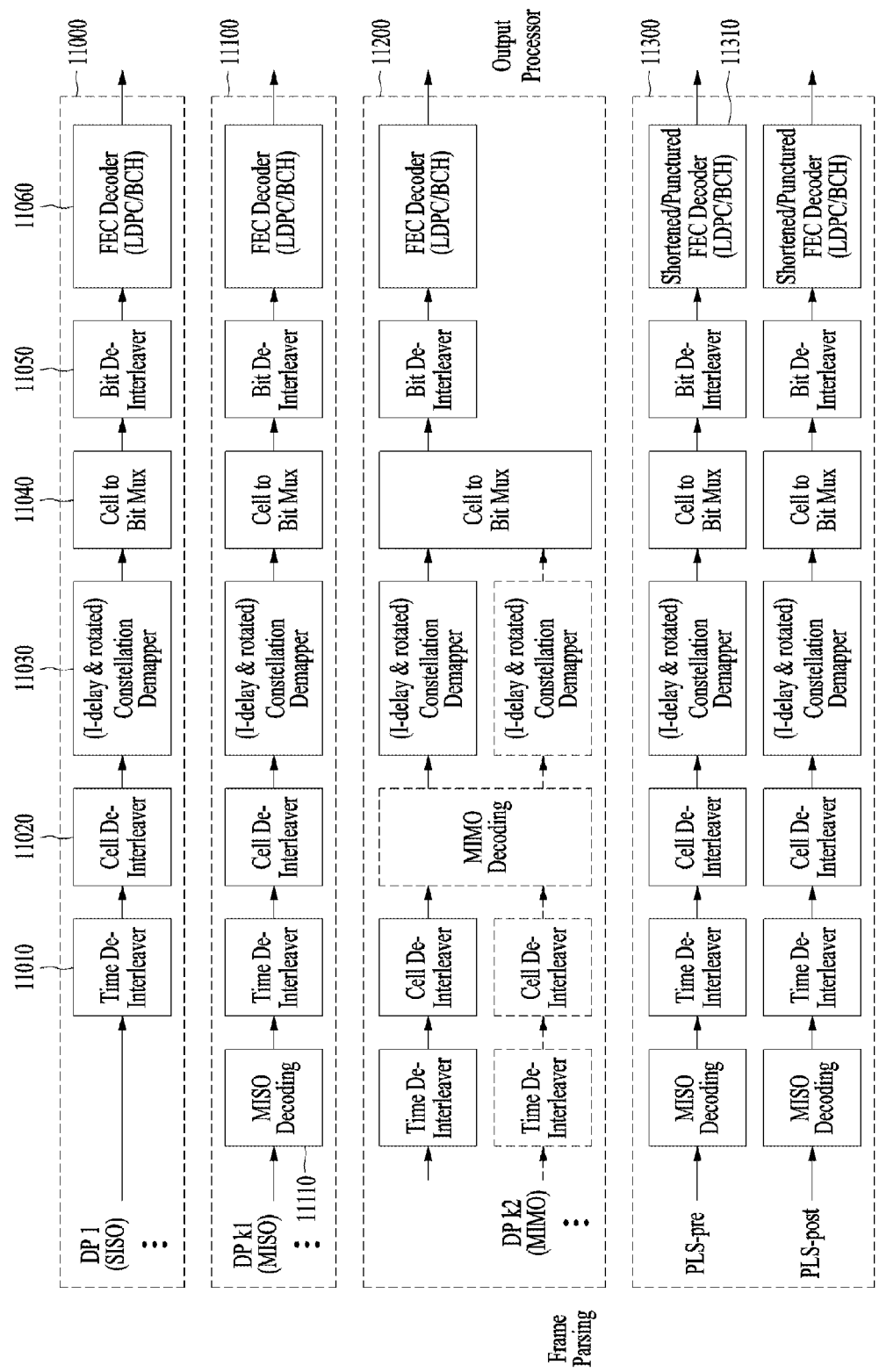
FIG. 11 illustrates a demapping & decoding module according to an embodiment of the present invention.

FIG. 11 illustrates a demapping & decoding module according to an embodiment of the present invention.

The demapping & decoding module shown in FIG. 11 corresponds to an embodiment of the demapping & decoding module illustrated in FIG. 8. The demapping & decoding module shown in FIG. 11 can perform a reverse operation of the operation of the coding & modulation module illustrated in FIG. 5.

The coding & modulation module of the apparatus for transmitting broadcast signals according to an embodiment of the present invention can process input data pipes by independently applying SISO, MISO and MIMO thereto for respective paths, as described above. Accordingly, the demapping & decoding module illustrated in FIG. 11 can include blocks for processing data output from the frame parsing module according to SISO, MISO and MIMO in response to the apparatus for transmitting broadcast signals.

As shown in FIG. 11, the demapping & decoding module according to an embodiment of the present invention can include a first block 11000 for SISO, a second block 11100 for MISO, a third block 11200 for MIMO and a fourth block 11300 for processing the PLS-pre/PLS-post information. The demapping & decoding module shown in FIG. 11 is exemplary and may include only the first block 11000 and the fourth block 11300, only the second block 11100 and the fourth block 11300 or only the third block 11200 and the fourth block 11300 according to design. That is, the demapping & decoding module can include blocks for processing data pipes equally or differently according to design.

A description will be given of each block of the demapping & decoding module.

The first block 11000 processes an input data pipe according to SISO and can include a time deinterleaver block 11010, a cell deinterleaver block 11020, a constellation demapper block 11030, a cell-to-bit mux block 11040, a bit deinterleaver block 11050 and an FEC decoder block 11060.

The time deinterleaver block 11010 can perform a reverse process of the process performed by the time interleaver block 5060 illustrated in FIG. 5. That is, the time deinterleaver block 11010 can deinterleave input symbols interleaved in the time domain into original positions thereof.

The cell deinterleaver block 11020 can perform a reverse process of the process performed by the cell interleaver block 5050 illustrated in FIG. 5. That is, the cell deinterleaver block 11020 can deinterleave positions of cells spread in one FEC block into original positions thereof.

The constellation demapper block 11030 can perform a reverse process of the process performed by the constellation mapper block 5040 illustrated in FIG. 5. That is, the constellation demapper block 11030 can demap a symbol domain input signal to bit domain data. In addition, the constellation demapper block 11030 may perform hard decision and output decided bit data. Furthermore, the constellation demapper block 11030 may output a log-likelihood ratio (LLR) of each bit, which corresponds to a soft decision value or probability value. If the apparatus for transmitting broadcast signals applies a rotated constellation in order to obtain additional diversity gain, the constellation demapper block 11030 can perform 2-dimensional LLR demapping corresponding to the rotated constellation. Here, the constellation demapper block 11030 can calculate the LLR such that a delay applied by the apparatus for transmitting broadcast signals to the I or Q component can be compensated.

The cell-to-bit mux block 11040 can perform a reverse process of the process performed by the bit-to-cell demux block 5030 illustrated in FIG. 5. That is, the cell-to-bit mux block 11040 can restore bit data mapped by the bit-to-cell demux block 5030 to the original bit streams.

The bit deinterleaver block 11050 can perform a reverse process of the process performed by the bit interleaver 5020 illustrated in FIG. 5. That is, the bit deinterleaver block 11050 can deinterleave the bit streams output from the cell-to-bit mux block 11040 in the original order.

The FEC decoder block 11060 can perform a reverse process of the process performed by the FEC encoder block 5010 illustrated in FIG. 5. That is, the FEC decoder block 11060 can correct an error generated on a transmission channel by performing LDPC decoding and BCH decoding.

The second block 11100 processes an input data pipe according to MISO and can include the time deinterleaver block, cell deinterleaver block, constellation demapper block, cell-to-bit mux block, bit deinterleaver block and FEC decoder block in the same manner as the first block 11000, as shown in FIG. 11. However, the second block 11100 is distinguished from the first block 11000 in that the second block 11100 further includes a MISO decoding block 11110. The second block 11100 performs the same procedure including time deinterleaving operation to outputting operation as the first block 11000 and thus description of the corresponding blocks is omitted.

The MISO decoding block 11110 can perform a reverse operation of the operation of the MISO processing block 5110 illustrated in FIG. 5. If the broadcast transmission/reception system according to an embodiment of the present invention uses STBC, the MISO decoding block 11110 can perform Alamouti decoding.

The third block 11200 processes an input data pipe according to MIMO and can include the time deinterleaver block, cell deinterleaver block, constellation demapper block, cell-to-bit mux block, bit deinterleaver block and FEC decoder block in the same manner as the second block 11100, as shown in FIG. 11. However, the third block 11200 is distinguished from the second block 11100 in that the third block 11200 further includes a MIMO decoding block 11210. The basic roles of the time deinterleaver block, cell deinterleaver block, constellation demapper block, cell-to-bit mux block and bit deinterleaver block included in the third block 11200 are identical to those of the corresponding blocks included in the first and second blocks 11000 and 11100 although functions thereof may be different from the first and second blocks 11000 and 11100.

The MIMO decoding block 11210 can receive output data of the cell deinterleaver for input signals of the m Rx antennas and perform MIMO decoding as a reverse operation of the operation of the MIMO processing block 5220 illustrated in FIG. 5. The MIMO decoding block 11210 can perform maximum likelihood decoding to obtain optimal decoding performance or carry out sphere decoding with reduced complexity. Otherwise, the MIMO decoding block 11210 can achieve improved decoding performance by performing MMSE detection or carrying out iterative decoding with MMSE detection.

The fourth block 11300 processes the PLS-pre/PLS-post information and can perform SISO or MISO decoding. The fourth block 11300 can carry out a reverse process of the process performed by the fourth block 5300 described with reference to FIG. 5.

The basic roles of the time deinterleaver block, cell deinterleaver block, constellation demapper block, cell-to-bit mux block and bit deinterleaver block included in the fourth block 11300 are identical to those of the corresponding blocks of the first, second and third blocks 11000, 11100 and 11200 although functions thereof may be different from the first, second and third blocks 11000, 11100 and 11200.

The shortened/punctured FEC decoder 11310 included in the fourth block 11300 can perform a reverse process of the process performed by the shortened/punctured FEC encoder block 5310 described with reference to FIG. 5. That is, the shortened/punctured FEC decoder 11310 can perform de-shortening and de-puncturing on data shortened/punctured according to PLS data length and then carry out FEC decoding thereon. In this case, the FEC decoder used for data pipes can also be used for PLS. Accordingly, additional FEC decoder hardware for the PLS only is not needed and thus system design is simplified and efficient coding is achieved.

The above-described blocks may be omitted or replaced by blocks having similar or identical functions according to design.

The demapping & decoding module according to an embodiment of the present invention can output data pipes and PLS information processed for the respective paths to the output processor, as illustrated in FIG. 11.

Figure 12:
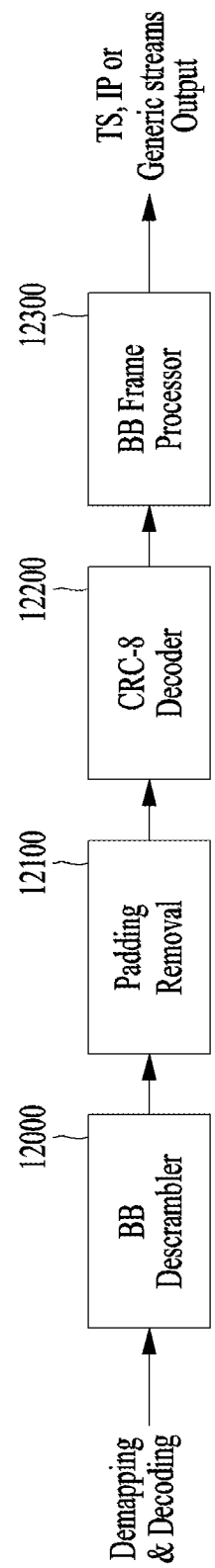
FIG. 12 illustrates an output processor according to an embodiment of the present invention.
Figure 13:
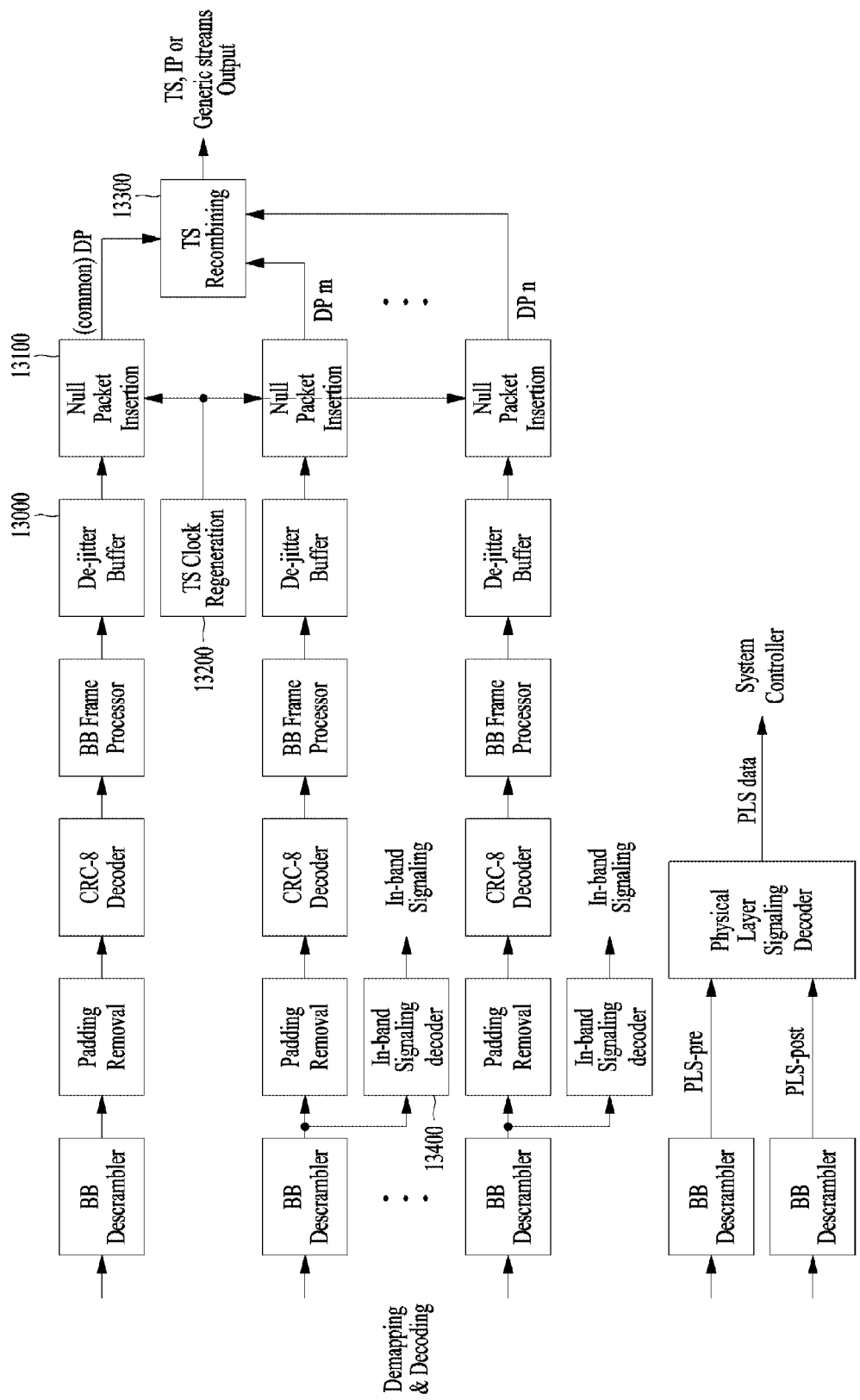
FIG. 13 illustrates an output processor according to another embodiment of the present invention.

FIGS. 12 and 13 illustrate output processors according to embodiments of the present invention.

FIG. 12 illustrates an output processor according to an embodiment of the present invention. The output processor illustrated in FIG. 12 corresponds to an embodiment of the output processor illustrated in FIG. 8. The output processor illustrated in FIG. 12 receives a single data pipe output from the demapping & decoding module and outputs a single output stream. The output processor can perform a reverse operation of the operation of the input formatting module illustrated in FIG. 2.

The output processor shown in FIG. 12 can include a BB scrambler block 12000, a padding removal block 12100, a CRC-8 decoder block 12200 and a BB frame processor block 12300.

The BB scrambler block 12000 can descramble an input bit stream by generating the same PRBS as that used in the apparatus for transmitting broadcast signals for the input bit stream and carrying out an XOR operation on the PRBS and the bit stream.

The padding removal block 12100 can remove padding bits inserted by the apparatus for transmitting broadcast signals as necessary.

The CRC-8 decoder block 12200 can check a block error by performing CRC decoding on the bit stream received from the padding removal block 12100.

The BB frame processor block 12300 can decode information transmitted through a BB frame header and restore MPEG-TSs, IP streams (v4 or v6) or generic streams using the decoded information.

The above-described blocks may be omitted or replaced by blocks having similar or identical functions according to design.

FIG. 13 illustrates an output processor according to another embodiment of the present invention. The output processor shown in FIG. 13 corresponds to an embodiment of the output processor illustrated in FIG. 8. The output processor shown in FIG. 13 receives multiple data pipes output from the demapping & decoding module. Decoding multiple data pipes can include a process of merging common data commonly applicable to a plurality of data pipes and data pipes related thereto and decoding the same or a process of simultaneously decoding a plurality of services or service components (including a scalable video service) by the apparatus for receiving broadcast signals.

The output processor shown in FIG. 13 can include a BB descrambler block, a padding removal block, a CRC-8 decoder block and a BB frame processor block as the output processor illustrated in FIG. 12. The basic roles of these blocks correspond to those of the blocks described with reference to FIG. 12 although operations thereof may differ from those of the blocks illustrated in FIG. 12.

A de-jitter buffer block 13000 included in the output processor shown in FIG. 13 can compensate for a delay, inserted by the apparatus for transmitting broadcast signals for synchronization of multiple data pipes, according to a restored TTO (time to output) parameter.

A null packet insertion block 13100 can restore a null packet removed from a stream with reference to a restored DNP (deleted null packet) and output common data.

A TS clock regeneration block 13200 can restore time synchronization of output packets based on ISCR (input stream time reference) information.

A TS recombining block 13300 can recombine the common data and data pipes related thereto, output from the null packet insertion block 13100, to restore the original MPEG-TSs, IP streams (v4 or v6) or generic streams. The TTO, DNT and ISCR information can be obtained through the BB frame header.

An in-band signaling decoding block 13400 can decode and output in-band physical layer signaling information transmitted through a padding bit field in each FEC frame of a data pipe.

The output processor shown in FIG. 13 can BB-descramble the PLS-pre information and PLS-post information respectively input through a PLS-pre path and a PLS-post path and decode the descrambled data to restore the original PLS data. The restored PLS data is delivered to a system controller included in the apparatus for receiving broadcast signals. The system controller can provide parameters necessary for the synchronization & demodulation module, frame parsing module, demapping & decoding module and output processor module of the apparatus for receiving broadcast signals.

The above-described blocks may be omitted or replaced by blocks having similar r identical functions according to design.

Figure 14:
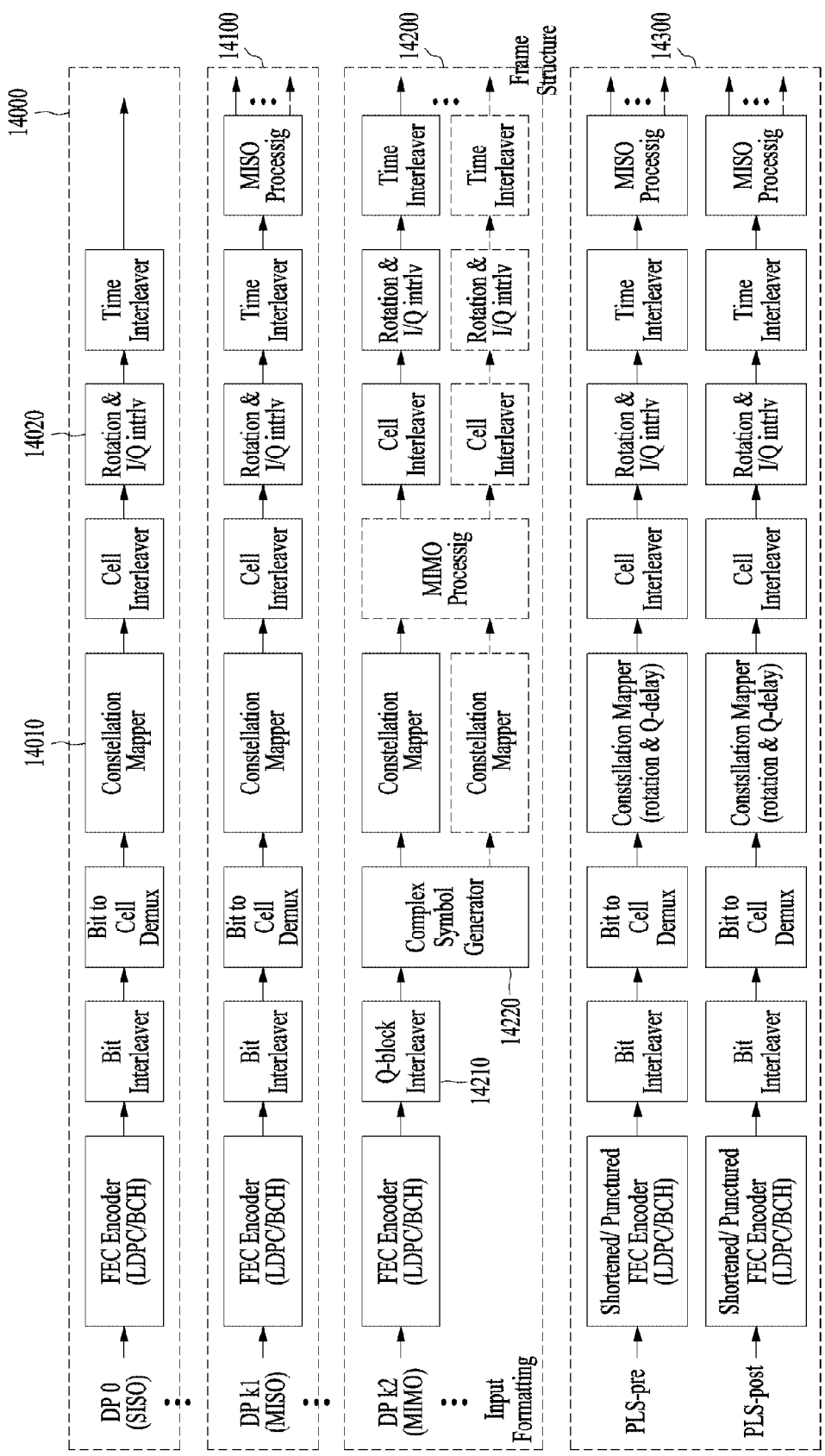
FIG. 14 illustrates a coding & modulation module according to another embodiment of the present invention.

FIG. 14 illustrates a coding & modulation module according to another embodiment of the present invention.

The coding & modulation module shown in FIG. 14 corresponds to another embodiment of the coding & modulation module illustrated in FIGS. 1 to 5.

To control QoS for each service or service component transmitted through each data pipe, as described above with reference to FIG. 5, the coding & modulation module shown in FIG. 14 can include a first block 14000 for SISO, a second block 14100 for MISO, a third block 14200 for MIMO and a fourth block 14300 for processing the PLS-pre/PLS-post information. In addition, the coding & modulation module can include blocks for processing data pipes equally or differently according to the design. The first to fourth blocks 14000 to 14300 shown in FIG. 14 are similar to the first to fourth blocks 5000 to 5300 illustrated in FIG. 5.

However, the first to fourth blocks 14000 to 14300 shown in FIG. 14 are distinguished from the first to fourth blocks 5000 to 5300 illustrated in FIG. 5 in that a constellation mapper 14010 included in the first to fourth blocks 14000 to 14300 has a function different from the first to fourth blocks 5000 to 5300 illustrated in FIG. 5, a rotation & I/Q interleaver block 14020 is present between the cell interleaver and the time interleaver of the first to fourth blocks 14000 to 14300 illustrated in FIG. 14 and the third block 14200 for MIMO has a configuration different from the third block 5200 for MIMO illustrated in FIG. 5. The following description focuses on these differences between the first to fourth blocks 14000 to 14300 shown in FIG. 14 and the first to fourth blocks 5000 to 5300 illustrated in FIG. 5.

The constellation mapper block 14010 shown in FIG. 14 can map an input bit word to a complex symbol. However, the constellation mapper block 14010 may not perform constellation rotation, differently from the constellation mapper block shown in FIG. 5. The constellation mapper block 14010 shown in FIG. 14 is commonly applicable to the first, second and third blocks 14000, 14100 and 14200, as described above.

The rotation & I/Q interleaver block 14020 can independently interleave in-phase and quadrature-phase components of each complex symbol of cell-interleaved data output from the cell interleaver and output the in-phase and quadrature-phase components on a symbol-by-symbol basis. The number of number of input data pieces and output data pieces of the rotation & I/Q interleaver block 14020 is two or more which can be changed by the designer. In addition, the rotation & I/Q interleaver block 14020 may not interleave the in-phase component.

The rotation & I/Q interleaver block 14020 is commonly applicable to the first to fourth blocks 14000 to 14300, as described above. In this case, whether or not the rotation & I/Q interleaver block 14020 is applied to the fourth block 14300 for processing the PLS-pre/post information can be signaled through the above-described preamble.

The third block 14200 for MIMO can include a Q-block interleaver block 14210 and a complex symbol generator block 14220, as illustrated in FIG. 14.

The Q-block interleaver block 14210 can permute a parity part of an FEC-encoded FEC block received from the FEC encoder. Accordingly, a parity part of an LDPC H matrix can be made into a cyclic structure like an information part. The Q-block interleaver block 14210 can permute the order of output bit blocks having Q size of the LDPC H matrix and then perform row-column block interleaving to generate final bit streams.

The complex symbol generator block 14220 receives the bit streams output from the Q-block interleaver block 14210, maps the bit streams to complex symbols and outputs the complex symbols. In this case, the complex symbol generator block 14220 can output the complex symbols through at least two paths. This can be modified by the designer.

The above-described blocks may be omitted or replaced by blocks having similar or identical functions according to design.

The coding & modulation module according to another embodiment of the present invention, illustrated in FIG. 14, can output data pipes, PLS-pre information and PLS-post information processed for respective paths to the frame structure module.

Figure 15:
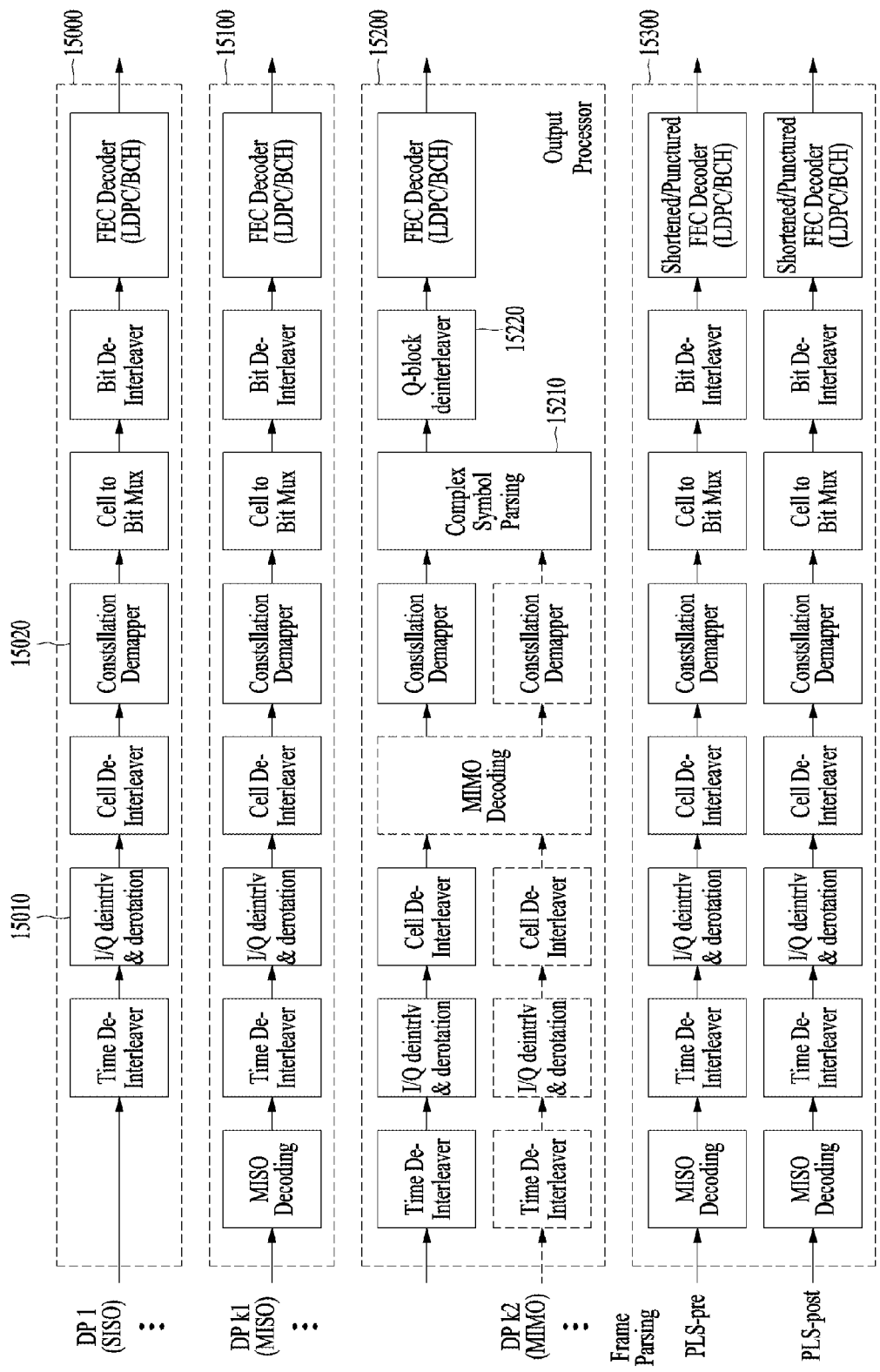
FIG. 15 illustrates a demapping & decoding module according to another embodiment of the present invention.

FIG. 15 illustrates a demapping & decoding module according to another embodiment of the present invention.

The demapping & decoding module shown in FIG. 15 corresponds to another embodiment of the demapping & decoding module illustrated in FIG. 11. The demapping & decoding module shown in FIG. 15 can perform a reverse operation of the operation of the coding & modulation module illustrated in FIG. 14.

As shown in FIG. 15, the demapping & decoding module according to another embodiment of the present invention can include a first block 15000 for SISO, a second block 11100 for MISO, a third block 15200 for MIMO and a fourth block 14300 for processing the PLS-pre/PLS-post information. In addition, the demapping & decoding module can include blocks for processing data pipes equally or differently according to design. The first to fourth blocks 15000 to 15300 shown in FIG. 15 are similar to the first to fourth blocks 11000 to 11300 illustrated in FIG. 11.

However, the first to fourth blocks 15000 to 15300 shown in FIG. 15 are distinguished from the first to fourth blocks 11000 to 11300 illustrated in FIG. 11 in that an I/Q deinterleaver and derotation block 15010 is present between the time interleaver and the cell deinterleaver of the first to fourth blocks 15000 to 15300, a constellation mapper 15010 included in the first to fourth blocks 15000 to 15300 has a function different from the first to fourth blocks 11000 to 11300 illustrated in FIG. 11 and the third block 15200 for MIMO has a configuration different from the third block 11200 for MIMO illustrated in FIG. 11. The following description focuses on these differences between the first to fourth blocks 15000 to 15300 shown in FIG. 15 and the first to fourth blocks 11000 to 11300 illustrated in FIG. 11.

The I/Q deinterleaver & derotation block 15010 can perform a reverse process of the process performed by the rotation & I/Q interleaver block 14020 illustrated in FIG. 14. That is, the I/Q deinterleaver & derotation block 15010 can deinterleave I and Q components I/Q-interleaved and transmitted by the apparatus for transmitting broadcast signals and derotate complex symbols having the restored I and Q components.

The I/Q deinterleaver & derotation block 15010 is commonly applicable to the first to fourth blocks 15000 to 15300, as described above. In this case, whether or not the I/Q deinterleaver & derotation block 15010 is applied to the fourth block 15300 for processing the PLS-pre/post information can be signaled through the above-described preamble.

The constellation demapper block 15020 can perform a reverse process of the process performed by the constellation mapper block 14010 illustrated in FIG. 14. That is, the constellation demapper block 15020 can demap cell-deinterleaved data without performing derotation.

The third block 15200 for MIMO can include a complex symbol parsing block 15210 and a Q-block deinterleaver block 15220, as shown in FIG. 15.

The complex symbol parsing block 15210 can perform a reverse process of the process performed by the complex symbol generator block 14220 illustrated in FIG. 14. That is, the complex symbol parsing block 15210 can parse complex data symbols and demap the same to bit data. In this case, the complex symbol parsing block 15210 can receive complex data symbols through at least two paths.

The Q-block deinterleaver block 15220 can perform a reverse process of the process carried out by the Q-block interleaver block 14210 illustrated in FIG. 14. That is, the Q-block deinterleaver block 15220 can restore Q size blocks according to row-column deinterleaving, restore the order of permuted blocks to the original order and then restore positions of parity bits to original positions according to parity deinterleaving.

The above-described blocks may be omitted or replaced by blocks having similar or identical functions according to design.

As illustrated in FIG. 15, the demapping & decoding module according to another embodiment of the present invention can output data pipes and PLS information processed for respective paths to the output processor.

As described above, the apparatus and method for transmitting broadcast signals according to an embodiment of the present invention can multiplex signals of different broadcast transmission/reception systems within the same RF channel and transmit the multiplexed signals and the apparatus and method for receiving broadcast signals according to an embodiment of the present invention can process the signals in response to the broadcast signal transmission operation. Accordingly, it is possible to provide a flexible broadcast transmission and reception system.

Figure 16:
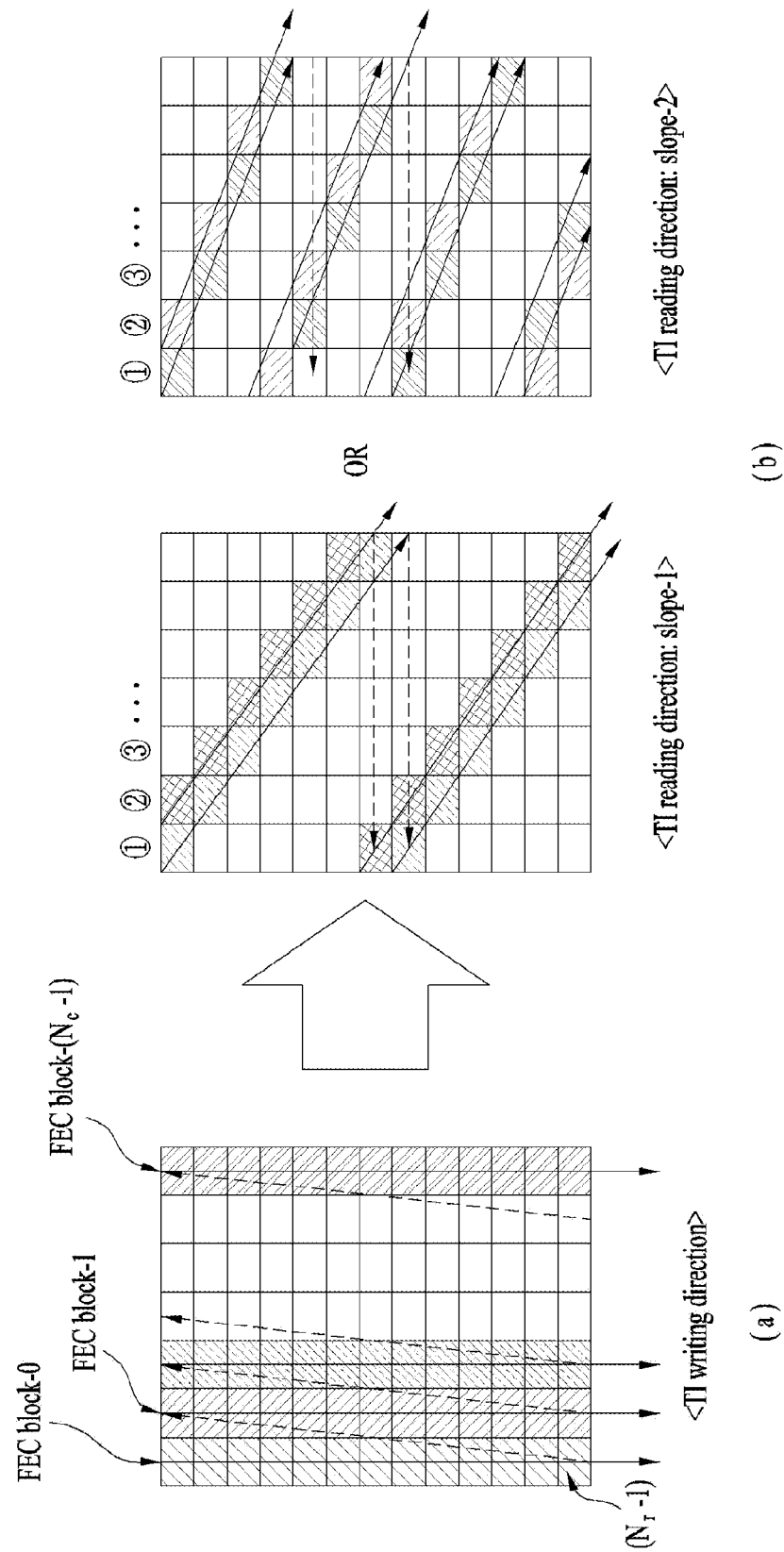
FIG. 16 illustrates a time interleaving process according to an embodiment of the present invention.

FIG. 16 illustrates a time interleaving process according to an embodiment of the present invention.

As described above, a timer interleaver (or time interleaver block) included in a broadcast signal transmitter according to an embodiment of the present invention interleaves cells belonging to a plurality of FEC blocks in the time domain and outputs the interleaved cells.

TI group is a unit over which dynamic capacity allocation for a particular DP is carried out, made up of an integer, dynamically varying number of FEC blocks. Time interleaving block (TI block) is a set of cells within which time interleaving is carried out, corresponding to one use of the time interleaver memory. FEC block may be a set of encoded bits of a DP data or a set of number of cells carrying all the encoded bits.

Each TI group is either mapped directly onto one frame or spread over multiple frames. Each TI group is also divided into more than one TI blocks, where each TI block corresponds to one usage of time interleaver memory. The TI blocks within the TI group may contain slightly different numbers of FECBLOCKs.

The cells of the FEC blocks are transmitted being distributed in a specific period corresponding to a time interleaving depth through time interleaving, and thus diversity gain can be obtained. The time interleaver according to an embodiment of the present invention operates at the DP level.

In addition, the time interleaver according to an embodiment of the present invention can perform time interleaving including a writing operation of sequentially arranging different input FEC blocks in a predetermined memory and a diagonal reading operation of interleaving the FEC blocks in a diagonal direction. In particular, the time interleaver according to an embodiment of the present invention can change the size of a diagonal slope of a reading direction and perform time interleaving while reading different FEC blocks in a diagonal direction. That is, the time interleaver according to an embodiment of the present invention can change a TI reading pattern. Time interleaving according to an embodiment of the present invention may be referred to as diagonal-type time interleaving or diagonal-type TI or flexible diagonal-type time interleaving or flexible diagonal-type TI.

Typically, the time interleaver will also act as a buffer for DP data prior to the process of frame building. This is achieved by means of two memory banks for each DP. The first TI-block is written to the first bank. The second TI-block is written to the second bank while the first bank is being read from and so on.

The name of a device which performs time interleaving or the location or function of the device may be changed according to designer.

A TI block according to an embodiment may be composed of $N_c$ FEC blocks and the length of an FEC block may be assumed to be $N_r \times 1$. Accordingly, a TI memory according to an embodiment of the present invention can have a size corresponding to an $N_r \times N_c$ matrix. In addition, the depth of time interleaving according to an embodiment of the present invention corresponds to the FEC block length. FIG. 16($a$) shows a writing direction of time interleaving according to an embodiment of the present invention and FIG. 16($b$) shows a reading direction of time interleaving according to an embodiment of the present invention.

Specifically, the broadcast signal transmitter according to an embodiment of the present invention can sequentially write input FEC blocks column-wise in a TI memory having a size of $N_r \times N_c$ (column-wise writing), as shown in FIG. 16($a$). The first FECBLOCK 0 is written column-wise into the first column of the TI memory, and the second FECBLOCK 1 is written in the next column, and so on. The broadcast signal transmitter according to an embodiment of the present invention can read the FEC blocks written column-wise in a diagonal direction, as shown in FIG. 16($b$). In this case, the broadcast signal transmitter according to an embodiment of the present invention can perform diagonal reading for one period. In particular, in this case, as shown in FIG. 16($b$), the diagonal slope of the TI reading direction may be differently set for respective TI blocks or super frame units.

That is, during diagonal-wise reading from the first row (rightwards along the row beginning with the left-most column) to the last row, $N_r$ cells are read out as shown in FIG. 16($b$).

In particular, in this case, as shown in FIG. 16($b$), the diagonal slope of the TI reading direction may be differently set for respective TI blocks or super frame units. FIG. 16 illustrates the case in which the diagonal slope of the TDI writing direction is a diagonal slope-1 or a diagonal slope-2.

When the diagonal slope of the TI reading direction is a diagonal slope-1, since the diagonal reading process of the first period starts at (0,0) of the memory matrix and is performed until the cell of the lowest row is read, cells within different FEC blocks can be uniformly interleaved. Diagonal reading of the next periods can be performed in order of ①, ② and ③ in FIG. 16($b$).

In addition, when the diagonal slope of the TI reading direction is the slope-2, the TI diagonal reading can be performed from a memory matrix (0,0) for a first period according to the diagonal slope of the TI reading direction until cells contained in a specific FEC block are read according to a specific shifting value. This can be changed according to intention of the designer.

Figure 17:
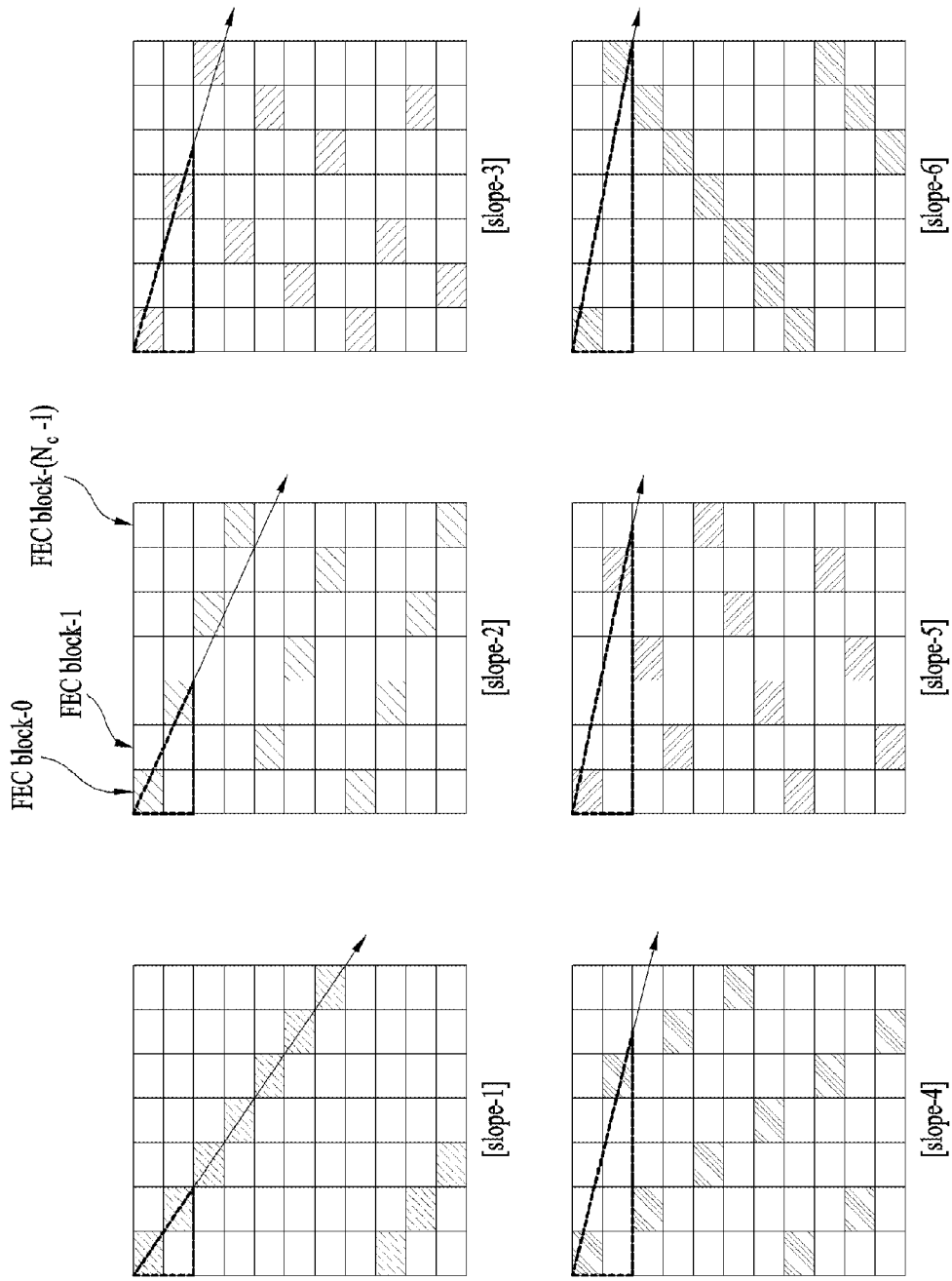
FIG. 17 illustrates diagonal slopes according to an embodiment of the present invention.

FIG. 17 illustrates diagonal slopes according to an embodiment of the present invention.

FIG. 17 illustrates a diagonal slope-1 to a diagonal slope-6 when the size of $N_c$ of a TI block is 7 and the size of $N_r$ is 11 according to an embodiment of the present invention. The size of the diagonal slope according to an embodiment of the present invention can be changed according to intention of the designer.

The t time interleaver according to an embodiment of the present invention can change the size of the diagonal slope of the TI reading according to the size of a maximum TI memory size and change a TI reading pattern. The TI reading pattern can be changed in a superframe unit as a set of signal frames that are consecutively transmitted in a time axis and information about the TI reading pattern may be transmitted through the aforementioned static PLS signaling data.

Figure 18:
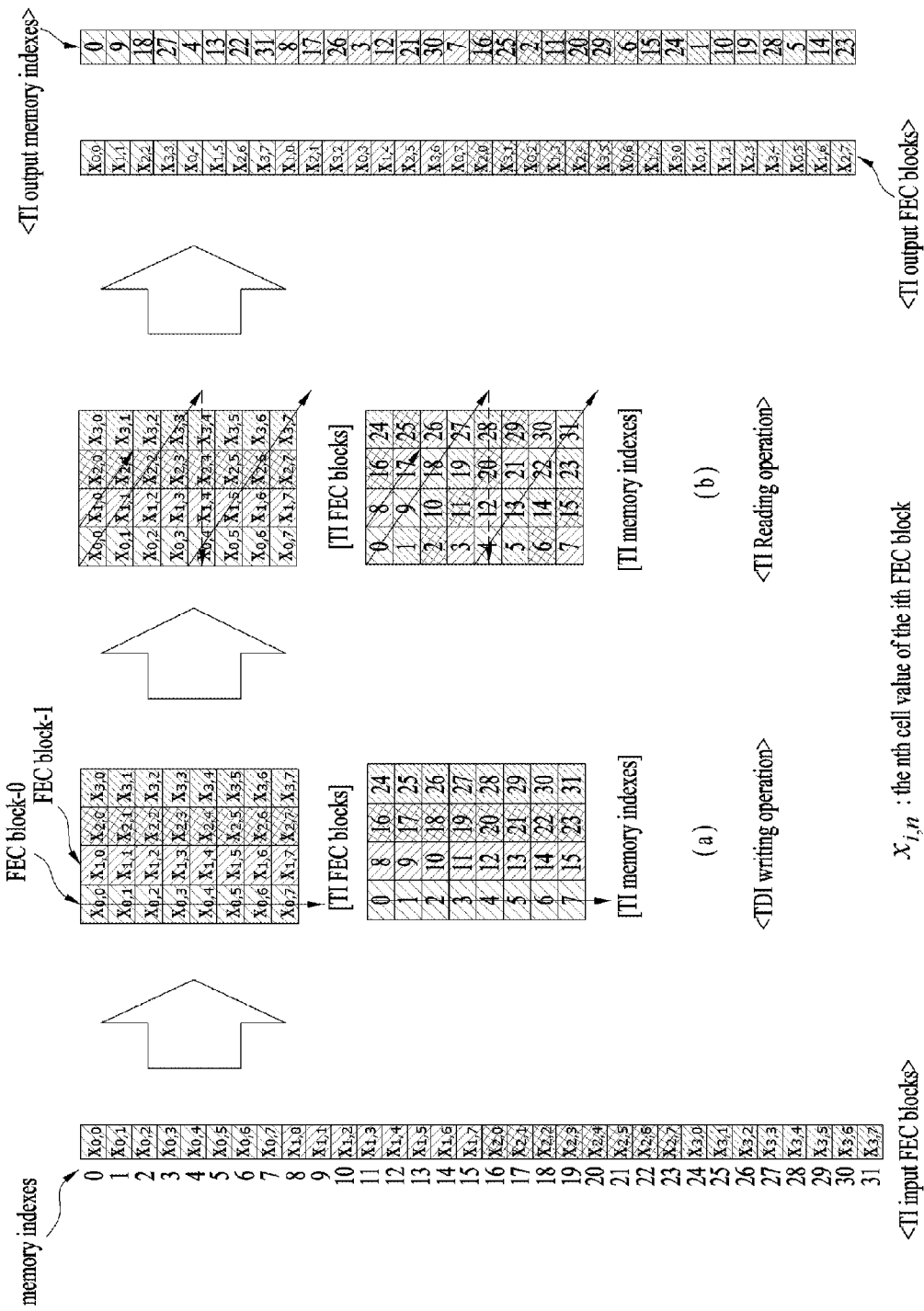
FIG. 18 illustrates a time interleaving process according to another embodiment of the present invention.

FIG. 18 illustrates a time interleaving process according to another embodiment of the present invention.

FIG. 18 shows another embodiment of the aforementioned writing operation and reading operation of the diagonal-type TI.

One TI block according to an embodiment of the present invention includes 4 FEC blocks each of which may be composed of 8 cells. Accordingly, the TI memory has a size corresponding to an 8×4 (or 32×1) matrix and the column length and row length of the TI memory respectively correspond to the FEC block length (or time interleaving depth) and the number of FECs.

TI input FEC blocks shown in the left part of FIG. 18 are FEC blocks sequentially input to the time interleaver.

TI FEC blocks shown in the middle of FIG. 18 show n-th cell values of an i-th FEC block stored in the TI memory and TI memory indexes indicate the order of cells of FEC blocks stored in the TI memory.

FIG. 18($a$) illustrates TI writing operation. As described above, sequentially input FEC blocks can be sequentially written column-wise into the TI memory. Accordingly, cells of the FEC blocks are sequentially stored and written with TI memory indexes.

FIG. 18($b$) illustrates TI reading operation. As shown in FIG. 18($b$), cell values stored in the TI memory can be diagonally read and output in the order of memory indexes 0, 9, 18, 27, . . . . Moreover a position of cell to start diagonal-wise reading or diagonal-wise reading pattern may be changed according to designer.

TI output FEC blocks shown in the right part of FIG. 18 sequentially indicate cell values output through diagonal-type TI according to an embodiment of the present invention. TI output memory indexes correspond to the cell values output through diagonal-type TI.

Consequently, the time interleaver according to an embodiment of the present invention can perform diagonal-type TI by sequentially generating TI output memory indexes for sequentially input FEC blocks.

FIG. 18 illustrates an operation of a time interleaver of the diagonal slope-1 of the TI reading described with reference to FIG. 17. The aforementioned operation can also be applied in the same way to the slops of the remaining TI readings shown in FIG. 17.

Figure 19:
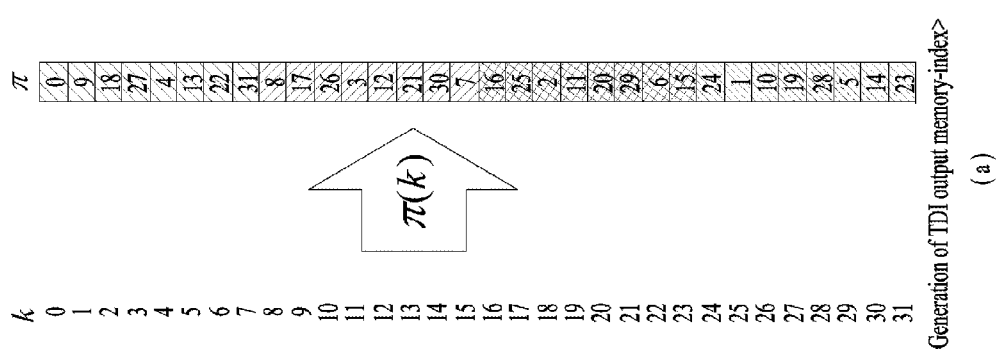
FIG. 19 illustrates a process of generating TI output memory indexes according to an embodiment of the present invention.

FIG. 19 illustrates a process of generating TI output memory indexes according to an embodiment of the present invention.

As described above, the time interleaver according to an embodiment of the present invention can perform diagonal-type TI by sequentially generating TI output memory index values for sequentially input FEC blocks.

FIG. 19(*a*) illustrates a process of generating diagonal-type TI memory indexes for the above-described sequentially input FEC blocks and FIG. 19(*b*) shows equations representing the memory index generation process.

Equation 1 below represents a process for generation of a memory index for the diagonal-type TI when the slope values of the various TI readings described with reference to FIG. 17 are set.

$$r_k = \mod(k, N_r),$$ [Equation 1]

$$t_k = \mod(S_T \times r_k, N_c), 1 \leq S_T < N_c$$

$$c_k = \mod\left(t_k + \left\lfloor \frac{k}{N_r} \right\rfloor, N_c\right)$$

$$\pi(k) = N_r c_k + r_k, \text{ for } 0 \leq k \leq N - 1$$

$S_T$: diagonal slope for use in interleaving (constant value)

$N_r$: row size $N_c$: column size $N$: total cell size in $TI$ block, $N = N_c N_r$ $\lfloor \cdot \rfloor$: floor operation mod: modulo operation $\pi(k)$: $TI$ output memory index A time deinterleaver (or time deinterleaver block) included in a broadcast signal receiver according to an embodiment of the present invention can perform inverse processing of the aforementioned diagonal-type TI. That is, the time deinterleaver according to an embodiment of the present invention can perform time deinterleaving by receiving FEC blocks on which diagonal-type TI has been performed, writing the FEC blocks diagonal-wise in a TI memory and then sequentially reading the FEC blocks. Time deinterleaving according to an embodiment of the present invention may be referred to as diagonal-type TDI or diagonal-type time deinterleaving or flexible diagonal-type time deinterleaving or flexible diagonal-type TDI. The name of a device performing time deinterleaving or the location or function of the device may be changed according to designer.

Figure 20:
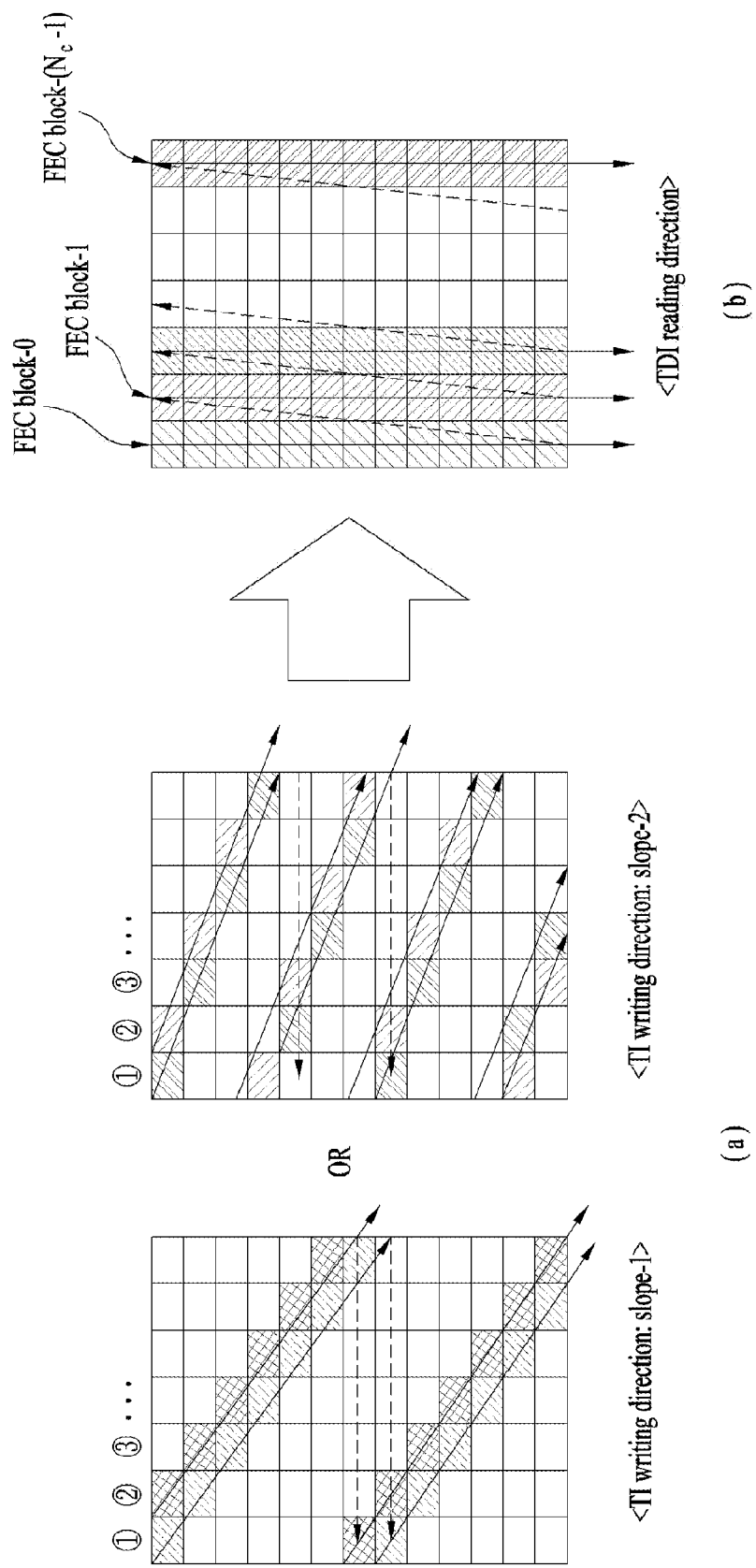
FIG. 20 illustrates a time deinterleaving process according to an embodiment of the present invention.

FIG. 20 illustrates a time deinterleaving process according to an embodiment of the present invention.

The time deinterleaving process shown in FIG. 20 corresponds to inverse processing of the time interleaving process shown in FIG. 16.

FIG. 20(*a*) shows a writing direction of time deinterleaving according to an embodiment of the present invention and FIG. 20(*b*) shows a reading direction of time deinterleaving according to an embodiment of the present invention.

Specifically, the time deinterleaver according to an embodiment of the present invention can receive FEC blocks on which diagonal-type TI has been performed from a transmitter and diagonally write the FEC blocks into a TDI (time deinterleaver) memory (diagonal-wise writing).

In this case, the time deinterleaver according to an embodiment of the present invention can perform diagonal writing for one period. In particular, in this case, as shown in FIG. 20(*a*), diagonal slope values of a TDI writing direction may be differently set for respective TDI block and super frame unit. FIG. 20 illustrates the case in which the diagonal slope of the TDI writing direction is a diagonal slope-1 or a diagonal slope-2.

When the diagonal slope of the TDI writing direction is a diagonal slope-1, diagonal reading of the first period starts at (0,0) of the memory matrix and is performed until the cell of the lowest row is read. Diagonal writing of respective periods can be performed in order of a ①, ② and ③ in FIG. 20(*b*).

In addition, when the diagonal slope of the TDI writing direction is a diagonal slope-2, the TDI diagonal writing can be performed from a memory matrix (0,0) for a first period until cells contained in a specific FEC block are read according to a specific shifting value. This can be changed according to intention of the designer.

As shown in FIG. 20(*b*), the time deinterleaver according to an embodiment of the present invention can sequentially read diagonally written FEC blocks column-wise (column-wise reading).

Figure 21:
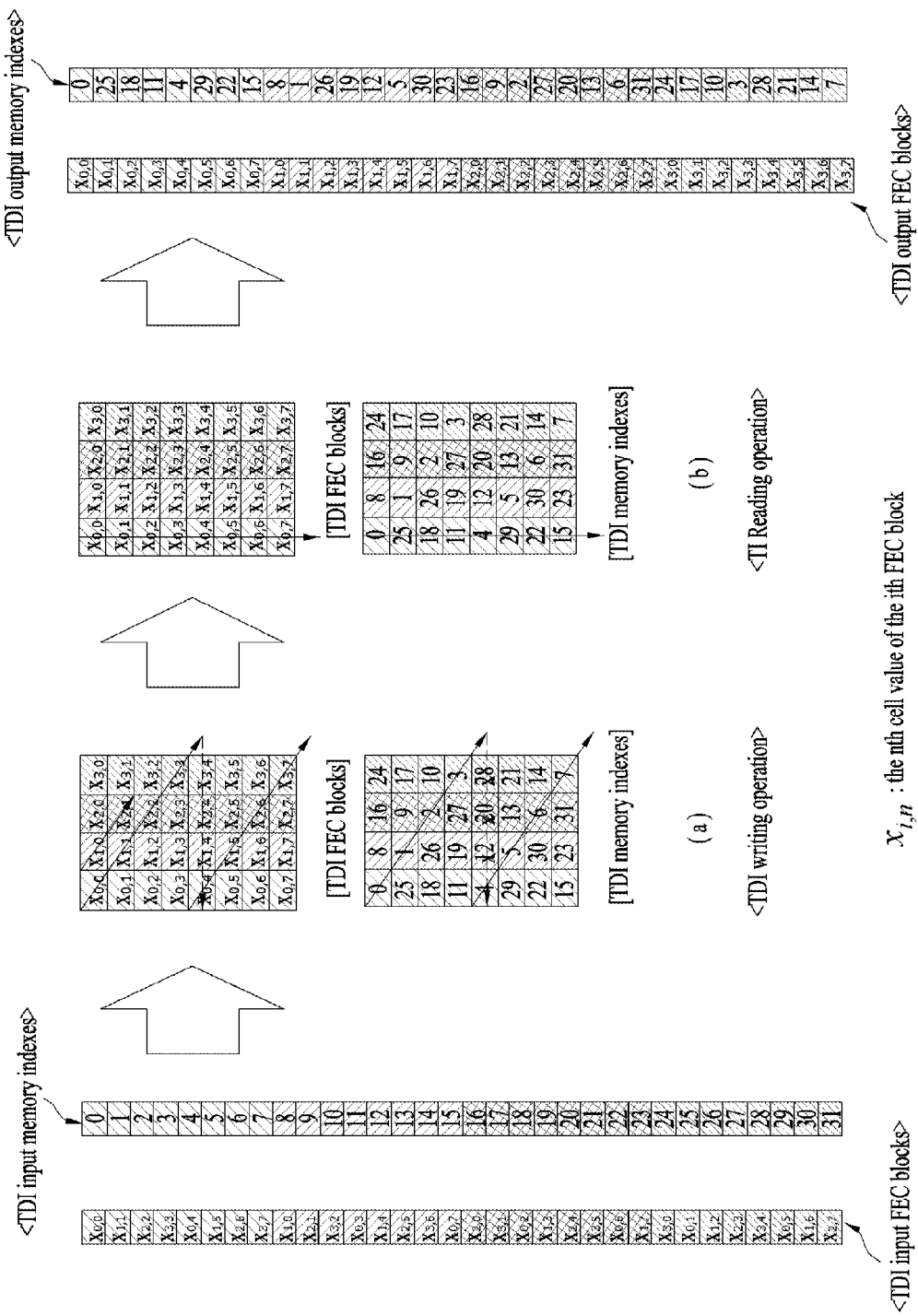
FIG. 21 illustrates a time deinterleaving process according to another embodiment of the present invention.

FIG. 21 illustrates a time deinterleaving process according to another embodiment of the present invention.

The time deinterleaving process shown in FIG. 21 is the inverse of the time interleaving process shown in FIG. 18.

One TI block according to an embodiment of the present invention includes 4 FEC blocks each of which may be composed of 8 cells. Accordingly, the TI memory has a size corresponding to an 8×4 (or 32×1) matrix and the column length and row length of the TI memory respectively correspond to the FEC block length (or time interleaving depth) and the number of FECs.

TDI input FEC blocks shown in the left part of FIG. 21 represent cells of FEC blocks sequentially input to the time deinterleaver and TDI input memory indexes correspond to the cells of the sequentially input FEC blocks.

TDI FEC blocks shown in the middle of FIG. 21 show n-th cell values of an i-th FEC block stored in the TDI memory and TDI memory indexes indicate the order of cells of FEC blocks stored in the TDI memory.

FIG. 21(*a*) illustrates TDI writing operation. As described above, sequentially input FEC blocks can be sequentially written to the TDI memory diagonal-wise. Accordingly, the cells of the input FEC blocks are sequentially stored and written with TDI memory indexes.

FIG. 21(b) illustrates TDI reading operation. As shown in FIG. 20(b), cell values stored in the TDI memory can be column-wise read and output in the order of memory indexes 0, 1, 2, 3, . . . .

TDI output FEC blocks shown in the right part of FIG. 21 sequentially indicate cell values output through time deinterleaving according to an embodiment of the present invention. TDI output memory indexes correspond to the cell values output through time deinterleaving according to an embodiment of the present invention.

Consequently, the time deinterleaver according to an embodiment of the present invention can perform diagonal-type TDI by sequentially generating TDI output memory index values for sequentially input FEC blocks.

FIG. 21 illustrates an operation of a time deinterleaver corresponding to the diagonal slope-1 described with reference to FIG. 17. The aforementioned time interleaving operation can also be applied to the remaining diagonal slopes shown in FIG. 17.

Figure 22:
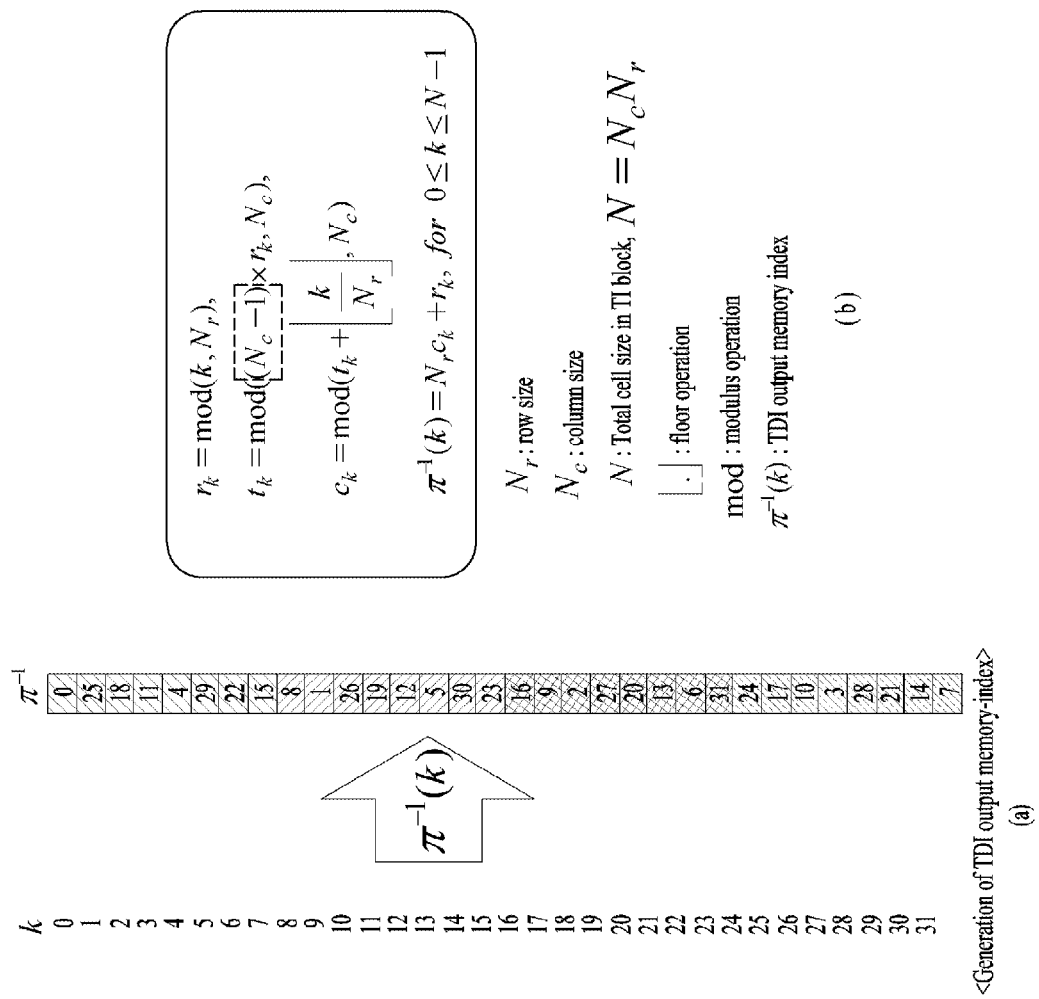
FIG. 22 illustrates a process of generating TDI output memory indexes according to an embodiment of the present invention.

FIG. 22 illustrates a process of generating TDI output memory indexes according to an embodiment of the present invention.

As described above, the time deinterleaver according to an embodiment of the present invention can perform diagonal-type TDI by sequentially generating TDI output memory index values for sequentially input FEC blocks.

FIG. 22(a) illustrates a process of generating diagonal-type TDI memory indexes for the above-described sequentially input FEC blocks and FIG. 22(b) shows equations representing the memory index generation process.

Equation 2 below represents a process for generation of a TDI output memory index for the diagonal-type TDI when diagonal slope values of the various TI readings described with reference to FIG. 17 are set.

$$S_R = N_c - S_T, \ 1 \le S_k < N_c \quad \text{[Equation 2]}$$

$$r_k = \mod(k, N_r),$$

$$t_k = \mod(S_R \times r_k, N_c),$$

$$c_k = \mod\left(t_k + \left\lfloor \frac{k}{N_r} \right\rfloor, N_c\right)$$

$$\pi^{-1}(k) = N_r c_k + r_k, \text{ for } 0 \le k \le N-1$$

$S_T$: diagonal slope for use in interleaving (constant value)

$S_R$: diagonal slope for use in deinterleaving (constant value)

$N_r$: row size $N_c$: column size $N$: total cell size in *TI* block, $N = N_c N_r$ $\lfloor \cdot \rfloor$: floor operation mod: module operation $\pi^{-1}(k)$: *TDI outputmemory* Index The broadcast signal transmitter according to an embodiment of the present invention may be a variable data-rate system in which a plurality of FEC blocks is packed and configured as a plurality of TI blocks and transmitted. In this case, TI blocks may have different numbers of FEC blocks included therein.

Figure 23:
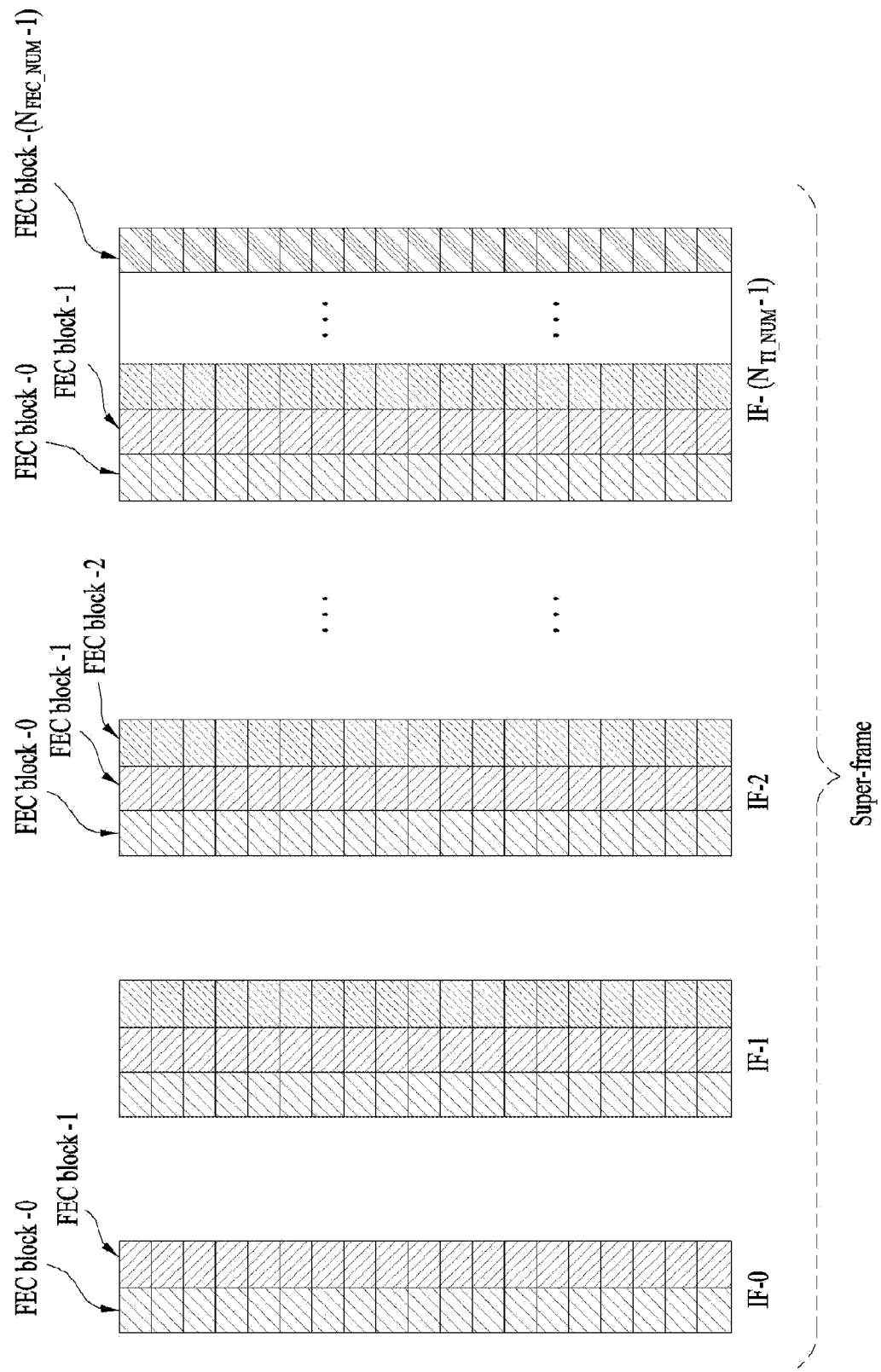
FIG. 23 is a conceptual diagram illustrating a variable data-rate system according to an embodiment of the present invention.

FIG. 23 is a conceptual diagram illustrating a variable data-rate system according to an embodiment of the present invention.

One transmission superframe may include $N_{IF\_NUM}$ interleaving frames (IFs) and each IF may include $N_{FEC\_NUM}$ FEC blocks. In this case, the number of FEC blocks included in each IF may be varied. An IF according to an embodiment of the present invention may be defined as a block for timing interleaving and may be referred to as the aforementioned TI block.

As described above, the variable data-rate system as a broadcast signal transmitter according to an embodiment of the present invention can pack a plurality of FEC blocks as a plurality of IFs and transmit the IFs. In this case, the IFs may have different numbers of FEC blocks included therein.

A description will be given of time interleaving which can be performed in the aforementioned variable data-rate system. This time interleaving process is another embodiment of the above-described time interleaving process and has the advantage that the time interleaving process is applicable to a case in which the broadcast signal receiver has a single memory. Time interleaving according to another embodiment of the present invention may be referred to as the aforementioned diagonal-type TI and may be performed in the time interleaver included in the broadcast signal transmitter according to an embodiment of the present invention. As the inverse process of time interleaving, time deinterleaving may be referred to as diagonal-type TDI and may be performed in the time deinterleaver in the broadcast signal receiver according to an embodiment of the present invention. The name of a device which performs time interleaving or time deinterleaving or the location or function of the device may be changed according to designer. A description will be given of detailed time interleaving and time deinterleaving operations.

When IFs have different numbers of FEC blocks included therein, as described above, different diagonal-type TI methods need to be applied to the respective IFs. However, this scheme has a problem that deinterleaving corresponding to the different diagonal-type TI methods cannot be performed when the broadcast signal receiver uses a single memory.

Accordingly, the broadcast signal transmitter according to the present invention determines a single diagonal-type TI method and equally applies the determined diagonal-type TI method to all IFs according to an embodiment of the present invention. In addition, the broadcast signal transmitter according to an embodiment of the present invention can sequentially deinterleave a plurality of IFs using a single memory.

In this case, the broadcast signal transmitter according to an embodiment of the present invention can determine the diagonal-type TI method applied to all IFs on the basis of a IF including a maximum number of FEC blocks within one signal frame.

Moreover, the broadcast signal transmitter according to an embodiment of the present invention can determine the diagonal-type TI method applied to all IFs on the basis of a IF including a medium number of FEC blocks within one signal frame or an arbitrary IF within one signal frame. It can be determined according to designer.

Here, how the diagonal-type TI method is applied to a IF including a smaller number of FEC blocks, compared to the IF including the maximum number of FEC blocks, may become a problem.

Accordingly, the broadcast signal transmitter may monitor generated memory indexes and determine whether to apply the memory indexes according to an embodiment of the present invention.

Specifically, when the number of generated TI memory indexes exceeds the number of cells in an arbitrary IF, the broadcast signal transmitter virtual FEC blocks can be added (zero padding) and diagonal-type TI can be performed. Since the added virtual FEC blocks include cells having zero value, the broadcast signal transmitter according to the present invention may skip or ignore the added virtual FEC blocks. This operation may be referred to as skip operation. The skip operation will be described in detail later.

Furthermore, in application of the aforementioned diagonal-type TI method to different IFs, the broadcast signal transmitter may sequentially apply the diagonal-type TI method to IFs from a TI block including a small number of FEC blocks in order of the number of FEC blocks according to an embodiment of the present invention.

Accordingly, the broadcast signal receiver according to an embodiment of the present invention can simply operate the single memory, which will be described in detail later.

The following equations represent the aforementioned process of determining a diagonal-type TI method applied to all IFs.

$$\text{for } 0 \leq j \leq N_{IF\_NUM} - 1 \quad \text{[Equation 3]}$$

$$N_r = \max(N_{FEC\_Size,0}, N_{FEC\_Size,0} \ldots, N_{FEC\_Size,N_{IF\_NUM}-1})$$

$$= \max_j(N_{FEC\_Size,j})$$

$$N_c = \max(N_{FEC\_NUM,0}, N_{FEC\_NUM,0} \ldots, N_{FEC\_NUM,N_{IF\_NUM}-1})$$

$$= \max_j(N_{FEC\_NUM,j})$$

$N_{IF\_NUM}$: Total number of IFs in a single super-frame $N_{FEC\_NUM,j}$: Total number of FEC blocks in the jth IF $N_{FEC\_Size,j}$: FEC block size in the jth IF, FIG. 24 illustrates a time interleaving process according to another embodiment of the present invention.

Figure 24:
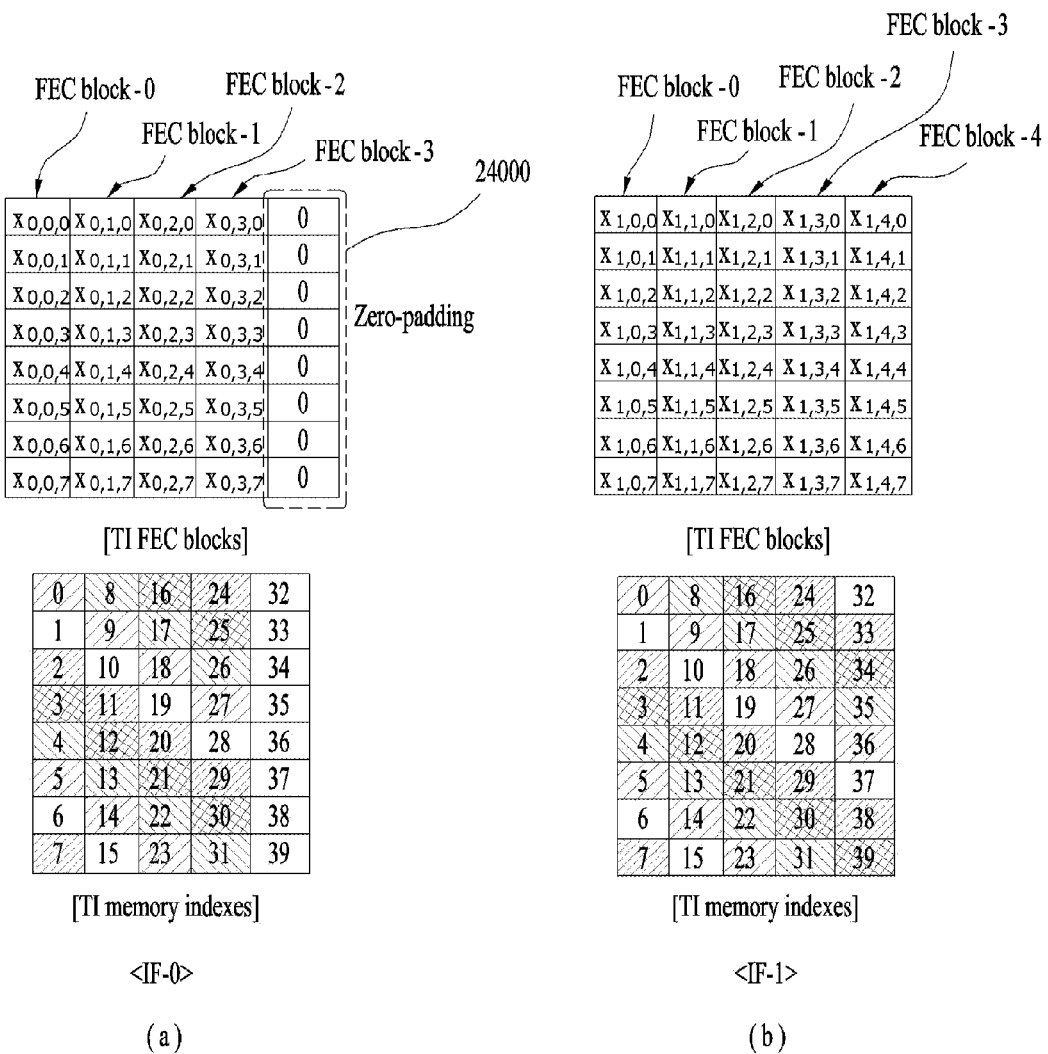
FIG. 24 illustrates a time interleaving process according to another embodiment of the present invention.

FIG. 24 shows an embodiment of applying diagonal-type TI in a variable data-rate system.

FIG. 24(a) illustrates a process of applying diagonal-type TI to IF-0 including 4 FEC blocks and FIG. 24(b) illustrates a process of applying diagonal-type TI to IF-1 including 5 FEC blocks.

TI FEC blocks represent FEC blocks included in each IF and cell values corresponding to the FEC blocks. TI memory indexes indicate memory indexes corresponding to cell values included in IFs.

The IFs are included in one super frame and each FEC block may include 8 cells.

The broadcast signal transmitter according to an embodiment of the present invention can determine a diagonal-type TI method which is equally applied to two IFs. Since the diagonal-type TI method according to an embodiment of the present invention is determined on the basis of a IF including a maximum number of FEC blocks within one frame, as described above, diagonal-type TI is determined based on IF-1 in the case of FIG. 24. Accordingly, the TI memory can have a size corresponding to an 8×5 (40×1) matrix.

As shown in the upper part of FIG. 24(a), the number of FEC blocks included in IF-0 is 4 which is less than the number of FEC blocks included in IF-1. Accordingly, the broadcast signal transmitter according to an embodiment of the present invention can add (pad) a virtual FEC block 23000 having a value of 0 to IF-0 and column-wise write cells corresponding to the virtual FEC block 23000 into the TI memory. The position to which the virtual FEC block is added can be determined according to designer. Therefore, time deinterleaving corresponding to the diagonal-type TI method can be applied to a case in which the broadcast signal receiver uses a single memory.

As shown in the low part of FIG. 24(a), the broadcast signal transmitter according to an embodiment of the present invention can diagonally read cells written in the TI memory. In this case, since the last column corresponds to the virtual FEC block, it is possible to perform reading operation while ignoring the cells corresponding to the virtual FEC block.

The broadcast signal transmitter according to an embodiment of the present invention can perform column-wise writing and diagonal reading for IF-1 according to the aforementioned method, as shown in FIG. 24(b).

As described above, since diagonal-type TI according to an embodiment of the present invention is preferentially applied to a IF including a smaller number of FEC blocks, diagonal-type TI can be applied to IF-1 first in the case of FIG. 24.

FIG. 25 illustrates a process of generating TI output memory indexes according to another embodiment of the present invention.

FIG. 25 shows a process of generating TI output memory indexes for the above-described two IFs (IF-0 and IF-1) and TI output FEC blocks corresponding to TI output memory indexes.

Blocks corresponding to TI output memory indexes represent a process of generating TI output memory indexes and TI output FEC blocks represent cell values of FEC blocks corresponding to the generated TI output memory indexes.

FIG. 25(a) illustrates a process of generating TI output memory indexes of IF-0. As shown in the upper part of FIG. 25(a), when the number of TI memory indexes exceeds the number of cells of IF-0, the broadcast signal transmitter according to an embodiment of the present invention can ignore TI memory indexes 32 to 39 corresponding to cells included in a virtual FEC block (skip operation). Consequently, final output memory indexes for which reading can be performed, except for the skipped TI memory indexes, are generated as shown in FIG. 25(a). Cell values of output FEC blocks corresponding to the final output memory indexes are shown in the lower part of FIG. 25(a).

FIG. 25(b) illustrates a process of generating TI output memory indexes of IF-1. In the case of IF-1, skip operation is not applied. The process corresponds to the aforementioned process.

The following equations represent the output memory index generation process for performing diagonal-type TI applicable in the aforementioned variable data-rate system.

$$\text{for } 0 \leq j \leq N_{IF\_NUM} - 1, 0 \leq k \leq N_r N_c - 1 \quad \text{[Equation 4]}$$

$$C_{cnt,j} = 0$$

$$r_{j,k} = \mod(k, N_r),$$

$$t_{j,k} = \mod(S_T \times r_{j,k}, N_c), 1 \leq S_T < N_c$$

$$c_{j,k} = \mod\left(t_{j,k} + \left\lfloor \frac{k}{N_r} \right\rfloor, N_c\right)$$

-continued $$\theta_j(k) = N_r c_{j,k} + r_{jk}$$

if $\theta_j(k) \leq N_{FEC\_Size,j} N_{FEC\_NUM,j}$ $$\pi_j(C_{cnt,j}) = \theta_j(k)$$

$$C_{cnt,j} = C_{cnt,j} + 1$$

end end $S_T$: diagonal slope for
 use in interleaving (constant value)

$C_{cnt,j}$: counter of actual TI output
 memory-index for the $j$th TI block $\theta_j(k)$: temporal TI output memory-
 index for the $j$th TI block $\pi_j(k)$: actual TI output memory-index for the $j$th TI block In Equation 4, the "if" statement represents the aforementioned skip operation. In addition, Equation 4 above represents a process for generation of an output memory index for the aforementioned diagonal type TI of the diagonal slope. Accordingly, a diagonal slope value is defined as one variable.

Figure 26:
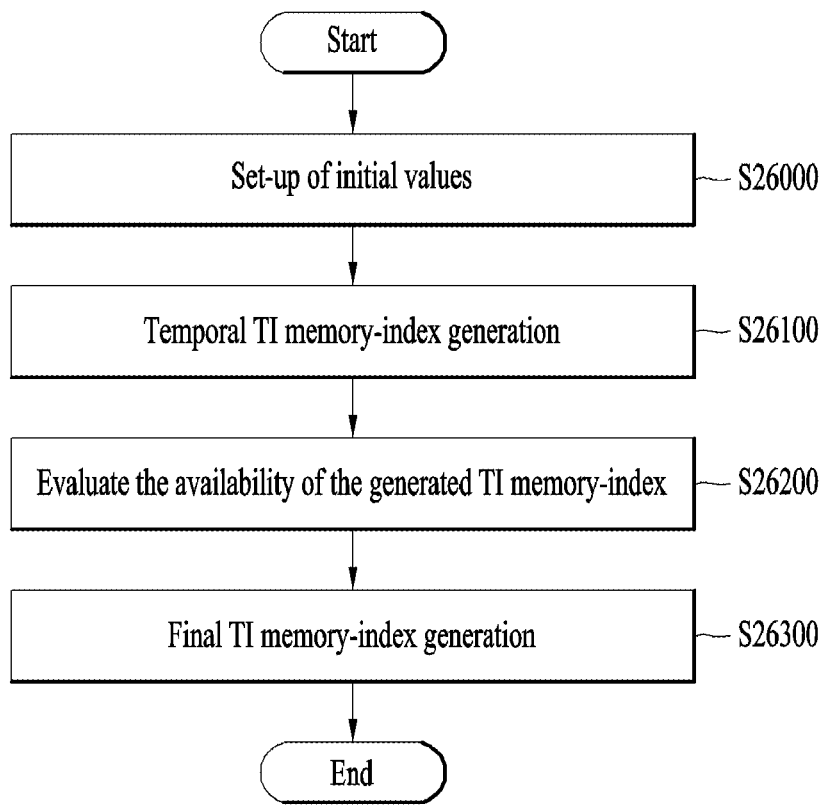
FIG. 26 is a flowchart illustrating a TI memory index generation process according to an embodiment of the present invention.

FIG. 26 is a flowchart illustrating a TI memory index generation process according to an embodiment of the present invention.

As described above, the time interleaver according to an embodiment of the present invention can perform diagonal-type TI by sequentially generating TI output memory indexes for sequentially input FEC blocks.

Referring to FIG. 26, the broadcast signal transmitter according to an embodiment of the present invention may set initial values (S26000). That is, the broadcast signal transmitter according to an embodiment of the present invention can determine a diagonal-type TI method applied to all IFs on the basis of a IF including a maximum number of FEC blocks.

Then, the broadcast signal transmitter according to an embodiment of the present invention may generate temporal TI memory indexes (S26100). That is, the broadcast signal transmitter according to an embodiment of the present invention can add (pad) a virtual FEC block to IFs having numbers of FEC blocks less than a predetermined TI memory index and write cells corresponding to IFs into a TI memory.

The broadcast signal transmitter according to an embodiment of the present invention may evaluate availability of the generated TI memory indexes (S26200). That is, the broadcast signal transmitter according to an embodiment of the present invention can diagonally read the cells written in the TI memory. In this case, cells corresponding to the virtual FEC block can be skipped and reading can be performed.

Then, broadcast signal transmitter according to an embodiment of the present invention may generate final TI memory indexes (S26300).

The flowchart of FIG. 26 corresponds to the process of generating TI output memory indexes, described with reference to FIGS. 23, 24 and 25, and may be modified according to designer.

Figure 27:
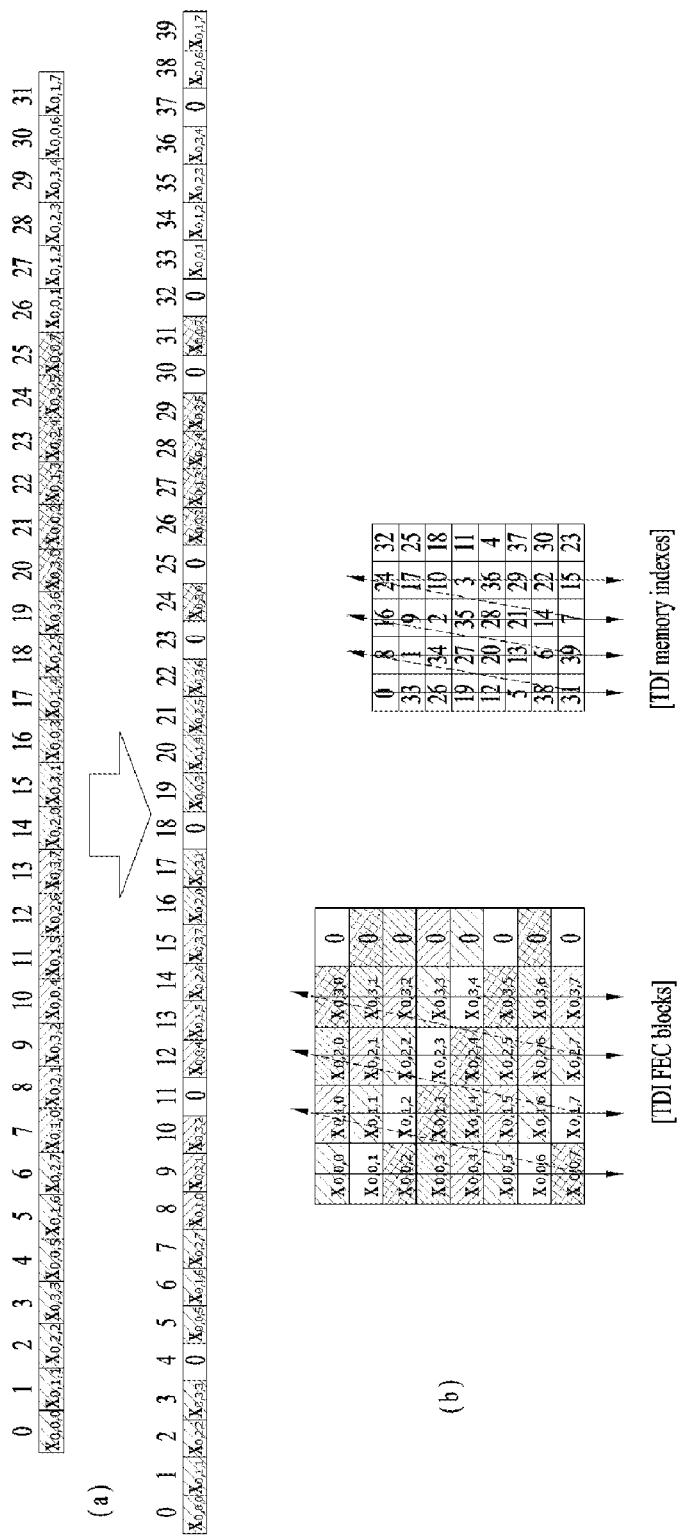
FIG. 27 illustrates a time deinterleaving process according to another embodiment of the present invention.

FIG. 27 illustrates a time deinterleaving process according to another embodiment of the present invention.

The time deinterleaving process shown in FIG. 27 is the inverse of the time interleaving process described with reference to FIGS. 24, 25 and 26.

Particularly, time deinterleaving according to another embodiment of the present invention can be applied to a case in which the broadcast signal receiver uses a single memory.

To achieve such a single-memory approach, the reading and writing operations for the interleaved IFs should be accomplished simultaneously. The TDI procedure can be expressed as a closed-form, which leads to the efficient TDI implementation.

Time deinterleaving according to another embodiment of the present invention may be performed through four steps.

FIG. 27(a) illustrates the first step (step 1) of time deinterleaving. Before TDI processing for IF-0, using TI rule, the cell value corresponding to a memory index ignored during TI processing is set to zero (or an identification value). That is, the blocks shown in the upper part of FIG. 27(a) represent cell values of output FEC blocks corresponding to final output memory indexes of IF-0 and the blocks shown in the lower part of FIG. 27(a) represent cell values of FEC blocks, which are generated by setting cell values corresponding to memory indexes skipped in skip operation to zero.

In the second step (step 2), after step 1, output of step 1 is written to the single-memory of size 8×5. The writing direction is identical to the reading direction in TI processing. The broadcast signal receiver according to an embodiment of the present invention can perform diagonal writing operation as the first inverse process of TI of the transmitter for the first input IF. That is, diagonal writing can be performed in a direction opposite to the direction of diagonal reading performed by the transmitter.

FIG. 27(b) illustrates the third step (step 3) of time deinterleaving.

Blocks corresponding to TDI FEC blocks represent cell values of input FEC blocks. Blocks corresponding to TDI memory indexes represent TDI memory indexes corresponding to cell values of FEC blocks.

After step 2, column-wise reading operation is performed in the same direction as the writing direction in TI processing. At this time, if the reading value is zero (or an identification value), it is ignored (skip operation). This skip operation corresponds to the aforementioned skip operation performed in the broadcast signal transmitter.

The following equations represent the aforementioned TDI memory index generation process.

[Equation 5]

for $0 \leq k \leq N_c N_r - 1$, $0 \leq j \leq$ IF_NUM $- 1$ $$C_{cnt,j} = 0$$

$$S_{R,j} = \mathrm{mod}(S_{R,j-1} - S_T, N_c),$$

where $$S_{R,0} = N_c - S_T,$$

$$r_{jk} = \mathrm{mod}(k, N_r),$$

$$t_{j,k} = \mathrm{mod}(S_{R,j} \times r_{j,k}, N_c),$$

$$c_{j,k} = \mathrm{mod}\left(t_{j,k} + \left\lfloor \frac{k}{N_r} \right\rfloor, N_c\right)$$

$$\theta_j^{-1}(k) = N_r c_{j,k} + r_{j,k},$$

if $M(\theta_j^{-1}(k)) \neq 0$(a value)

-continued $$\pi_j^{-1}(C_{cnt,j}) = \theta_j^{-1}(k)$$

$$C_{cnt,j} = C_{cnt,j} + 1$$

end end $C_{cnt,j}$: counter of actual $TD$ $I$ output memory-index for the $j$th $IF$ $\theta_j^{-1}(k)$: the reserved cell value at $\theta_j^{-1}(k)$ $M(\theta_j^{-1}(k))$: temporal $TDI$ output memory-index for the $j$th $IF$ $\pi_j^{-1}(k)$: actual $TDI$ output memory-index for the $j$th $IF$ The "if" statement in the above equation represents the aforementioned skip operation, that is, the process of ignoring indexes when the indexes corresponding cell values stored in the TDI output memory are 0 (or an arbitrary value indicating that the indexes are forcibly inserted). In addition, Equation 5 above represents a process of generation of a TDI memory index for time interleaving corresponding to the aforementioned diagonal type TI according to a diagonal slope.

Figure 28:
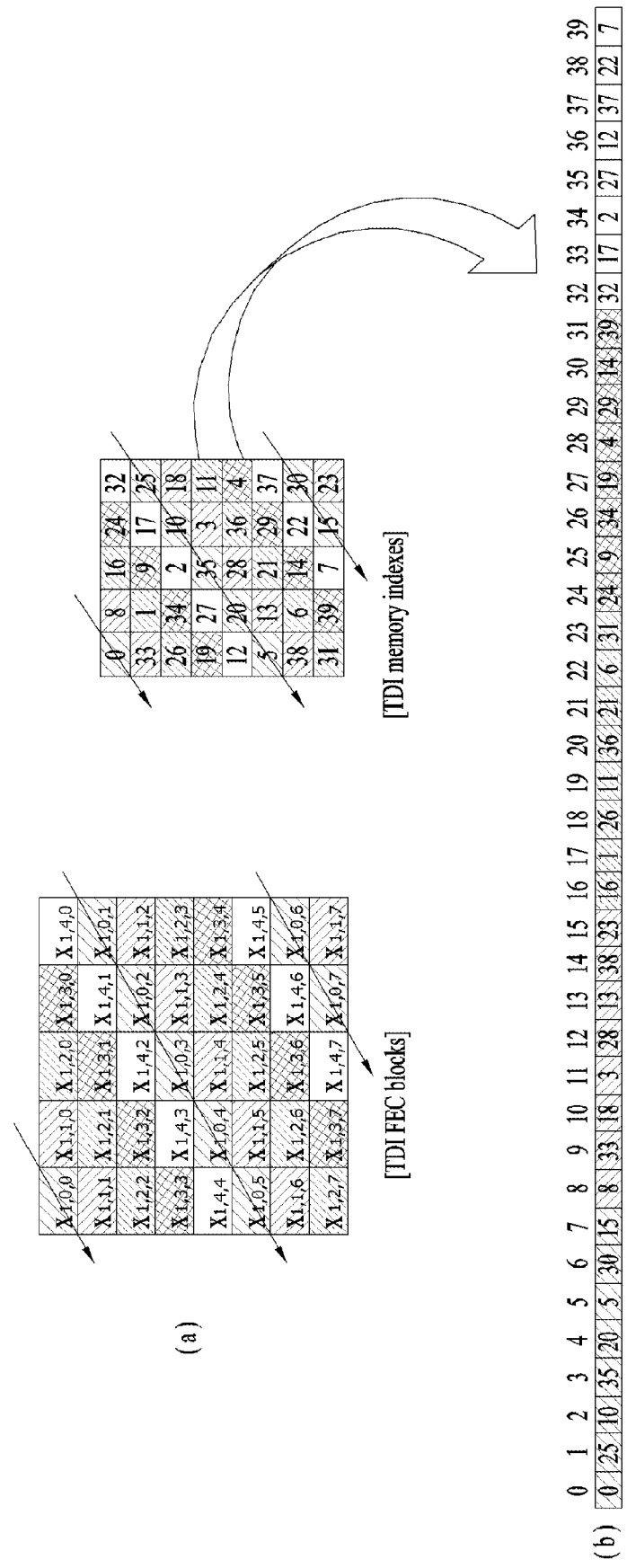
FIG. 28 illustrates a time deinterleaving process according to another embodiment of the present invention.

FIG. 28 illustrates a time deinterleaving process according to another embodiment of the present invention.

As described above, the broadcast signal receiver according to an embodiment of the present invention can perform time deinterleaving using a single memory. Accordingly, the broadcast signal receiver according to an embodiment of the present invention can read IF-0 and write IF-1 simultaneously in the fourth step (step 4).

FIG. 28(a) shows TDI FEC blocks of IF-1 written simultaneously with reading of IF-0 and TDI memory indexes. The writing operation can be performed in a direction opposite to the direction of diagonal reading performed in the broadcast signal receiver, as described above.

FIG. 28(b) shows output TDI memory indexes according to writing of IF-1. In this case, arrangement of the stored FEC blocks within IF-1 may differ from arrangement of the FEC blocks stored in the TI memory of the broadcast signal transmitter. That is, inverse processes of the writing and reading operations performed in the broadcast signal transmitter may not be equally applied in case of a single memory.

Figure 29:
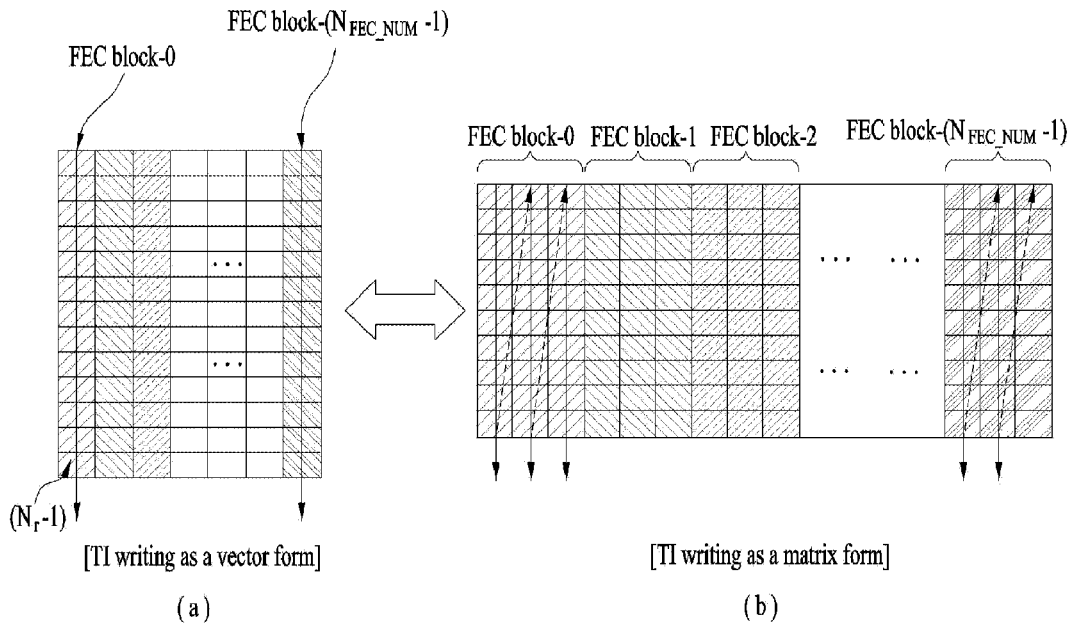
FIG. 29 illustrates a writing method according to an embodiment of the present invention.

FIG. 29 illustrates a writing method according to an embodiment of the present invention.

To prevent a case in which the inverse processes of the writing and reading operations performed in the broadcast signal transmitter cannot be equally applied in case of a single memory, as described above, the present invention provides a method of writing FEC blocks into a TI memory in a matrix form.

The writing method illustrated in FIG. 29 can be equally applied to the aforementioned time interleaving and time deinterleaving processes according to an embodiment of the present invention.

FIG. 29(a) illustrates a case in which cells of FEC blocks are written to the memory in a vector form, which corresponds to the aforementioned writing method.

FIG. 29(b) illustrates a case in which cells of FEC blocks are written to the memory in a matrix form. That is, the FEC blocks can be written in the form of an m×n matrix.

In this case, the matrix size can be changed according to designer and the inverse processes of the writing and reading processes performed in the broadcast signal transmitter can be equally applied to a case in which the broadcast signal receiver uses a single memory.

Figure 30:
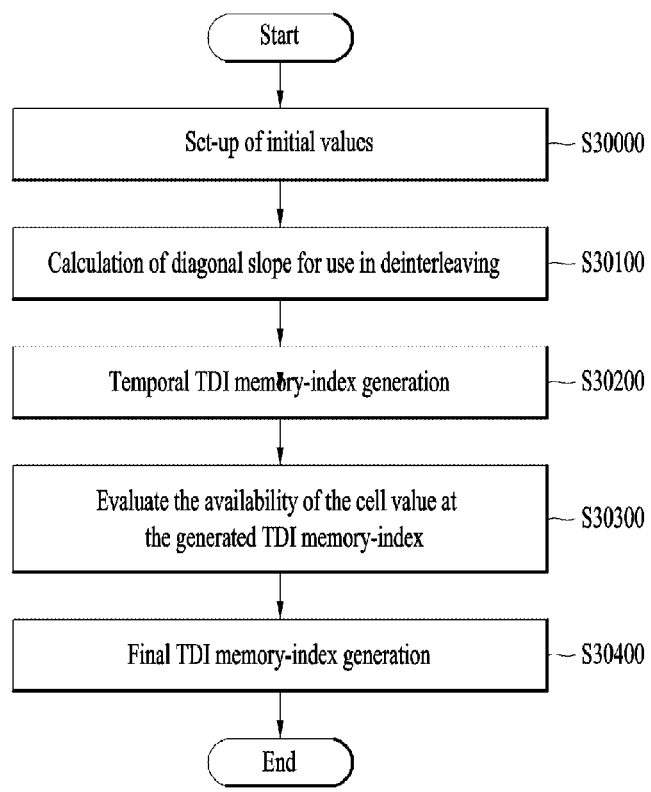
FIG. 30 is a flowchart illustrating a process of generating TDI memory indexes according to an embodiment of the present invention.

FIG. 30 is a flowchart illustrating a process of generating TDI memory indexes according to an embodiment of the present invention.

As described above, the time deinterleaver according to an embodiment of the present invention can perform diagonal-type TI by sequentially generating TI output memory indexes for sequentially input FEC blocks.

As shown in FIG. 30, the broadcast signal receiver according to an embodiment of the present invention may set initial values (S30000). That is, in the broadcast signal receiver according to an embodiment of the present invention, the cell value corresponding to a memory index ignored during TI processing is set to zero (or an identification value) using TI rue before TDI processing for the first IF.

Then the broadcast signal receiver according to an embodiment of the present invention may calculate a diagonal slope to be used for TDI processing (S30100).

Subsequently, the broadcast signal receiver according to an embodiment of the present invention may generate temporal TI memory indexes (S30200). The broadcast signal receiver according to an embodiment of the present invention may perform diagonal writing operation as the first inverse process of TI of the transmitter for the first input IF. Then, the broadcast signal transmitter according to an embodiment of the present invention may evaluate the generated TI memory indexes (S30300). The broadcast signal transmitter according to an embodiment of the present invention may generate final TI memory indexes (S30400).

The flowchart shown in FIG. 30 corresponds to the process of generating TDI output memory indexes, described with reference to FIGS. 27, 28 and 29, and may be changed according to designer.

Figure 31:
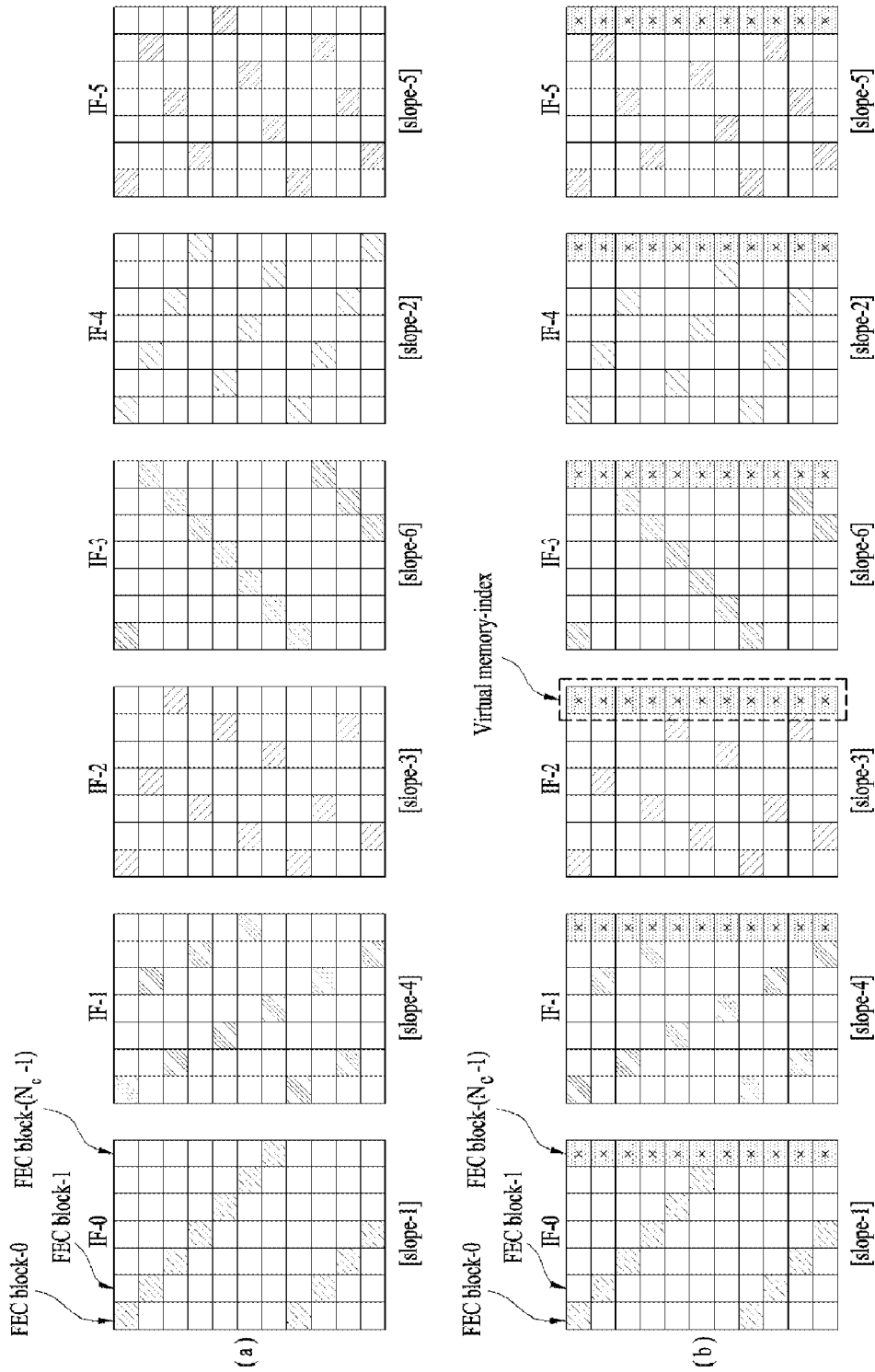
FIG. 31 illustrates IF-by-IF TI pattern variation according to an embodiment of the present invention.

FIG. 31 illustrates IF-by-IF TI pattern variation according to an embodiment of the present invention.

As described above, the broadcast signal transmitter (or a time interleaver) according to an embodiment of the present invention may differently apply a diagonal slope in superframe units or IF units.

FIG. 31 illustrates an embodiment in which diagonal slopes are differently applied to respective IFs and TI patterns are changed and, that is, an embodiment in which the diagonal slopes are differently applied to the respective IFs according to the cases in which the number of FEC blocks contained in an IF is an even number and an odd number. This is because, when the number of the FEC blocks is an even number, a diagonal slope for reducing an interleaving depth may be present.

FIG. 31 illustrates an embodiment in which the number of IFs included in one superframe is 6 and the length of an FEC block included in each IF, $N_r$, is 11 and, that is, an embodiment in which a diagonal slope is determined to be applied when the number of FEC blocks is 7.

FIG. 31(a) illustrates an embodiment in which the number of FEC blocks included in each IF is an odd number, that is, 7. In this case, the time interleaver according to an embodiment of the present invention may randomly select the diagonal slopes (in an order of diagonal slopes 1, 4, 3, 6, 2, and 5) and apply to 6 IFs so as not to repeat the diagonal slopes described with reference to FIG. 17. FIG. 31(b) illustrates an embodiment in which the number of FEC blocks included in each IF is an even number, that is, 6 and, that is, an embodiment in which the diagonal slope values described with reference to FIG. 17 is set to be applied to the case in which the number of FEC blocks is 7. In this case, the time interleaver according to an embodiment of the present invention may assume that each IF includes 7 FEC blocks and, that is, add the aforementioned virtual FEC block and apply a random diagonal slope to perform diagonal reading (in an order of diagonal slopes 1, 4, 3, 6, 2, and 5). In this case, as described above, cells of the virtual FEC may be disregarded via a skip operation.

The broadcast signal transmitter according to an embodiment of the present invention may select an IF having a largest number of FEC blocks in one superframe and determine Nc. A process for determination of $N_c$ is the same as in Equation 3 above.

Then the broadcast signal transmitter according to an embodiment of the present invention determines whether the determined $N_c$ is an even or odd number. When the determined $N_c$ is an even number, the broadcast signal transmitter may add the virtual FEC block as described above. Equation 6 below represents a process of achieving an odd number by adding the virtual FEC block when $N_c$ is an even number.

if $\mod(N_c,2)=0$ $N_c = N_c+1$ elseif $\mod(N_c,2)=1$ $N_c = N_c$  [Equation 6]

Then the broadcast signal transmitter according to an embodiment of the present invention may sequentially or randomly generate diagonal slopes using various methods. Equation 7 below represents a process of generation of a diagonal slope to be used in each IF using a quadratic polynomial (QP) scheme.

$$H_j = \left(\gamma + q \times \frac{(j+1)(j+2)}{2}\right) \mod N_{Div},$$  [Equation 7]

for $j = 0, \ldots, N_{IF\_NUM} - 1$ if $1 \le H_j < N_c - 1$ $S_{T,j} = H_j$ else $S_{T,j} = \mod(H_j, N_c - 1)$ end $N_{Div}$: division value of $QP$, $N_{Div} = 2^n$, where $\lceil \log_2(N_c/2) \rceil < n \le \lceil \log_2(N_c) \rceil$ $q$: a relative prime value to $N_{Div}$ $\gamma$: an offset value of a $QP$ $\lceil \cdot \rceil$: ceil operation The QP scheme may correspond to an embodiment of the present invention and may be replaced with a primitive polynomial (PP) scheme. This can be changed according to intention of the designer.

Equation 8 below represents a process of sequentially generating a diagonal slope.

$S_{T,j} = \mod(j, N_c-1)+1$, for $j=0, \ldots, N_{IF\_NUM}-1$  [Equation 8]

Then the broadcast signal transmitter according to an embodiment of the present invention may perform time interleaving in consideration of variables generated via the processes of Equations 6 to 8 above. In this case, a process of generation of a TI output memory output memory index of the broadcast signal transmitter according to an embodiment of the present invention may be represented according to Equation 4 above. Equation 4 above may include the diagonal slope generated according to Equations 7 and 8 above as a main variable. In addition, the skip operation described with reference to Equation 4 above can be applied irrespective of whether the length of $N_c$ is an even or odd number.

The broadcast signal receiver according to an embodiment of the present invention can perform time interleaving so as to correspond to the aforementioned broadcast signal transmitter. In this case, a process of generation of a TDI output memory index of the broadcast signal receiver according to an embodiment of the present invention can be represented according to Equation 5 above. Equation 5 above may include the diagonal slope generated via the generating processes represented according to Equations 7 to 8 as a main variable. In addition, the skip operation described with reference to Equation 5 above can be applied irrespective of whether the length of $N_c$ is an even or odd number.

As described above, the information associated with the TI pattern may be transmitted via the aforementioned static PLS signaling data. Information indicating whether the TI pattern is changed may be represented as TI_Var and may have a one bit size. When TI_Var has a value 0, this means that the TI pattern is not changed. Accordingly, the broadcast signal receiver according to an embodiment of the present invention may determine a variable $S_T$ as 1 that is a default value. When TI_Var has a value 1, this means that the TI pattern is changed. In this case, the broadcast signal receiver according to an embodiment of the present invention may determine the variable $S_T$ as $S_{T,j}$.

Hereinafter, a frequency interleaving process according to an embodiment of the present invention will be described.

The aforementioned block interleaver 6200 may interleave cells in a transmission block as a unit of a signal frame to obtain an additional diversity gain. The block interleaver 6200 according to an embodiment of the present invention may be referred to as a frequency interleaver. This can be changed according to intention of the designer. In addition, when the aforementioned pair-wise cell mapping is performed, the block interleaver 6200 may process two consecutive cells in input cells in one unit and perform interleaving. This may be referred to as pair-wise interleaving. Accordingly, the block interleaver 6200 may perform output in a unit of two consecutive cells. In this case, the block interleaver 6200 may operate in the same way or may independently operate with respect to two antenna paths.

The present proposes symbol by symbol frequency interleaving as another embodiment of frequency interleaving performed by the block interleaver 6200. According to the present invention, the symbol by symbol frequency interleaving may be referred to as interleaving or (single or pair-wise) quasi-random frequency interleaving. Unlike the aforementioned pair-wise interleaving, the frequency interleaving according to an embodiment of the present invention may set a seed (or mother interleaving seed) for applying different interleaving methods to each OFDM symbol. The mother interleaving seed is used to generate a different interleaving pattern applied to each OFDM symbol. In this case, interleaving patterns that are differently applied for respective OFDM symbols may be generated by cyclic-shifting a pattern of a mother interleaver. Also, the mother interleaving seed may be determined by using RPI (Relative Prime Interleaving) method. As such, enhanced frequency diversity may be obtained compared with pair-wise interleaving.

In order to embody the aforementioned frequency interleaving, an embodiment of the present invention provides a method of determining a mother interleaving seed using a randomly pair interleaving (RPI) scheme. In this case, in order to perform the aforementioned frequency interleaving, an initial-offset value of the mother RPI according to an embodiment of the present invention may be randomly determined. Also, the initial-offset value is generated through a quadratic polynomial (QP) or primitive polynomial (PP) method.

The frequency interleaving according to an embodiment of the present invention may preserve a periodic property toward frequency domain, while a random property toward time domain. Also, the frequency interleaving according to an embodiment of the present invention may provide a (pair-wise) deinterleaving using a single-memory at a receiver side.

The frequency interleaving according to an embodiment of the present invention may have the following features for the broadcast signal receiver having a single memory.

The mother interleaving according to an embodiment of the present invention is designed by exploiting RPI with an initial-offset value.

Equation 9 below represents RPI according to an embodiment of the present invention.

$$\pi_j(k) = (\omega(j) + pk) \bmod N_{Cell\_NUM}, \text{ for } k=0, \ldots, N_{Cell\_NUM}-1, j=0, \ldots, N_{Sym\_NUM}-1 \quad \text{[Equation 9]}$$

$N_{Cell\_NUM}$: the number of cells
$N_{Sym\_NUM}$: the number of OFDM symbols
p: a relative prime value to $N_{Cell\_NUM}$
$\omega(j)$: the initial-offset value for use in the $j^{th}$ RPI, which is generated by a random generator
mod: modulus operation
$\pi_j(k)$: interleaver output memory-index (RPI output value) to the $k^{th}$ input cell-index of the $j^{th}$ OFDM symbol The time interleaver according to an embodiment of the present invention may periodically interleave input OFDM cells using a relative prime value p for N_cell_NUM. The initial-offset value according to an embodiment of the present invention is randomly generated by exploiting a random generator. Also, the initial-offset value is generated through a quadratic polynomial (QP) or primitive polynomial (PP) method. In the PP method, the random generator may be any one of a primitive random binary sequence (PRBS) generator and a pseudo-random noise (PN) generator.

Figures 32, 33:
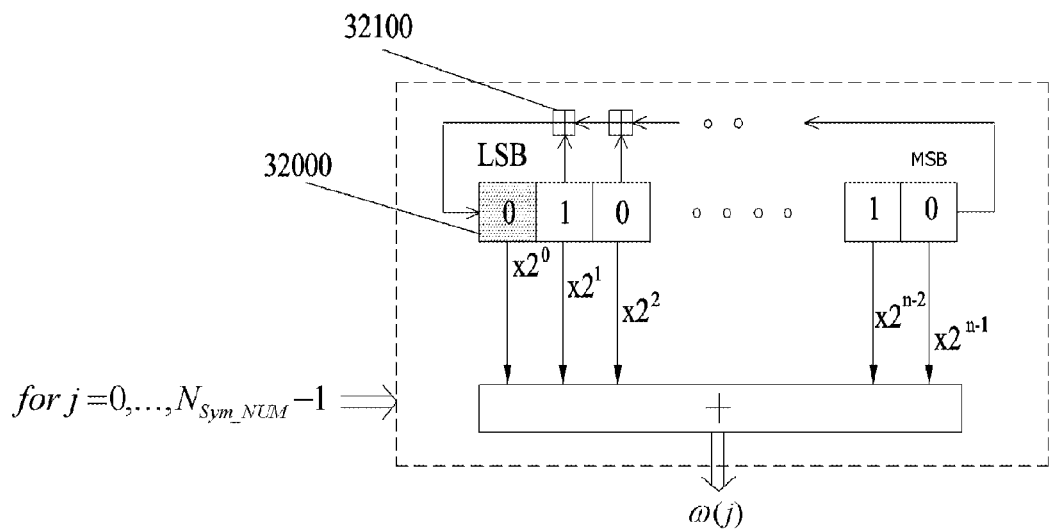
FIG. 32 illustrates a structure of a random generator according to an embodiment of the present invention.
FIG. 33 illustrates a random generator according to an embodiment of the present invention.

Equation 10 below represents a process of generation of an initial-offset value when the QP method is used. The initial-offset value of the RPI may be applied to each OFDM symbol cell.

$$\omega(j) = \left(\gamma + q \times \frac{j(j+1)}{2}\right) \bmod N_{Div}, \quad \text{[Equation 10]}$$

for $j = 0, \ldots, N_{Sym\_NUM} - 1$ $N_{Div}$: division value of QP or PP, $N_{Div} = 2^n$, where $\lfloor \log_2(N_{Cell\_NUM}/2) \rfloor < n \leq \lceil \log_2(N_{Cell\_NUM}) \rceil$ $q$: a relative prime value to $N_{Div}$ $\gamma$: an offset value $t$ of a QP $\lceil \cdot \rceil$: ceil operation FIG. 32 illustrates a structure of a random generator according to an embodiment of the present invention. FIG. 32 illustrates the case in which the random generator generates an initial-offset value using a PP method.

The random generator according to an embodiment of the present invention may include a register 32000 and an XOR operator 32100. In general, the PP method may randomly output values 1, . . . , 2n−1. Accordingly, the random generator according to an embodiment of the present invention may perform a register reset process in order to output $2^n$ symbol indexes including 0 and set a register initial value for a register shifting process.

The random generator according to an embodiment of the present invention may include different registers and XOR operators for respective primitive polynomials for the PP method.

Table 1 below shows primitive polynomials for the aforementioned PP method and a reset value and an initial value for the register reset process and the register shifting process.

TABLE 1

| Order (n) | Primitive polynomial | k = 0 (reset value) | k = 1 (initial value) |
|---|---|---|---|
| 9 | f(x) = 1 + $x^5$ + $x^9$ | [0 0 0 0 0 0 0 0 0] | [0 0 0 0 1 0 0 0 1] |
| 10 | f(x) = 1 + $x^7$ + $x^{10}$ | [0 0 0 0 0 0 0 0 0 0] | [0 0 0 0 0 0 1 0 0 1] |
| 11 | f(x) = 1 + $x^9$ + $x^{11}$ | [0 0 0 0 0 0 0 0 0 0 0] | [0 0 0 0 0 0 0 0 1 0 1] |
| 12 | f(x) = 1 + $x^6$ + $x^8$ + $x^{11}$ + $x^{12}$ | [0 0 0 0 0 0 0 0 0 0 0 0] | [0 0 0 0 0 1 0 1 0 0 1 1] |
| 13 | f(x) = 1 + $x^2$ + $x^4$ + $x^8$ + $x^9$ + $x^{12}$ + $x^{13}$ | [0 0 0 0 0 0 0 0 0 0 0 0 0] | [0 1 0 1 0 0 0 1 1 0 0 1 1] |
| 14 | f(x) = 1 + $x^2$ + $x^{12}$ + $x^{13}$ + $x^{14}$ | [0 0 0 0 0 0 0 0 0 0 0 0 0 0] | [0 0 1 0 0 0 0 0 0 0 1 1 1] |
| 15 | f(x) = 1 + $x^{14}$ + $x^{15}$ | [0 0 0 0 0 0 0 0 0 0 0 0 0 0 0] | [0 0 0 0 0 0 0 0 0 0 0 0 1 1] |

Table 1 above shows a register reset value and register initial value corresponding to an $n^{th}$ primitive polynomial (n=9, . . . , 15). As shown in Table 1 above, k=0 refers to a register reset value and k=1 refers to a register initial value. In addition, $2 \leq k \leq 2^n - 1$ refers to shifted register values.

FIG. 33 illustrates a random generator according to an embodiment of the present invention.

FIG. 33 illustrates a structure of the random generator when n of the nth primitive polynomial of Table 1 above is 9 to 12.

Figure 34:
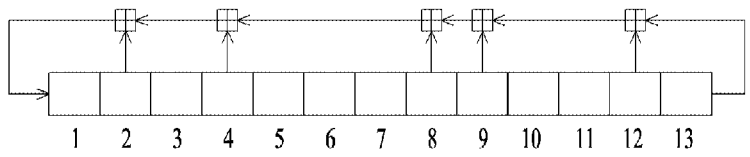
FIG. 34 illustrates a random generator according to another embodiment of the present invention.

FIG. 34 illustrates a random generator according to another embodiment of the present invention.

FIG. 34 illustrates a structure of the random generator when n of the nth primitive polynomial of Table 1 above is 13 to 15.

Figure 35:
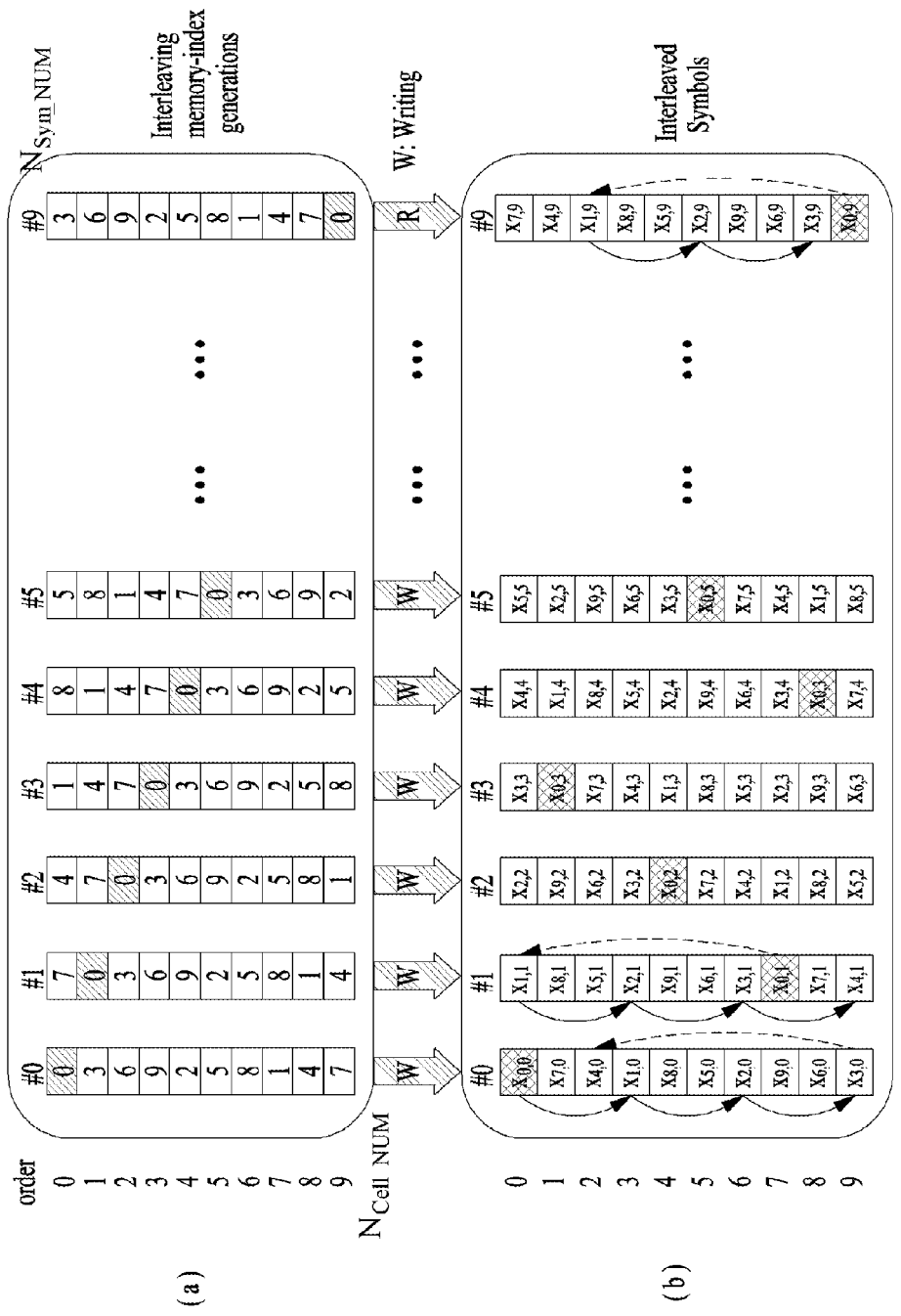
FIG. 35 illustrates a frequency interleaving process according to an embodiment of the present invention.

FIG. 35 illustrates a frequency interleaving process according to an embodiment of the present invention.

FIG. 35 illustrates a frequency interleaving process when a single memory is applied to a broadcast signal receiver, if the number of all symbols is 10, the number of cells included in one symbol is 10, and p is 3, according to an embodiment of the present invention.

FIG. 35($a$) illustrates output values of respective symbols, which is output using an RPI method. In particular, a first memory index value of each OFDM symbol, that is, 0, 7, 4, 1, 8 . . . may be set as an initial-offset value generated by the random generator of the aforementioned RPI. A number indicated in the interleaving memory index represents an order in which cells included in each symbol are interleaved and output.

FIG. 35($b$) illustrates results obtained by interleaving cells of an input OFDM symbol in a symbol unit using the generated interleaving memory index.

Figure 36:
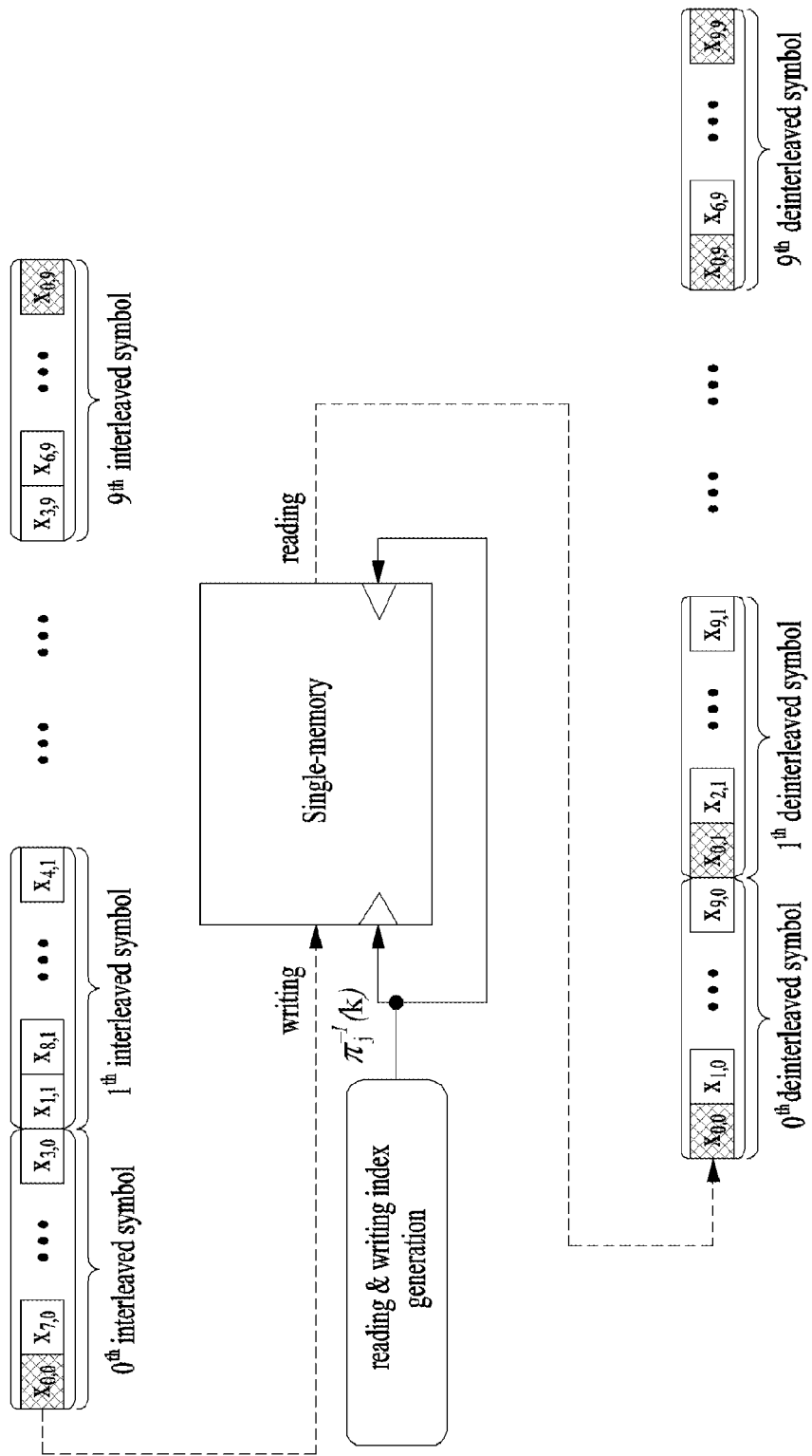
FIG. 36 is a conceptual diagram illustrating a frequency deinterleaving process according to an embodiment of the present invention.

FIG. 36 is a conceptual diagram illustrating a frequency deinterleaving process according to an embodiment of the present invention.

FIG. 36 illustrates a frequency deinterleaving process when a single memory is applied to a broadcast signal receiver and, that is, an embodiment in which the number of cells included in one symbol is 10.

The broadcast signal receiver (or a frame parsing module or a block interleaver) according to an embodiment of the present invention may generate a deinterleaving memory index via a process of sequentially writing symbols interleaved via the aforementioned frequency interleaving in an input order and output deinterleaved symbols via a reading process. In this case, the broadcast signal receiver according to an embodiment of the present invention may perform a process of performing writing on a deinterleaving memory index on which the reading is performed.

Figure 37:
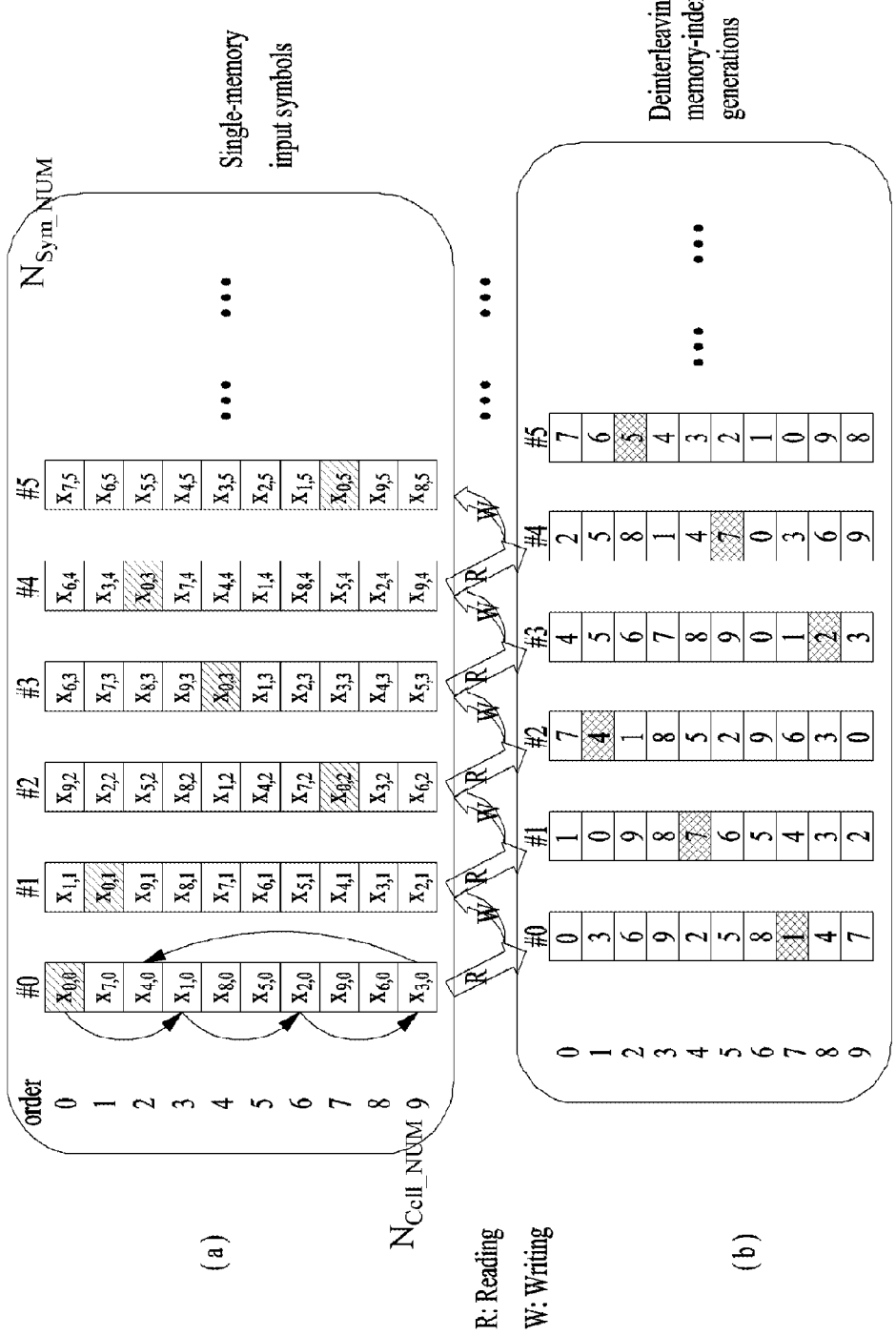
FIG. 37 illustrates a frequency deinterleaving process according to an embodiment of the present invention.

FIG. 37 illustrates a frequency deinterleaving process according to an embodiment of the present invention.

FIG. 37 illustrates a deinterleaving process when the number of all symbols is 10, the number of cells included in one symbol is 10, and p is 3.

FIG. 37($a$) illustrates symbols input to a single memory according to an embodiment of the present invention. That is, the single-memory input symbols shown in FIG. 37($a$) refer to values stored in the single-memory according to each input symbol. In this case, the values stored in the single-memory according to each input symbol refer to a result obtained by sequentially writing currently input symbol cells while reading a previous symbol.

FIG. 37($b$) illustrates a process of generation a deinterleaving memory index.

The deinterleaving memory index is an index used to deinterleave values stored in a single memory, and a number indicated in the deinterleaving memory index refers to an order in which cells included in each symbol are deinterleaved and output.

Hereinafter, the aforementioned frequency deinterleaving process will be described in terms of input symbols #0 and #1 among illustrated symbols.

The broadcast signal receiver according to an embodiment of the present invention sequentially writes input symbol #0 in a single memory. Then the broadcast signal receiver according to an embodiment of the present invention may sequentially generate the aforementioned deinterleaving memory index in an order of 0, 3, 6, 9. . . in order to deinterleave input symbol #0.

Then the broadcast signal receiver according to an embodiment of the present invention reads input symbol #0 written (or stored) in the single memory according to the generated deinterleaving memory index. The already written values do not have to be stored and thus a newly input symbol #1 may be sequentially re-written.

Then the process of reading input symbol #1 and the process of writing input symbol #1 are completed, the deinterleaving memory index may be generated in order to deinterleave the written input symbol #1. In this case, since the broadcast signal receiver according to an embodiment of the present invention uses a single memory, interleaving cannot be performed using an interleaving pattern applied to each symbol applied in the broadcast signal transmitter. Then deinterleaving processing can be performed on input symbols in the same way.

Figure 38:
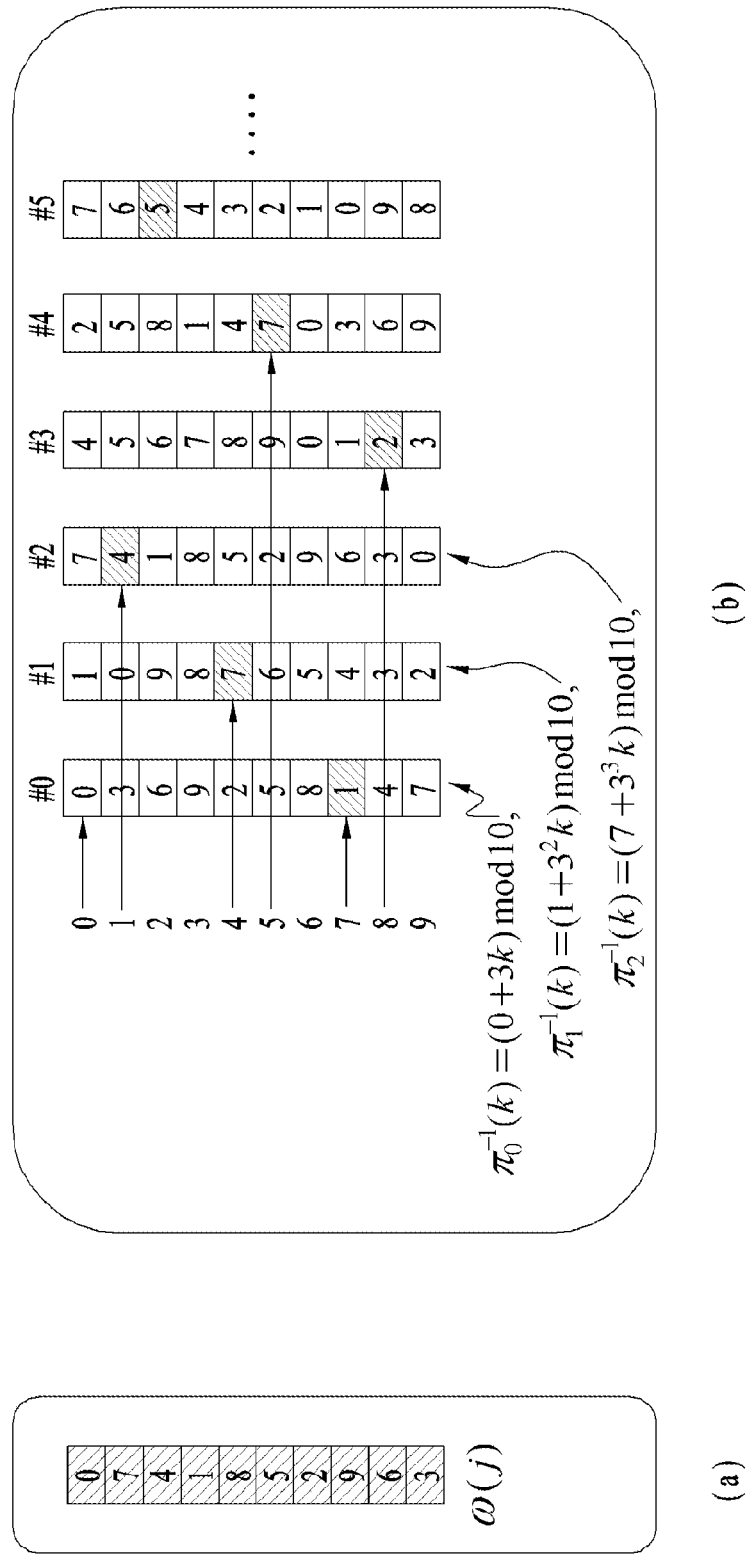
FIG. 38 illustrates a process of generating a deinterleaved memory index according to an embodiment of the present invention.

FIG. 38 illustrates a process of generating a deinterleaved memory index according to an embodiment of the present invention.

In particular, FIG. 38 illustrates a method of generating a new interleaving pattern when interleaving cannot be performed using an interleaving pattern applied to each symbol applied in the broadcast signal transmitter since the broadcast signal receiver according to an embodiment of the present invention users a single memory.

FIG. 38($a$) illustrates a deinterleaving memory index of a $j^{th}$ input symbol and FIG. 38($b$) illustrates the aforementioned process of generating a deinterleaving memory index together with equations.

As shown in FIG. 38($b$), according to an embodiment of the present invention, a variable of RPI of each input symbol is used.

According to an embodiment of the present invention, a process of generating a deinterleaving memory index of input symbol #0 uses p=3 and $I_0$=0 as a variable of RPI like in the broadcast signal transmitter. According to an embodiment of the present invention, in the case of input symbol #1, $p^2$=3×3 and $I_0$=1 may be used as a variable of RPI, and in the case of input symbol #2, $p^3$=3×3×3 and $I_0$=7 may be used as a variable of RPI. In addition, according to an embodiment of the present invention, in the case of input symbol #3, $p^4$=3×3×3×3 and $I_0$=4 may be used as a variable of RPI.

That is, the broadcast signal receiver according to an embodiment of the present invention may change a value p of RPI and an initial offset value for each symbol and may effectively perform deinterleaving in order to deinterleave symbols stored in each single memory. In addition, a value p used in each symbol may be easily induced using exponentiation of p and initial offset values may be sequentially acquired using a mother interleaving seed. Hereinafter, a method of calculating an initial offset value will be described.

According to an embodiment of the present invention, an initial offset value used in input symbol #0 is defined as $I_0$=0. An initial offset value used in input symbol #1 is $I_0$=1 that is the same as a seventh value generated in the deinterleaving memory index generation process of input symbol #0. That is, the broadcast signal receiver according to an embodiment of the present invention may store and use the value in the deinterleaving memory index generation process of input symbol #0.

An initial offset value used in input symbol #2 is $I_0=7$ that is the same as a fourth value generated in the deinterleaving memory index generation process of input symbol #1, and an initial offset value used in input symbol #3 is $I_0=4$ that is the same as a first value generated in the deinterleaving memory index generation process of input symbol #2.

Accordingly, the broadcast signal receiver according to an embodiment of the present invention may store and use a value corresponding to an initial offset value to be used in each symbol in a process of generating a deinterleaving memory index of a previous symbol.

As a result, the aforementioned method may be represented according to Equation 11 below.

$$\pi_j^{-1}(k)=(I_j^-+p^{j+1}k)\bmod N_{Cell\_NUM}, \text{ for } k=0,\ldots,$$
$$N_{Cell\_NUM}-1, j=0,\ldots,N_{Sym\_NUM}-1 \text{ where}$$
$$I_j^{-1}=\pi_{j-1}^{-1}(\omega(j)) \text{ with } I_0^{-1}=0 \quad \text{[Equation 11]}$$

$I_j^{-1}$: the initial-offset value at the $j^{th}$ RPI for deinterleaving
$\pi_j^{-1}(k)$: deinterleaving output memory-index for the $k^{th}$ input cell-index in the $j^{th}$ OFDM symbol
$\pi_j^{-1}(\omega(j))$: the $\omega(j)$th deinterleaving output memory-index in the $j^{th}$ OFDM symbol In this case, a position of a value corresponding to each initial offset value may be easily induced according to Equation 11 above.

According to an embodiment of the present invention, the broadcast signal transmitter according to an embodiment of the present invention may recognize two adjacent cells as one cell and perform frequency interleaving. This may be referred to as pair-wise interleaving. In this case, since two adjacent cells are considered as one cell and interleaving is performed, it is advantageous that a number of times of generating a memory index may be reduced in half.

Equation 12 below represents the pair-wise RPI.

$$\pi_j(k)=(\omega(j)+pk)\bmod(N_{Cell\_NUM}/2), \text{ for } k=0,\ldots,$$
$$N_{Cell\_NUM}/2-1, j=0,\ldots,N_{Sym\_NUM}-1 \quad \text{[Equation 12]}$$

Equation 13 below represents a pair-wise deinterleaving method.

$$\pi_j^{-1}(k)=(I_j^-+p^{j+1}k)\bmod(N_{Cell\_NUM}/2), \text{ for } k=0,\ldots,$$
$$N_{Cell\_NUM}/2-1, j=0,\ldots,N_{Sym\_NUM}-1 \text{ where}$$
$$I_j^{-1}=\pi_{j-1}^{-1}(\omega(j)) \text{ with } I_0^{-1}=0 \quad \text{[Equation 13]}$$

Figure 39:
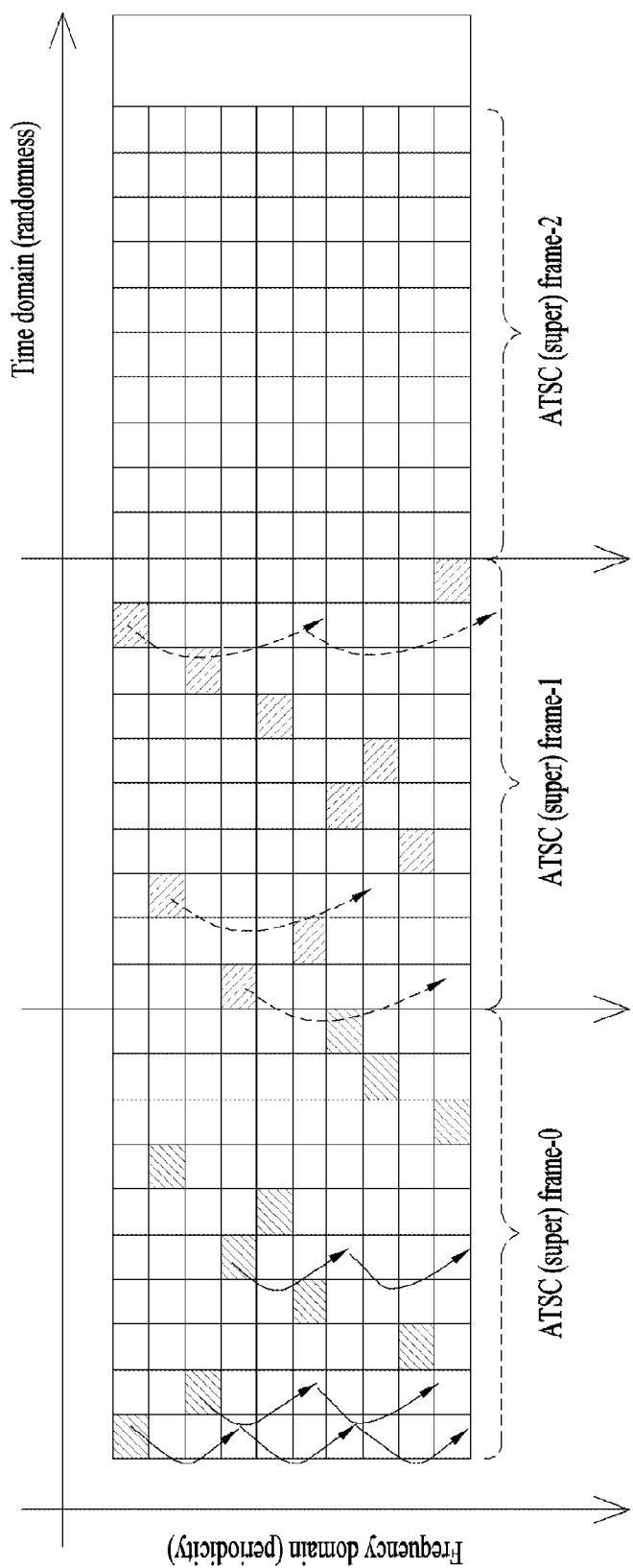
FIG. 39 illustrates a frequency interleaving process according to an embodiment of the present invention.

FIG. 39 illustrates a frequency interleaving process according to an embodiment of the present invention.

FIG. 39 illustrates an interleaving method for improving frequency diversity performance using different relative primes including a plurality of OFDM symbols by the aforementioned frequency interleaver.

That is, as shown in FIG. 39, a relative prime value is changed every frame/super frame so as to further improve a frequency diversity performance, especially avoiding a repeated interleaving pattern.

The apparatus for receiving broadcast signals according to an embodiment of the present invention can output process the decoded DP data. More specifically, the apparatus for receiving broadcast signals according to an embodiment of the present invention can decompress a header in the each of the data packets in the decoded DP data according to a header compression mode and recombine the data packets. Details are as described in FIGS. 16 to 32.

Figure 40:
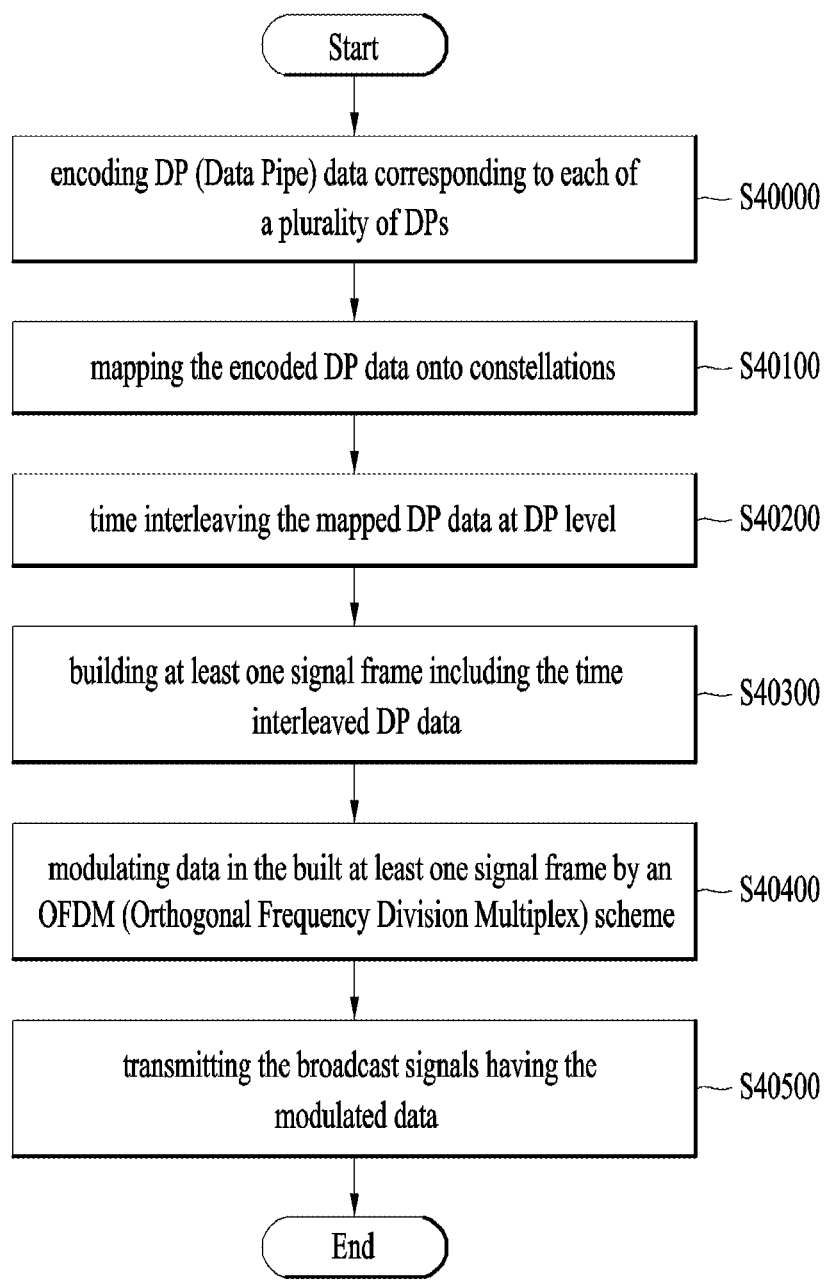
FIG. 40 is a flowchart illustrating a method for transmitting broadcast signals according to an embodiment of the present invention.

FIG. 40 is a flowchart illustrating a method for transmitting broadcast signals according to an embodiment of the present invention.

The apparatus for transmitting broadcast signals according to an embodiment of the present invention can encode data pipe (DP) data corresponding to each of a plurality of DPs (S40000). As described above, a data pipe is a logical channel in the physical layer that carries service data or related metadata, which may carry one or multiple service(s) or service component(s). Data carried on a data pipe can be referred to as DP data. The detailed process of step S40000 is as described in FIG. 1, 5 or 14.

The apparatus for transmitting broadcast signals according to an embodiment of the present invention can map the encoded DP data onto constellations (S40100). The detailed process of this step is as described in FIG. 1, 5 or 14.

Then, the apparatus for transmitting broadcast signals according to an embodiment of the present invention can time-interleave the mapped DP data at DP level (S40200). In addition, the time interleaver according to an embodiment of the present invention can perform time interleaving including a writing operation of sequentially arranging different input FEC blocks in a predetermined memory and a diagonal reading operation of interleaving the FEC blocks in a diagonal direction. In particular, the time interleaver according to an embodiment of the present invention can change the size of a diagonal slope of a reading direction and perform time interleaving while reading different FEC blocks in a diagonal direction. That is, the time interleaver according to an embodiment of the present invention can change a TI reading pattern. In this case, the diagonal reading pattern according to an embodiment of the present invention may be determined according to a maximum number of FEC blocks and be changed by a unit of super frame. As described above, the time interleaving is performed based on a skipping operation. The detailed process of this step is as described in FIGS. 16 to 26 and FIG. 31.

Subsequently, the apparatus for transmitting broadcast signals according to an embodiment of the present invention can build at least on signal frame including the time-interleaved DP data (S40300). The detailed process of this step is as described in FIG. 1 or 6.

The apparatus for transmitting broadcast signals according to an embodiment of the present invention can modulate data included in the built signal frame using an OFDM (Othogonal Frequency Division Multiplexing) scheme (S40400). The detailed process of this step is as described in FIG. 1 or 7.

The apparatus for transmitting broadcast signals according to an embodiment of the present invention can transmit broadcast signals including the signal frame (S40500). The detailed process of this step is as described in FIG. 1 or 7.

Figure 41:
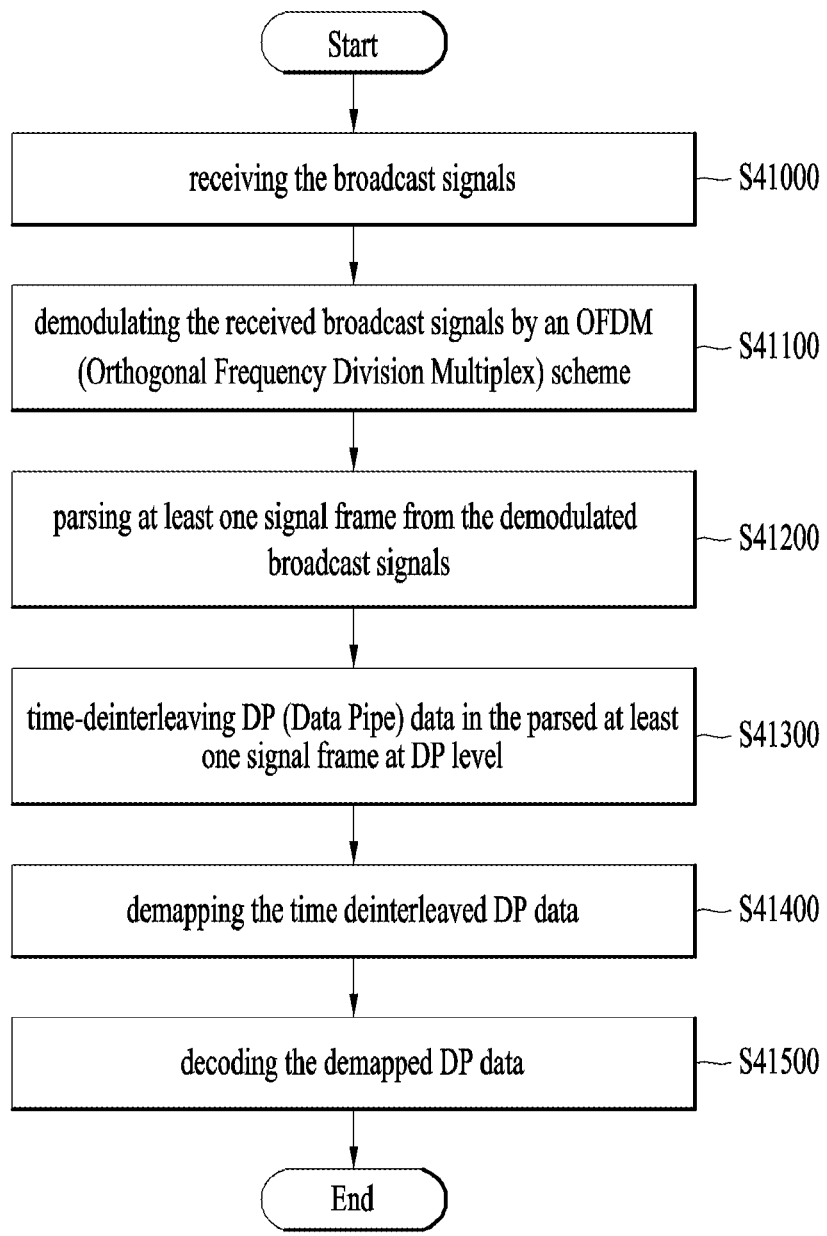
FIG. 41 is a flowchart illustrating a method for receiving broadcast signals according to an embodiment of the present invention.

FIG. 41 is a flowchart illustrating a method for receiving broadcast signals according to an embodiment of the present invention.

The flowchart shown in FIG. 41 corresponds to a reverse process of the broadcast signal transmission method according to an embodiment of the present invention, described with reference to FIG. 40.

The apparatus for receiving broadcast signals according to an embodiment of the present invention can receive broadcast signals (S41000).

The apparatus for receiving broadcast signals according to an embodiment of the present invention can demodulate received broadcast signals using an OFDM (Othogonal Frequency Division Multiplexing) scheme (S41100). Details are as described in FIG. 8 or 9.

The apparatus for receiving broadcast signals according to an embodiment of the present invention can parse at least one signal frame from the demodulated broadcast signals (S41200). Details are as described in FIG. 8 or 10. In this case, the at least one signal frame can include DP data for carrying services or service components.

Subsequently, the apparatus for receiving broadcast signals according to an embodiment of the present invention can time-deinterleave the DP data included in the parsed signal frame at DP level (S41300). As described above, the time deinterleaving is performed based on a skipping operation. A time deinterleaver (or time deinterleaver block) included in a broadcast signal receiver according to an embodiment of the present invention can perform inverse processing of the aforementioned diagonal-type TI. That is, the time deinterleaver according to an embodiment of the present invention can perform time deinterleaving by receiving FEC blocks on which diagonal-type TI has been performed, writing the FEC blocks diagonal-wise in a TI memory and then sequentially reading the FEC blocks. Details are as described in FIGS. 27 to 28 and FIG. 30.

Then, the apparatus for receiving broadcast signals according to an embodiment of the present invention can demap the time-deinterleaved DP data (S41400). Details are as described in FIG. 8 or 11 and FIG. 15.

The apparatus for receiving broadcast signals according to an embodiment of the present invention can decode the demapped DP data (S41500). Details are as described in FIG. 8 or 11 and FIG. 15.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A method for transmitting broadcast signals, the method comprising:
   encoding broadcast data corresponding to each of a plurality of physical paths;
   time interleaving the encoded broadcast data per each physical path, wherein the time interleaving includes:
   performing a column-wise writing operation on each of a plurality of time interleaving (TI) blocks including one or more forward error correction (FEC) blocks of the encoded broadcast data, wherein at least one TI block further includes at least one virtual FEC block; and
   performing a diagonal-wise reading on the written plurality of TI blocks, wherein cells corresponding to the at least one virtual FEC block are skipped during the diagonal-wise reading operation;
   building at least one signal frame including the time interleaved broadcast data;
   modulating data in the built at least one signal frame by an Orthogonal Frequency Division Multiplex (OFDM) scheme; and
   transmitting the broadcast signals having the modulated data.

2. The method of claim 1, wherein the method further includes:
   frequency interleaving data in the built at least one signal frame.

3. The method of claim 1, wherein the at least one TI block includes the at least one virtual FEC block, when a number of columns of a TI block is smaller than a maximum number of columns for the time interleaving.

4. The method of claim 1, wherein a number of virtual FEC blocks in a TI block is based on a maximum number of columns for the time interleaving.

5. An apparatus for transmitting broadcast signals, the apparatus comprising:
   an encoder to encode broadcast data corresponding to each of a plurality of physical paths;
   a time interleaver to time interleave the encoded broadcast data per each physical path, wherein the time interleaver further performs a column-wise writing operation on each of a plurality of time interleaving (TI) blocks including one or more forward error correction (FEC) blocks of the encoded broadcast data, wherein at least one TI block further includes at least one virtual FEC block, and a diagonal-wise reading operation on the written plurality of TI blocks, wherein cells corresponding to the at least one virtual FEC block are skipped during the diagonal-wise reading operation;
   a frame builder to build at least one signal frame including the time interleaved broadcast data;
   a modulator to modulate data in the built at least one signal frame by an Orthogonal Frequency Division Multiplex (OFDM) scheme; and
   a transmitter to transmit the broadcast signals having the modulated data.

6. The apparatus of claim 5, wherein the apparatus further includes:
   a frequency interleaver to frequency interleave data in the built at least one signal frame.

7. The apparatus of claim 5, wherein the at least one TI block includes the at least one virtual FEC block, when a number of columns of a TI block is smaller than a maximum number of columns for the time interleaving.

8. The apparatus of claim 5, wherein a number of virtual FEC blocks in a TI block is based on a maximum number of columns for the time interleaving.

9. A method for receiving broadcast signals, the method comprising:
   receiving the broadcast signals;
   demodulating the received broadcast signals by an Orthogonal Frequency Division Multiplex (OFDM) scheme;
   parsing at least one signal frame from the demodulated broadcast signals;
   time-deinterleaving broadcast data in the parsed at least one signal frame per each physical path, wherein the time de-interleaving is an inverse process of a time interleaving, wherein the time interleaving further includes:
   performing a column-wise writing operation on each of a plurality of time interleaving (TI) blocks including one or more forward error correction (FEC) blocks of broadcast data, wherein at least one TI block includes at least one virtual FEC block and
   performing a diagonal-wise reading operation on the written plurality of TI blocks, wherein cells corresponding to the at least one virtual FEC block are skipped during the diagonal-wise reading operation;
   demapping the time deinterleaved broadcast data; and
   decoding the demapped broadcast data.

10. The method of claim 9, wherein the method further includes: frequency-deinterleaving the demodulated broadcast signals.

11. The method of claim 9, wherein the at least one TI block includes the at least one virtual FEC block, when a number of columns of a TI block is smaller than a maximum number of columns for the time interleaving.

12. The method of claim 9, wherein a number of virtual FEC blocks in a TI block is based on a maximum number of columns for the time interleaving.

13. An apparatus for receiving broadcast signals, the apparatus comprising:
a receiver to receive the broadcast signals;
a demodulator to demodulate the received broadcast signals by an Orthogonal Frequency Division Multiplex (OFDM) scheme;
a frame parser to parse at least one signal frame from the demodulated broadcast signals;
a time deinterleaver to perform time-deinterleaving broadcast data in the parsed at least one signal frame per each physical path, wherein the time de-interleaving is an inverse process of a time interleaving, wherein the time interleaving further includes:
performing a column-wise writing operation on each of a plurality of time interleaving (TI) blocks including one or more forward error correction (FEC) blocks of the broadcast data, wherein at least one TI block further includes at least one virtual FEC block and performing a diagonal-wise reading operation on the written plurality of TI blocks, wherein cells corresponding to the at least one virtual FEC block are skipped during the diagonal-wise reading operation;
a demapper to demap the time deinterleaved broadcast data; and
a decoder to decode the demapped broadcast data.

14. The apparatus of claim 13, wherein the apparatus further includes: a frequency-deinterleaver for frequency-deinterleaving the demodulated broadcast signals.

15. The apparatus of claim 13, wherein the at least one TI block includes the at least one virtual FEC block, when a number of columns of a TI block is smaller than a maximum number of columns for the time interleaving.

16. The apparatus of claim 13, wherein a number of virtual FEC blocks in a TI block is based on a maximum number of columns for the time interleaving.

* * * * *